(12) United States Patent
Hwang et al.

(10) Patent No.: US 12,048,188 B2
(45) Date of Patent: Jul. 23, 2024

(54) LIGHT EMITTING DISPLAY APPARATUS AND MULTI-SCREEN DISPLAY APPARATUS INCLUDING THE SAME

(71) Applicant: LG Display Co., Ltd., Seoul (KR)

(72) Inventors: Insu Hwang, Paju-si (KR); Jeongha Shin, Paju-si (KR); Jaehyuk Lee, Paju-si (KR); HyeongWook Jang, Paju-si (KR); SinWoo Lee, Paju-si (KR); Juyeon Won, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 382 days.

(21) Appl. No.: 17/527,744

(22) Filed: Nov. 16, 2021

(65) Prior Publication Data

US 2022/0158130 A1    May 19, 2022

(30) Foreign Application Priority Data

Nov. 17, 2020    (KR) .......................... 10-2020-0153376

(51) Int. Cl.
  *H10K 50/844* (2023.01)
  *H10K 59/18* (2023.01)
  *H10K 71/00* (2023.01)

(52) U.S. Cl.
  CPC .......... *H10K 50/844* (2023.02); *H10K 59/18* (2023.02); *H10K 71/00* (2023.02)

(58) Field of Classification Search
  None
  See application file for complete search history.

(56) References Cited

U.S. PATENT DOCUMENTS

| | | |
|---|---|---|
| 9,991,464 B2 | 6/2018 | Lee et al. |
| 2021/0257577 A1* | 8/2021 | Bang .................... H10K 59/122 |
| 2022/0020957 A1* | 1/2022 | Choi .................. H10K 59/8731 |

FOREIGN PATENT DOCUMENTS

| | | |
|---|---|---|
| KR | 10-2016-0026363 A | 3/2016 |
| KR | 10-2017-0135587 A | 12/2017 |
| KR | 10-2018-0003965 A | 1/2018 |
| KR | 10-2020-0062635 A | 6/2020 |

OTHER PUBLICATIONS

Office Action issued in corresponding Korean Patent Application No. 10-2020-0153376, dated Apr. 30, 2024.

* cited by examiner

*Primary Examiner* — Michelle Mandala
*Assistant Examiner* — Jordan M Klein
(74) *Attorney, Agent, or Firm* — Morgan, Lewis & Bockius LLP

(57) ABSTRACT

A light emitting display apparatus includes a substrate, a passivation layer disposed over the substrate, a light emitting device layer including a light emitting layer disposed over the passivation layer, a non-emission pattern portion including a light emitting material pattern disposed over the passivation layer at a periphery portion of the substrate and electrically isolated from the light emitting layer, and an encapsulation layer disposed over the light emitting device layer and the non-emission pattern portion. The encapsulation layer may wholly surround the non-emission pattern portion and seals an interface between the non-emission pattern portion and the passivation layer.

20 Claims, 15 Drawing Sheets

LIGHT EMITTING DISPLAY APPARATUS AND MULTI-SCREEN DISPLAY APPARATUS INCLUDING THE SAME

CROSS-REFERENCE TO RELATED APPLICATIONS

This application claims the benefit of the Korean Patent Application No. 10-2020-0153376 filed on Nov. 17, 2020, which is hereby incorporated by reference as if fully set forth herein.

BACKGROUND

Technical Field

The present disclosure relates to a light emitting display apparatus and a multi-screen display apparatus including the same.

Discussion of the Related Art

Light emitting display apparatuses which are self-emitting light emitting display apparatuses, do not need a separate light source unlike liquid crystal display (LCD) apparatuses, and thus, they may be manufactured to be lightweight and thin. Also, light emitting display apparatuses are driven with a low voltage and thus is reduced in power consumption. Further, light emitting display apparatuses are good in color implementation, response time, viewing angle, and contrast ratio, and thus, are attracting much attention as the next-generation light emitting display apparatuses.

Light emitting display apparatuses display an image based on the light emission of a light emitting device layer including a light emitting device interposed between two electrodes. In this case, light emitted by the light emitting device is discharged to the outside through an electrode and a substrate.

Light emitting display apparatuses include a display panel implemented to display an image. The display panel may include a display portion, including a plurality of pixels for displaying an image, and a bezel area surrounding the display portion.

A light emitting display apparatus of the related art needs a bezel or a mechanism for covering a bezel area disposed at a border (or a periphery portion) of a display panel. Further, the light emitting display apparatus of the related art has a large bezel width (or a large width of the bezel) due to the presence of the bezel. Also, when the bezel width of the light emitting display apparatus is reduced below a certain limit, a light emitting device may be degraded by penetration of external, foreign materials such as water or moisture, and due to this, the reliability of the display panel may be reduced.

Recently, multi-screen light emitting display apparatuses have been commercialized where a large screen is implemented by arranging the light emitting display apparatuses as a lattice type.

However, in a multi-screen light emitting display apparatus of the related art, a boundary portion such as a seam is formed between adjacent light emitting display apparatuses due to a bezel area or a bezel of each of a plurality of light emitting display apparatuses. The boundary portion may cause a sense of discontinuity (or non-continuously) of an image when one image is being displayed on a total screen of the multi-screen light emitting display apparatus, and due to this, the immersion of a viewer watching the image may be reduced.

SUMMARY

Accordingly, embodiments of the present disclosure are directed to a light emitting display apparatus and a multi-screen display apparatus including the same that substantially obviate one or more problems due to limitations and disadvantages of the related art.

An aspect of the present disclosure is directed to providing a light emitting display apparatus, which has a thin bezel width and prevents the reliability of a light emitting device from being reduced by penetration of water, and a multi-screen display apparatus including the light emitting display apparatus.

The objects of the present disclosure are not limited to the aforesaid, but other objects and aspects not described herein will be understood by those skilled in the art from descriptions herein.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a light emitting display apparatus comprises a substrate, a passivation layer disposed over the substrate, a light emitting device layer including a light emitting layer disposed over the passivation layer, a non-emission pattern portion including a light emitting material pattern disposed over the passivation layer at a periphery portion of the substrate and electrically isolated from the light emitting layer, and an encapsulation layer disposed over the light emitting device layer and the non-emission pattern portion, wherein the encapsulation layer wholly surrounds the non-emission pattern portion and seals an interface between the non-emission pattern portion and the passivation layer.

In another aspect, a light emitting display apparatus comprises a substrate, a passivation layer disposed over the substrate, a light emitting device layer including a light emitting layer disposed over the passivation layer, a first non-emission pattern portion including a first light emitting material pattern disposed over the passivation layer at a periphery portion of the substrate and electrically isolated from the light emitting layer, a second non-emission pattern portion including a second light emitting material pattern disposed between the light emitting layer and the first non-emission pattern portion and electrically isolated from each of the light emitting layer and the first non-emission pattern portion, and an encapsulation layer disposed over the first non-emission pattern portion and the second non-emission pattern portion, wherein the encapsulation layer wholly surrounds each of the first non-emission pattern portion and the second non-emission pattern portion and directly contacts a surface of the passivation layer between the first non-emission pattern portion and the second non-emission pattern portion.

In another aspect, a multi-screen display apparatus comprises a plurality of display devices disposed in at least one direction of a first direction and a second direction crossing the first direction, wherein each of the plurality of display devices comprises the light emitting display apparatus, and wherein the light emitting display apparatus comprises a substrate, a passivation layer disposed over the substrate, a light emitting device layer including a light emitting layer disposed over the passivation layer, a non-emission pattern portion including a light emitting material pattern disposed over the passivation layer at a periphery portion of the substrate and electrically isolated from the light emitting layer, and an encapsulation layer disposed over the light emitting device layer and the non-emission pattern portion, wherein the encapsulation layer wholly surrounds the non-emission pattern portion and seals an interface between the non-emission pattern portion and the passivation layer.

In another aspect, a multi-screen display apparatus comprises a plurality of display devices disposed in at least one direction of a first direction and a second direction crossing the first direction, wherein each of the plurality of display devices comprises the light emitting display apparatus, and wherein the light emitting display apparatus comprises a substrate, a passivation layer disposed over the substrate, a light emitting device layer including a light emitting layer disposed over the passivation layer, a first non-emission pattern portion including a first light emitting material pattern disposed over the passivation layer at a periphery portion of the substrate and electrically isolated from the light emitting layer, a second non-emission pattern portion including a second light emitting material pattern disposed between the light emitting layer and the first non-emission pattern portion and electrically isolated from each of the light emitting layer and the first non-emission pattern portion, and an encapsulation layer disposed over the first non-emission pattern portion and the second non-emission pattern portion, wherein the encapsulation layer wholly surrounds each of the first non-emission pattern portion and the second non-emission pattern portion and directly contacts a surface of the passivation layer between the first non-emission pattern portion and the second non-emission pattern portion.

Details of other exemplary embodiments will be included in the detailed description of the disclosure and the accompanying drawings.

According to some embodiments of the present disclosure, a light emitting display apparatus, which has a thin bezel width and prevents the reliability of a light emitting device from being reduced by penetration of water, and a multi-screen display apparatus including the light emitting display apparatus may be provided.

According to some embodiments of the present disclosure, a light emitting display apparatus, which has an air-bezel or no bezel and prevents the reliability of a light emitting device from being reduced by penetration of water, and a multi-screen display apparatus including the light emitting display apparatus may be provided.

According to some embodiments of the present disclosure, a display apparatus including no bezel and a multi-screen display apparatus including the display apparatus may be provided.

According to some embodiments of the present disclosure, a multi-screen light emitting display apparatus for displaying an image without a sense of discontinuity may be provided.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles of the disclosure.

DETAILED DESCRIPTION

Figure 1:
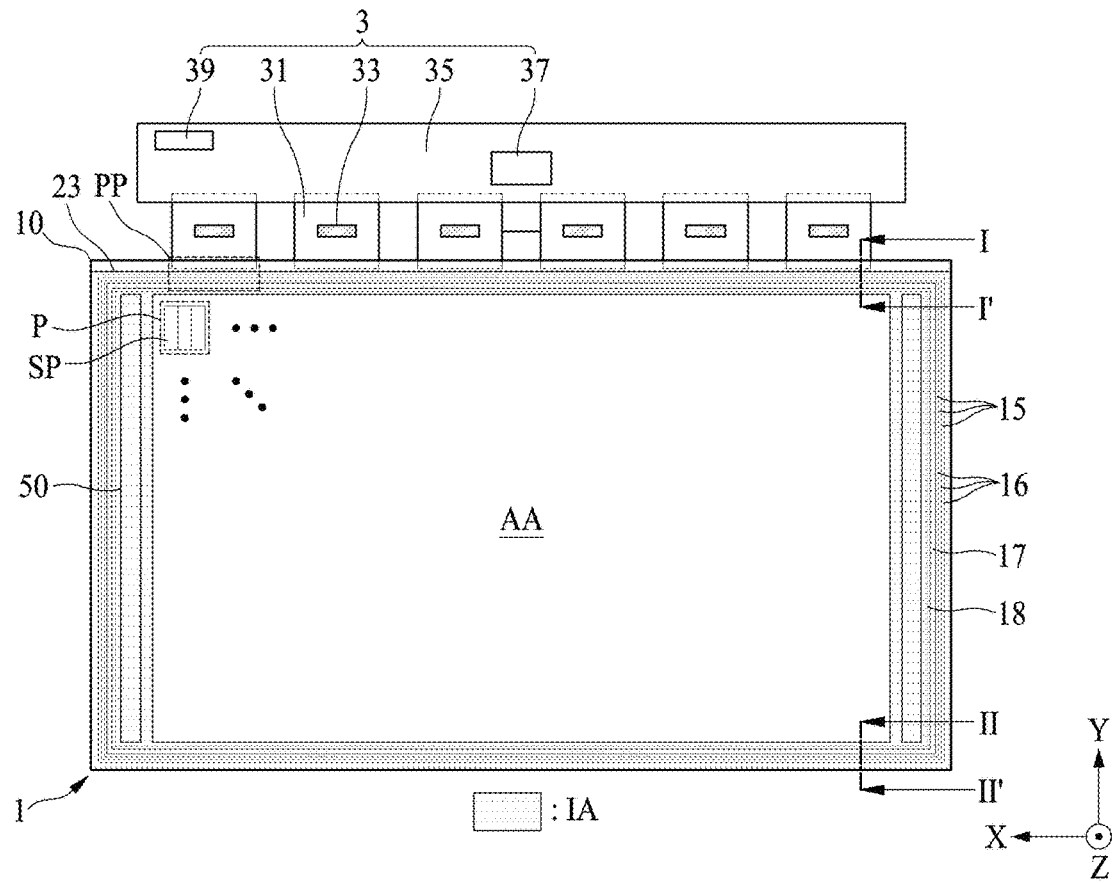
FIG. 1 is a diagram illustrating a light emitting display apparatus according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "coupled to" another element or layer, it may be directly on or directly coupled to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

The term "surround" as used herein includes at least partially surrounding as well as entirely surrounding one or more of the associated elements. Similarly, the term "cover" as used herein includes at least partially covering as well as entirely covering one or more of the associated elements. For example, if an encapsulation layer surrounds a dam pattern, this may be construed as the encapsulation layer at least partially surrounding the dam pattern. However, in some embodiments, the encapsulation layer may entirely surround the dam pattern. The meaning in which the term "surround" is used herein may be further specified based on the associated drawings and embodiments. In the present disclosure, the terms "surround," "at least partially surround," "completely surround" or the like is used. In accordance with the definition of "surround" as set forth above, when only the term "surround" is used in an embodiment, it may mean either at least partially surrounding or entirely surrounding one or more of the associated elements. The same applies for the term "cover."

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together in co-dependent relationship.

Hereinafter, embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

Figure 2:
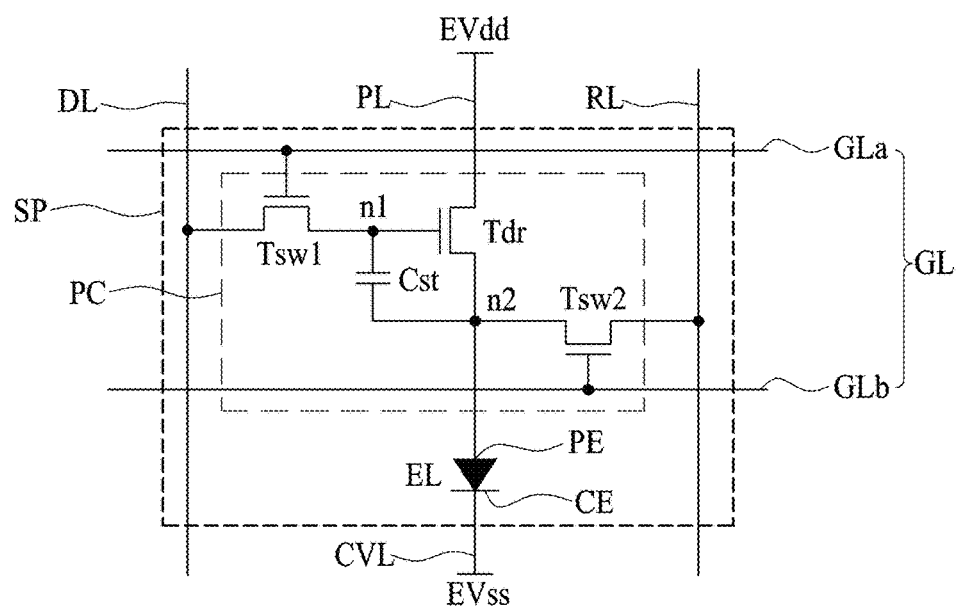
FIG. 2 is an equivalent circuit diagram illustrating one subpixel illustrated in FIG. 1.

FIG. 1 is a diagram illustrating a light emitting display apparatus according to an embodiment of the present disclosure, and FIG. 2 is an equivalent circuit diagram illustrating one subpixel illustrated in FIG. 1.

Referring to FIGS. 1 and 2, the light emitting display apparatus according to an embodiment of the present disclosure may include a light emitting display panel 1 and a panel driving circuit part 3.

The light emitting display panel 1 according to an embodiment of the present disclosure may include a substrate 10, a display portion AA, a non-display portion IA, a plurality of pixels P, an isolation portion 15, and a non-emission pattern portion 16.

The substrate 10 may be a glass substrate, or may be a thin glass substrate or a plastic substrate, which is bendable or flexible.

The display portion AA may be an area which displays an image, and thus, may be referred to as a first area, a display area, an active area, or an active portion. For example, the display portion AA may be disposed at a portion, other than a periphery portion, of the substrate 10.

The non-display portion IA may be an area which does not display an image, and thus, may be referred to as a second area, a non-display area, an inactive area, or an inactive portion. For example, the non-display portion IA may be disposed at the periphery portion of the substrate 10 to surround the display portion AA.

Each of the plurality of pixels P may be individually disposed in a corresponding pixel area of a plurality of pixel areas defined in the display portion AA. The plurality of pixel areas may be defined by a plurality of pixel driving lines disposed in the display portion AA.

Each of the plurality of pixels P may be disposed in a corresponding pixel area of the substrate 10 and may display an image corresponding to a data signal based on a scan signal and the data signal supplied through pixel driving lines adjacent thereto.

Each of the plurality of pixels P may include a plurality of subpixels SP adjacent to one another. The subpixel SP may be defined as a minimum unit area which emits real light. For example, at least three subpixels adjacent to one another may configure one pixel P or a unit pixel P for displaying a color image.

The pixel P according to an embodiment of the present disclosure may include first to third subpixels SP which are arranged to be adjacent to one another in a first direction X. In this case, the first subpixel may be a red subpixel, the second subpixel may be a green subpixel, and the third subpixel may be a blue subpixel. However, the present disclosure is not limited thereto. According to an embodiment of the present disclosure, a light emitting device layer disposed in each of the first to third subpixels SP may emit common light having the same color. For example, the common light may be white light, but embodiments of the present disclosure are not limited thereto and may be blue light. Each of the first to third subpixels SP may further include a wavelength conversion member which converts white light (or blue light) into different color light. For example, the wavelength conversion member may include at least one of a color filter layer and a quantum dot layer.

According to another embodiment of the present disclosure, the pixel P may include first to fourth subpixels SP which are arranged to be adjacent to one another in at least one direction of the first direction X and a second direction Y. In this case, the first subpixel may be a red subpixel, the second subpixel may be a white subpixel, the third subpixel may be a blue subpixel, and the fourth subpixel may be a green subpixel. However, the present disclosure is not limited thereto. According to an embodiment of the present disclosure, a light emitting device layer disposed in each of the first to fourth subpixels SP may emit common light having the same color. For example, the common light may be white light, but embodiments of the present disclosure are not limited thereto and may be blue light. Each of the first, third, and fourth subpixels SP may further include a wavelength conversion member which converts white light (or blue light) into different color light. For example, the wavelength conversion member may include at least one of a color filter layer and a quantum dot layer. For example, the second subpixel may include a step height compensation layer instead of the wavelength conversion member.

The subpixel SP may be connected to pixel driving lines adjacent thereto and may display an image corresponding to a data signal based on a scan signal and the data signal supplied through the pixel driving lines.

The subpixel SP according to an embodiment of the present disclosure may be connected to a gate line GL, a data line DL, a pixel driving power line PL, and a reference voltage line RL. For example, in response to the scan signal supplied through the gate line GL, the subpixel SP may emit light with a data current which flows from the pixel driving power line PL to a common electrode CE based on a difference voltage between a data voltage supplied through the data line DL and a reference voltage supplied through the reference voltage line RL, thereby displaying an image.

The gate line GL may be disposed in the display portion AA of the substrate 10. For example, the gate line GL may extend long in the first direction X. The gate line GL according to an embodiment of the present disclosure may include first and second gate lines GLa and GLb which are arranged in parallel in the first direction X.

The data line DL may be disposed in the display portion AA of the substrate 10 to intersect with the gate line GL. For example, the data line DL may extend long in the second direction Y crossing the first direction X.

The pixel driving power line PL may be disposed in the display portion AA of the substrate 10 in parallel with the data line DL.

The reference voltage line RL may be disposed in the display portion AA of the substrate 10 in parallel with the data line DL. For example, one reference voltage line RL may be provided for each pixel P disposed in the first direction X, and in this case, one reference voltage line RL may be connected to a plurality of subpixels SP configuring a pixel P in common. Optionally, the reference voltage line RL may be omitted based on a driving (or operation) scheme of the pixel P.

The common electrode CE may be disposed in the display portion AA of the substrate 10 and may be electrically connected to the subpixel SP of each of the plurality of pixels P. For example, the common electrode CE may be connected to each of the plurality of subpixels SP in common.

The common electrode CE may be electrically connected to a plurality of pixel common voltage lines CVL disposed in the display portion AA of the substrate 10 in parallel with the data line DL. For example, each of the plurality of pixel common voltage lines CVL may be electrically connected to the common electrode CE in the display portion AA. For example, each of the plurality of pixel common voltage lines CVL may be electrically connected to the common electrode CE, between at least two adjacent pixels P disposed in the display portion AA or in a boundary region between at least two adjacent pixels P. For example, one pixel common voltage line CVL may be electrically connected to the common electrode CE through at least two line (or electrode) contact portions.

The subpixel SP according to an embodiment of the present disclosure may include a light emitting device layer and a pixel circuit PC.

The light emitting device layer may include a pixel electrode (or an anode electrode) PE electrically coupled to the pixel circuit PC, a common electrode (or a cathode electrode) CE electrically coupled to the pixel common voltage line CVL, and a light emitting layer EL between the pixel electrode PE and the common electrode CE. For example, a pixel electrode PE disposed at each of the plurality of subpixels SP, a light emitting layer EL disposed over the pixel electrode PE of each of the plurality of subpixels SP and a portion of non-display portion IA, and a common electrode CE disposed over the light emitting layer EL may be referred to as a light emitting device layer (or a light emitting device), but embodiments of the present disclosure are not limited thereto.

The light emitting layer EL according to an embodiment may include at least one organic light emitting layer. The light emitting layer EL may further include a hole functional layer providing holes to the organic light emitting layer, and an electron functional layer providing electrons to the organic light emitting layer. The light emitting layer EL may emit light having luminance corresponding to a data current by emitting light based on the data current supplied from the pixel circuit PC.

The pixel circuit PC may provide the light emitting device layer with the data current which corresponds to the difference voltage between the data voltage supplied through the adjacent data line DL and the reference voltage supplied through the adjacent reference voltage line RL, in response to the scan signal supplied through the adjacent gate line GL.

The pixel circuit PC according to an embodiment may include a first switching thin film transistor Tsw1, a second switching thin film transistor Tsw2, a driving thin film transistor Tdr, and a storage capacitor Cst. In the following description, a thin film transistor may be referred to as a TFT.

At least one of the first switching TFT Tsw1, the second switching TFT Tsw2, and the driving TFT Tdr may be an amorphous-silicon (a-Si) TFT, a polysilicon (poly-Si) TFT, an oxide TFT, or an organic TFT. For example, in the pixel circuit PC, some of the first switching TFT Tsw1, the second switching TFT Tsw2, and the driving TFT Tdr may be a TFT including a semiconductor layer (or an active layer) including low temperature poly-Si (LTPS) having a good response characteristic, and the other TFT of the first switching TFT Tsw1, the second switching TFT Tsw2, and the driving TFT Tdr may be a TFT including a semiconductor layer (or an active layer) including oxide having a good off-current characteristic.

The first switching TFT Tsw1 may include a gate electrode coupled to a first gate line GLa of the gate line GL, a first source/drain electrode coupled to the adjacent data line DL, and a second source/drain electrode coupled to a gate node n1 of the driving TFT Tdr. The first switching TFT Tsw1 may transfer the data voltage, supplied through the adjacent data line DL, to the gate node n1 of the driving TFT Tdr based on a first scan signal supplied to the first gate line GLa.

The second switching TFT Tsw2 may include a gate electrode coupled to a second gate line GLb of the gate line GL, a first source/drain electrode coupled to a source node n2 of the driving TFT Tdr, and a second source/drain electrode coupled to the adjacent reference voltage line RL. The second switching TFT Tsw2 may transfer the reference voltage, supplied through the adjacent reference voltage line RL, to the source node n2 of the driving TFT Tdr based on a second scan signal supplied to the second gate line GLb.

The storage capacitor Cst may be formed between the gate node n1 and the source node n2 of the driving TFT Tdr. The storage capacitor Cst according to an embodiment may include a first capacitor electrode coupled to the gate node n1 of the driving TFT Tdr, a second capacitor electrode coupled to the source node n2 of the driving TFT Tdr, and a dielectric layer formed in an overlap region between the first capacitor electrode and the second capacitor electrode. The storage capacitor Cst may be charged with a difference voltage between the gate node n1 and the source node n2 of the driving TFT Tdr, and then, may turn on or off the driving TFT Tdr based on a charged voltage thereof.

The driving TFT Tdr may include a gate electrode (or a gate node n1) coupled to the second source/drain electrode of the first switching TFT Tsw1 and the first capacitor electrode of the storage capacitor Cst in common, a first source/drain electrode (or a source node n2) coupled to the first source/drain electrode of the second switching TFT Tsw2, the second capacitor electrode of the storage capacitor Cst, and a pixel electrode PE of the light emitting device layer in common, and a second source/drain electrode (or a drain node) coupled to a pixel driving power line PL. The driving TFT Tdr may be turned on based on a voltage of the storage capacitor Cst and may control the amount of current flowing to the light emitting device layer through the pixel driving power line PL to which a pixel driving voltage EVdd is supplied.

The pixel circuit PC may be covered by a passivation layer disposed over the substrate 10. The light emitting device layer may be disposed over a planarization layer covering the passivation layer.

The isolation portion 15 may be implemented at a periphery portion of the substrate 10. For example, the isolation portion 15 may be disposed over the passivation layer of the periphery portion of the substrate 10 to surround an outermost pixel P disposed in the display portion AA. The isolation portion 15 may be disposed over the passivation layer along the non-display portion IA of the substrate 10 to have a closed loop line shape (or a closed loop shape) which surrounds the display portion AA. The isolation device portion 15 may isolate (or separate) the light emitting device layer at least once, at an outer portion of the display portion AA or the non-display portion IA to block a lateral water transmission path, and thus, may prevent or minimize a reduction in reliability of the light emitting device layer caused by the lateral penetration of water. For example, the isolation portion 15 may prevent the lateral penetration of water through the light emitting device layer disposed over the non-display portion IA of the substrate 10 together with the light emitting device layer over the display portion AA of the substrate 10.

The isolation portion 15 according to an embodiment of the present disclosure may be implemented to isolate (or separate) the light emitting layer EL of the light emitting device layer. Moreover, the isolation portion 15 may be implemented to additionally isolate (or separate) the common electrode CE of the light emitting device layer. An end of the common electrode CE isolated by the isolation portion 15 may be implemented to cover an end of the light emitting device ED isolated by the isolation portion 15. For example, the isolation portion 15 may be referred to as a device isolation portion, a water penetration blocking portion, a water penetration prevention portion, a disconnection pattern portion, an isolation pattern portion, a groove pattern portion, a trench pattern portion, or the like. For example, the isolation portion 15 may be defined as an isolation region, an isolation line, a separation region, a separation line, a disconnection region, or a disconnection line of the light emitting device layer.

The isolation portion 15 according to an embodiment of the present disclosure may include at least two or more isolation patterns. The at least two or more isolation patterns may be implemented to have a closed loop line shape which surrounds the display portion AA. The isolation portion 15 may include an eaves structure for isolating (or separating) the light emitting device layer. For example, the isolation portion 15 may include an eaves structure which is implemented by an insulation layer and a metal pattern layer (or a metal layer) over the insulation layer. For example, the eaves structure may be referred to as the term such as an undercut structure or a cliff structure.

According to an embodiment of the present disclosure, the light emitting layer EL of the light emitting device layer formed (or deposited) over the isolation portion 15 may be automatically isolated (or separated) during a deposition process by the eaves structure of the isolation portion 15, without a separate isolation (or isolation) process. Also, the common electrode CE disposed over the light emitting device layer may be automatically isolated (or separated) during a deposition process by the eaves structure of the isolation portion 15.

An eaves structure of the isolation portion 15 may be removed from the substrate 10 in performing a process of forming an encapsulation layer over the substrate 10, and the isolation portion 15 may be implemented as a removal region (or a removal portion) of the eaves structure.

The non-emission pattern portion 16 may be disposed on a passivation layer in the non-display portion IA or a periphery portion of the substrate 10. The non-emission pattern portion 16 may be disposed on the passivation layer in the non-display portion IA or the periphery portion of the substrate 10 and may be electrically or spatially isolated (or disconnected) from the light emitting layer EL of the light emitting device layer disposed in the display portion AA. For example, the non-emission pattern portion 16 may include a light emitting material of the light emitting layer EL, which is formed together with the light emitting layer EL disposed in the non-display portion IA or the periphery portion of the substrate 10 and is electrically or spatially isolated (or disconnected) from the light emitting layer EL of the display portion AA by the isolation portion 15. For example, the non-emission pattern portion 16 may be referred to as the term such as a first non-emission pattern portion, a non-emission material pattern portion, a light emitting layer pattern portion, a light emitting layer isolation pattern portion, a light emitting material pattern portion, an island light emitting material portion, or an island light emitting material pattern portion, or the like.

The non-emission pattern portion 16 according to an embodiment of the present disclosure may have a closed loop line shape in the non-display portion IA or the periphery portion of the substrate 10. For example, the non-emission pattern portion 16 may include at least two non-emission patterns which are isolated from one another by at least two isolation patterns and have a closed loop line shape.

The light emitting display panel 1 according to an embodiment of the present disclosure may further include a dam pattern portion 17.

The dam pattern portion 17 may be implemented at the periphery portion of the substrate 10. For example, the dam pattern portion 17 may be disposed at the periphery portion of the substrate 10 to surround an outermost pixel P disposed in the display portion AA. The dam pattern portion 17 according to an embodiment of the present disclosure may be disposed along the non-display portion IA of the substrate 10 to have a closed loop line shape which surrounds the display portion AA. The dam pattern portion 17 may be disposed between the isolation portion 15 and the display portion AA. The dam pattern portion 17 may be implemented over the substrate 10 so as to be surrounded by the isolation portion 15. For example, the isolation portion 15 may be disposed between the dam pattern portion 17 and an end (or an outer surface) of the substrate 10. The dam pattern portion 17 may prevent the spread or overflow of the encapsulation layer disposed on the substrate 10 to cover the display portion AA. For example, the encapsulation layer may include an organic material which is disposed on the light emitting device layer and is disposed in an inner region surrounded by the dam pattern portion 17. Therefore, the dam pattern portion 17 may prevent the organic material of the encapsulation layer from spreading or overflowing to the periphery portion of the substrate 10.

The dam pattern portion 17 may include a light emitting material of the light emitting layer EL, which is formed together with the light emitting layer EL disposed in the non-display portion IA or the periphery portion of the substrate 10 and is electrically or spatially isolated (or disconnected) from the light emitting layer EL of the display portion AA. Therefore, the dam pattern portion 17 may be referred to as a second non-emission pattern portion, or the like. For example, the light emitting material of the light emitting layer EL disposed over the dam pattern portion 17 may be referred to as the term such as a second non-emission pattern portion, a second non-emission material pattern portion, a second light emitting layer pattern portion, a second light emitting layer isolation pattern portion, a second light emitting material pattern portion, a second island light emitting material portion, or a second island light emitting material pattern portion, or the like. In this case, the non-emission pattern portion 16 may be referred to as the term such as a first non-emission pattern portion, a first non-emission material pattern portion, a first light emitting layer pattern portion, a first light emitting layer isolation pattern portion, a first light emitting material pattern portion, a first island light emitting material portion, or a first island light emitting material pattern portion, or the like.

The encapsulation layer may be disposed on the light emitting device layer. The encapsulation layer disposed in the non-display portion IA or the periphery portion of the substrate 10 may surround all of the non-emission pattern portion 16 and may seal (or encapsulate) an interface (or a contact surface) between the non-emission pattern portion 16 and the passivation layer. For example, the encapsulation layer may surround all of the non-emission pattern portion 16 and may directly contact a surface of the passivation layer near the non-emission pattern portion 16, and thus, may seal (or encapsulate) an interface (or a contact surface) between an end of the non-emission pattern portion 16 and the passivation layer. For example, the encapsulation layer may directly contact the surface of the passivation layer at the isolation portion 15.

The encapsulation layer according to an embodiment of the present disclosure may include a plurality of inorganic encapsulation layers (or a plurality of inorganic material layers) which wholly surround or envelop the non-emission pattern portion 16 and seal (or encapsulate) the interface between the end of the non-emission pattern portion 16 and the passivation layer. The inorganic encapsulation layer of the encapsulation layer may directly contact the surface of the passivation layer at the isolation portion 15, and thus, may seal (or encapsulate) the interface (or the contact surface) between the end of the non-emission pattern portion 16 and the passivation layer to block a lateral water penetration path, thereby preventing or minimizing a reduction in reliability of the light emitting device layer caused by the lateral penetration of water.

The light emitting display panel 1 according to an embodiment of the present disclosure may further include a trench pattern portion 18.

The trench pattern portion 18 may be disposed over the substrate 10 in an inner region of the dam pattern portion 17. For example, the trench pattern portion 18 may be disposed in the inner region of the dam pattern portion 17 to surround the outermost pixel P disposed in the display portion AA. For example, the trench pattern portion 18 may be disposed between the dam pattern portion 17 and the display portion AA to have a closed loop line shape which surrounds the display portion AA. The trench pattern portion 18 may isolate (or disconnect) the light emitting layer EL of the light emitting device layer to block a lateral water penetration path in the inner region of the dam pattern portion 17, and thus, may prevent or minimize a reduction in reliability of the light emitting layer EL of the light emitting device layer caused by the lateral penetration of water. The trench pattern portion 18 may additionally isolate (or disconnect) the common electrode CE of the light emitting device layer, and in this case, an end of the common electrode CE isolated by the trench pattern portion 18 may be implemented to cover the end of the light emitting layer EL isolated by the trench pattern portion 18.

According to an embodiment of the present disclosure, the trench pattern portion 18 may be referred to as the term such as a second water blocking portion, a second water prevention portion, a second disconnection pattern portion, a second isolation portion, a second isolation pattern portion, an inner isolation portion, a cliff pattern portion, or an eaves structure material. In this case, the isolation portion 15 may be referred to as the term such as a first water blocking portion, a first water prevention portion, a first disconnection pattern portion, a first device isolation portion, a first isolation portion, a first isolation pattern portion, or an outer isolation portion, or the like.

According to an embodiment of the present disclosure, the trench pattern portion 18 may be defined as a second isolation region, a second isolation line, a second separation region, a second separation line, a second disconnection region, a second disconnection line, an inner isolation region, an inner isolation line, an inner separation region, an inner separation line, an inner disconnection region, or an inner disconnection line, or the like of the light emitting device layer. In this case, the isolation portion 15 may be defined as a first isolation region, a first isolation line, a first separation region, a first separation line, a first disconnection region, a first disconnection line, an outer isolation region, an outer isolation line, an outer separation region, an outer separation line, an outer disconnection region, or an outer disconnection line, or the like of the light emitting device layer.

The isolation portion 15 may include the trench pattern portion 18 in performing a process of manufacturing the light emitting display panel. The trench pattern portion 18 disposed in the isolation portion 15 may be removed in performing a process of forming the encapsulation layer. For example, the trench structure having the same structure as the trench pattern portion 18 may be disposed in the isolation portion 15 in a process before a process of forming the encapsulation layer, and then, may be removed in performing the process of forming the encapsulation layer. Accordingly, the isolation portion 15 may be implemented as a removal region (or a removal portion) of the trench pattern portion 18.

The trench pattern portion 18 may include a light emitting material of the light emitting layer EL, which is formed together with the light emitting layer EL disposed in the display portion AA and is electrically or spatially isolated (or disconnected) from the light emitting layer EL of the display portion AA. For example, the light emitting material of the light emitting layer EL disposed on the trench pattern portion 18 may be referred to as the term such as a third non-emission pattern portion, a third non-emission material pattern portion, a third light emitting layer pattern portion, a third light emitting layer isolation pattern portion, a third light emitting material pattern portion, a third island light emitting material portion, or a third island light emitting material pattern portion, or the like.

The light emitting display panel 1 according to an embodiment of the present disclosure may further include a plurality of pad portions PP.

Each of the plurality of pad portions PP may be disposed at one periphery portion of the substrate 10 in the first direction X. For example, the one periphery portion of the substrate 10 may be referred to as a first periphery portion, an upper periphery portion, a first non-display portion, or an upper non-display portion, or the like.

Each of the plurality of pad portions PP according to an embodiment of the present disclosure may include a data pad electrically connected to the data line DL through a link line, a reference voltage pad electrically connected to the reference voltage line through a link line, and a pixel common voltage pad electrically connected to a pixel common voltage line through a link line.

Each of a first pad portion and a last pad portion of the plurality of pad portions PP may include a plurality of gate pads.

The light emitting display panel 1 according to an embodiment may further include a gate driving circuit 50.

The gate driving circuit 50 may supply scan signals to the gate lines based on a gate control signal (or a scan control signal) provided through the link lines and the plurality of gate pads of the pad portion PP from the driving circuit part 3. The gate driving circuit 50 according to an embodiment may be directly implemented in the non-display portion IA at the substrate 10 together with a TFT manufacturing process implementing the pixel circuit PC of the subpixel SP. For example, the gate driving circuit 50 may be disposed in at least one of both non-display portions IA of the substrate 10 facing each other. According to another embodiment, the gate driving circuit 50 may be implemented as an IC, and in this case, the gate driving circuit 50 may be mounted at the substrate 10 and may be coupled to the gate lines, or may be mounted at the flexible circuit film and may be coupled to the gate lines through a gate pad of the substrate 10.

The driving circuit part 3 may be coupled to the pad portion PP disposed at one periphery portion of the substrate 10 and may allow each subpixel SP to display an image corresponding to video data supplied from a display driving system.

The driving circuit part 3 according to an embodiment may include a plurality of flexible circuit films 31, a plurality of data driving integrated circuits (ICs) 33, a printed circuit board (PCB) 35, a timing controller 37, and a power circuit part 39.

Each of the plurality of flexible circuit films 31 may be attached at the PCB 35 and the pad portion PP provided at the substrate 10. For example, one periphery portion (or an output bonding portion) of each of the plurality of flexible circuit films 31 may be attached at the pad portion PP provided at the substrate 10 by a film attachment process using an anisotropic conductive film. The other periphery portion (or an input bonding portion) of each of the plurality of flexible circuit films 31 may be attached at the PCB 35 by a film attachment process using an anisotropic conductive film.

Each of the plurality of data driving ICs 33 may be individually mounted at a corresponding flexible circuit film 31 of the plurality of flexible circuit films 31. Each of the plurality of data driving ICs 33 may receive pixel data and a data control signal provided from the timing controller 37, convert the pixel data into a pixel-based analog data voltage according to a data control signal, and supply the analog data voltage to a corresponding data line DL. For example, each of the plurality of data driving ICs 33 may generate a plurality of grayscale voltages by using a plurality of reference gamma voltages provided from the PCB 35 and may select, as a pixel-based data voltage, a grayscale voltage corresponding to pixel data from of the plurality of grayscale voltages to output the selected data voltage.

Additionally, each of the plurality of data driving ICs 33 may generate a pixel common voltage (or a cathode voltage) and a pixel driving voltage (or an anode voltage) needed for driving (or light emitting) of the subpixels SP by using the plurality of reference gamma voltages. As an example, each of the plurality of data driving ICs 33 may select, as a pixel driving voltage and a pixel common voltage, a predetermined reference gamma voltage or a predetermined grayscale voltage from of the plurality of reference gamma voltages or the plurality of grayscale voltages to output the pixel driving voltage and the pixel common voltage.

Moreover, each of the plurality of data driving ICs 33 may additionally generate and output a reference voltage based on a driving (or operating) method of each pixel P. For example, each of the plurality of data driving ICs 33 may select, as a reference voltage, a predetermined reference gamma voltage or a predetermined grayscale voltage from of the plurality of reference gamma voltages or the plurality of grayscale voltages to output the reference voltage. For example, the pixel driving voltage, the pixel common voltage, and the reference voltage may have different voltage levels.

Each of the plurality of data driving ICs 33 may sequentially sense a characteristic value of a driving TFT included in each of the subpixel SP through the plurality of reference voltage lines RL disposed at the substrate 10, generate sensing raw data corresponding to a sensing value, and provide the sensing raw data to the timing controller 37.

The PCB 35 may be coupled to the other periphery portion of each of the plurality of flexible circuit films 31. The PCB 35 may transfer a signal and a voltage between elements of the driving circuit part 3.

The timing controller 37 may be mounted at the PCB 35 and may receive image data and a timing synchronization signal provided from the display driving system through a user connector disposed on the PCB 35. Alternatively, the timing controller 37 may not be mounted at the PCB 35 and may be implemented in the display driving system or may be mounted at a separate control board coupled between the PCB 35 and the display driving system.

The timing controller 37 may align the video data based on the timing synchronization signal so as to match a pixel arrangement structure disposed in the display portion AA and may provide the generated pixel data to each of the plurality of data driving ICs 33.

According to an embodiment, when the pixel P includes a white subpixel SP, the timing controller 37 may extract white pixel data based on the digital video data (i.e., red input data, green input data, and blue input data which are to be respectively supplied to corresponding pixels P), reflect offset data based on the extracted white pixel data in each of the red input data, the green input data, and the blue input data to calculate red pixel data, green pixel data, and blue pixel data, and align the calculated red pixel data, green pixel data, and blue pixel data and the white pixel data according to the pixel arrangement structure to supply aligned pixel data to each of the data driving ICs 33. For example, the timing controller 37 may convert red, green, and blue input data into four-color (for example, red, green, blue, and white) data based on a data conversion method disclosed in Korean Patent Publication No. 10-2013-0060476 or 10-2013-0030598, where all of these references are incorporated by reference into the present application.

The timing controller 37 may generate each of the data control signal and the gate control signal based on the timing synchronization signal, control a driving timing of each of the data driving ICs 33 based on the data control signal, and control a driving timing of the gate driving circuit 50 based on the gate control signal. For example, the timing synchronization signal may include a vertical synchronization signal, a horizontal synchronization signal, a data enable signal, and a main clock (or a dot clock).

The data control signal according to an embodiment may include a source start pulse, a source shift clock, and a source output signal. The gate control signal according to an embodiment may include a start signal (or a gate start pulse) and a plurality of shift clocks, or the like.

The timing controller 37 may drive each of the data driving ICs 33 and the gate driving circuit 50 based on an external sensing mode during a predetermined external sensing period, generate compensation data for compensating for a characteristic variation of the driving TFT of each subpixel SP based on the sensing raw data provided from the data driving ICs 33, and modulate pixel data based on the generated compensation data. For example, the timing controller 37 may drive each of the data driving ICs 33 and the gate driving circuit 50 based on the external sensing mode for each external sensing period corresponding to a blank period (or a vertical blank period) of the vertical synchronization signal. For example, the external sensing mode may be performed in a process of powering on the display apparatus, a process of powering off the display apparatus, a process of powering off the display apparatus after being driven for a long time, or a blank period of a frame which is set in real time or periodically.

The timing controller 37 according to an embodiment may store the sensing raw data of each subpixel, provided from the data driving ICs 33, in a storage circuit based on the external sensing mode. Also, in a display mode, the timing controller 37 may correct pixel data which is to be supplied to each subpixel, based on the sensing raw data stored in the storage circuit and may provide corrected pixel data to the data driving ICs 33. Here, sensing raw data of each subpixel may include sequential variation information about each of a driving TFT and a light emitting device, which are disposed in a corresponding subpixel. Therefore, in the external sensing mode, the timing controller 37 may sense a characteristic value (for example, a threshold voltage or mobility) of a driving TFT disposed in each subpixel SP and based thereon, may correct pixel data which is to be supplied to each subpixel SP, thereby minimizing or preventing the degradation in image quality caused by a characteristic value deviation of driving TFTs of a plurality of subpixels SP. The external sensing mode of a light emitting display apparatus may be technology known to those skilled in the art, and thus, their detailed descriptions are omitted or may be brief. For example, the light emitting display apparatus according to the present disclosure may sense a characteristic value of the driving TFT disposed in each subpixel SP based on a sensing mode disclosed in Korean Patent Publication No. 10-2016-0093179, 10-2017-0054654, or 10-2018-0002099, where all of these references are incorporated by reference into the present application.

The power circuit part 39 may be mounted at the PCB 35 and may generate various source voltages needed for displaying an image on the pixels P by using an input power supplied from the outside to provide the generated source voltage to a corresponding circuit. For example, the power circuit part 39 may generate and output a logic source voltage needed for driving of each of the timing controller 37 and the data driving ICs 33, the plurality of reference gamma voltages provided to the data driving ICs 33, and at least one gate driving voltages and at least one gate common voltages needed for driving of the gate driving circuit 50. The gate driving voltages and the gate common voltages may have different voltage levels.

Figure 3:
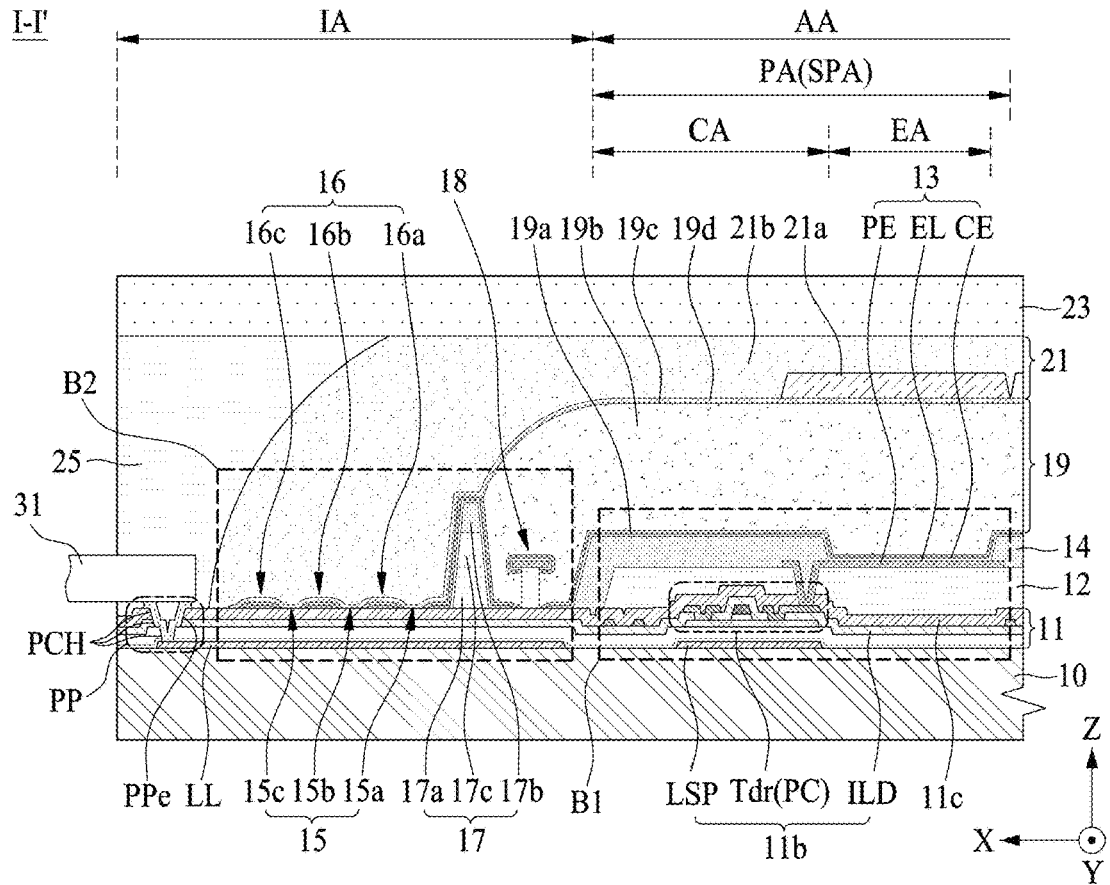
FIG. 3 is a cross-sectional view taken along line I-I' illustrated in FIG. 1.
Figure 4:
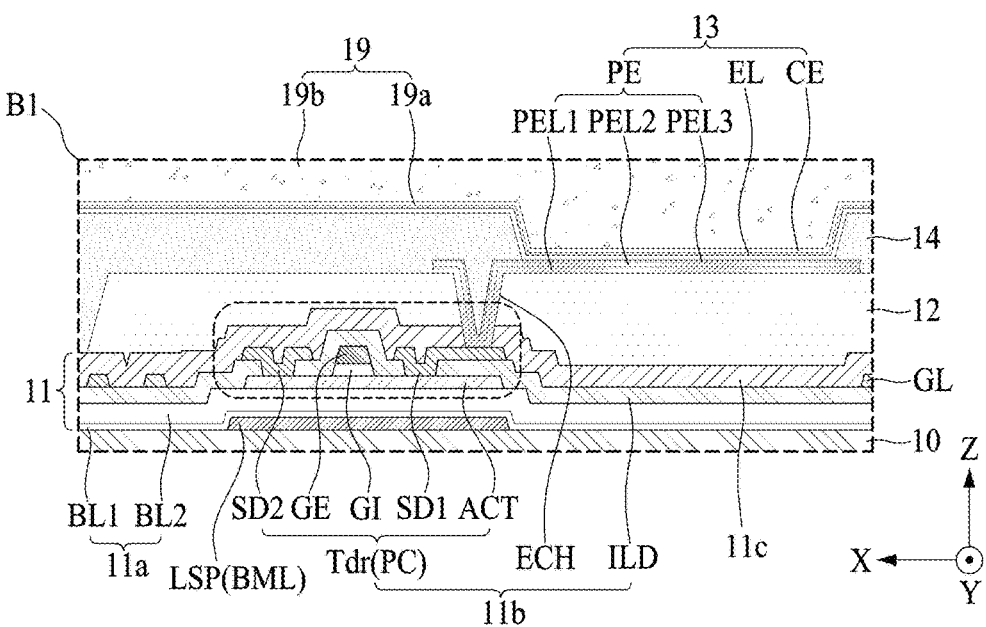
FIG. 4 is an enlarged view of a region 'B1' illustrated in FIG. 3.
Figure 5:
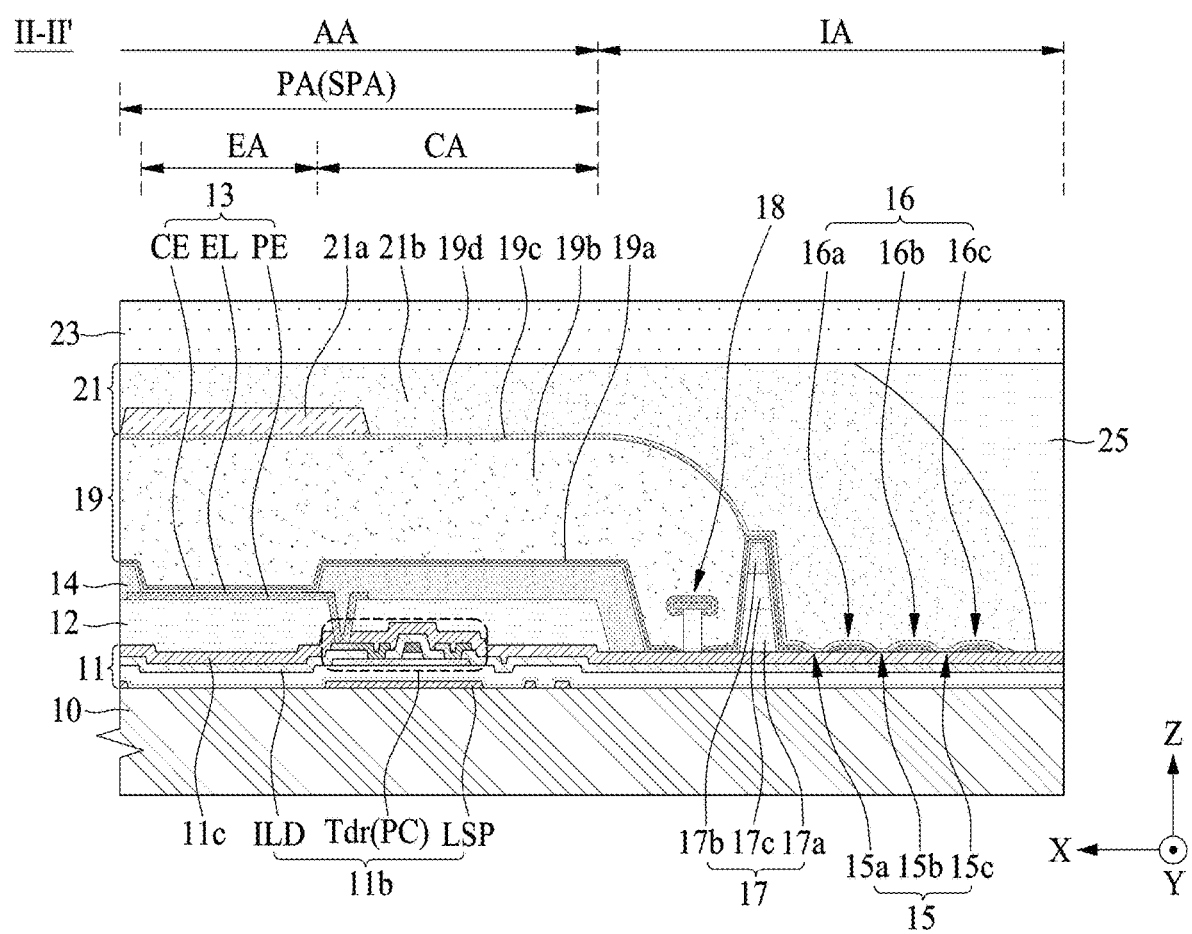
FIG. 5 is a cross-sectional view taken along line II-IP illustrated in FIG. 1.

FIG. 3 is a cross-sectional view taken along line I-I' illustrated in FIG. 1, FIG. 4 is an enlarged view of a region 'B1' illustrated in FIG. 3, and FIG. 5 is a cross-sectional view taken along line II-IP illustrated in FIG. 1.

Referring to FIGS. 1 to 5, a light emitting display apparatus according to an embodiment of the present disclosure may include a circuit layer 11, a planarization layer 12, a light emitting device layer 13, a bank 14, an isolation portion 15, a non-emission pattern portion 16, a dam pattern portion 17, and an encapsulation layer 19 which are disposed over the substrate 10.

The circuit layer 11 may be disposed on the substrate 10. The circuit layer 11 may be referred to as a pixel array portion, a pixel array layer, or a TFT array layer.

Referring to FIGS. 1 to 3, and 5, the circuit layer 11 according to an embodiment may include a buffer layer 11a, a circuit array layer 11b, a passivation layer 11c, and a plurality of pad portions PP.

The buffer layer 11a may prevent materials, such as hydrogen included in the substrate 10, from being diffused to the circuit array layer 11b in a high temperature process of a process of manufacturing a TFT. Also, the buffer layer 11a may prevent external water or moisture from penetrating into the light emitting device layer 13. The buffer layer 11a according to an embodiment may include silicon oxide (SiOx), silicon nitride (SiNx), silicon oxynitride (SiON), or a multilayer thereof, but embodiments of the present disclosure are not limited thereto, and may be configured as an inorganic material known to those skilled in the art. For example, the buffer layer 11a may include a first buffer layer BL1 which includes SiNx and is disposed on the substrate 10 and a second buffer layer BL2 which includes SiOx and is disposed on the first buffer layer BL1.

The circuit array layer 11b may include a pixel circuit PC which includes a driving TFT Tdr disposed in each of a plurality of pixel areas PA over the buffer layer 11a.

The driving TFT Tdr disposed in each pixel area PA may include an active layer ACT, a gate insulation layer GI, a gate electrode GE, an interlayer insulation layer ILD, a first source/drain electrode SD1, and a second source/drain electrode SD2.

The active layer ACT may be disposed on the buffer layer 11a in each pixel area PA. The active layer ACT may include a channel area, overlapping the gate electrode GE, and a first source/drain area and a second source/drain area parallel to each other between adjacent channel areas. The active layer ACT may have conductivity in a conductivity process, and thus, may be used as a bridge line of a jumping structure which directly connects lines in the display portion AA or electrically connects lines disposed on different layers.

The gate insulation layer GI may be disposed in the channel area of the active layer ACT. The gate insulation layer GI may insulate the active layer ACT from the gate electrode GE.

The gate electrode GE may be disposed over the gate insulation layer GI. The gate electrode GE may overlap the channel area of the active layer ACT with the gate insulation layer GI therebetween. The gate electrode GE according to an embodiment may have a single-layer structure or a multi-layer structure including at least one of molybdenum (Mo), titanium (Ti), a Mo—Ti alloy (MoTi), and copper (Cu).

The interlayer insulation layer ILD (or a first insulation layer) may be disposed at the substrate 10 to cover the gate electrode GE and the active layer ACT. The interlayer insulation layer ILD may electrically insulate (or isolate) the gate electrode GE and the source/drain electrodes SD1 and SD2.

The interlayer insulation layer ILD according to an embodiment may be disposed at only a portion, other than a periphery portion, of the substrate 10, but embodiments of the present disclosure are not limited thereto.

The first source/drain electrode SD1 may be disposed over the interlayer insulation layer ILD overlapping the first source/drain area of the active layer ACT and may be electrically coupled to the first source/drain area of the active layer ACT through a first source/drain contact hole disposed in the interlayer insulation layer ILD. For example, the first source/drain electrode SD1 may be a source electrode of the driving TFT Tdr, and the first source/drain area of the active layer ACT may be a source area. For example, the first source/drain electrode SD1 of the driving TFT Tdr may be electrically coupled to the pixel electrode PE.

The second source/drain electrode SD2 may be disposed on the interlayer insulation layer ILD overlapping the second source/drain area of the active layer ACT and may be electrically coupled to the second source/drain area of the active layer ACT through a second source/drain contact hole disposed in the interlayer insulation layer ILD. For example, the second source/drain electrode SD2 may be a drain electrode of the driving TFT Tdr, and the second source/drain area of the active layer ACT may be a drain area.

The passivation layer 11c may be disposed over the substrate 10 to cover the pixel circuit PC including the driving TFT Tdr. The passivation layer 11c disposed at the periphery portion of the substrate 10 may support the isolation portion 15, the non-emission pattern portion 16, and the dam pattern portion 17. For example, the passivation layer 11c disposed at the periphery portion of the substrate 10 may support the non-emission pattern portion 16 and the dam pattern portion 17. For example, the passivation layer 11c disposed at the periphery portion of the substrate 10 may be a supporting surface (or a contact surface) to directly support the non-emission pattern portion 16 and the dam pattern portion 17.

According to an embodiment, when the interlayer insulation layer ILD is not disposed at the periphery portion of the substrate 10, the passivation layer 11c disposed at the periphery portion of the substrate 10 may directly contact the buffer layer 11a. The passivation layer 11c according to an embodiment may include silicon oxide (SiOx), silicon nitride (SiNx), silicon oxynitride (SiON), or a multilayer thereof, but embodiments of the present disclosure are not limited thereto, and may be configured as an inorganic material known to those skilled in the art. For example, the passivation layer 11c may be referred to as a protection layer, a circuit protection layer, a circuit insulation layer, an insulation layer, a second insulation layer, a supporting layer, or the like.

Each of first and second switching TFT Tsw1 and Tsw2 configuring the pixel circuit PC may be formed together with the driving TFT Tdr, and thus, their detailed descriptions are omitted or may be brief.

The circuit layer 11 according to an embodiment may further include a lower metal layer BML which is disposed between the substrate 10 and the buffer layer 11a.

The lower metal layer BML may include a light blocking pattern LSP which is disposed under the active layer ACT of each of the TFTs Tdr, Tsw1, and Tsw2 configuring the pixel circuit PC.

The light blocking pattern LSP may be disposed in an island shape between the substrate 10 and the active layer ACT. The light blocking pattern LSP may block light which is incident on the active layer ACT through the substrate 10, thereby preventing or minimizing a threshold voltage variation of each TFT caused by external light. Alternatively, the light blocking pattern LSP may be electrically coupled to the first source/drain electrode SD1 of a corresponding TFT and thus may act as a lower gate electrode of the corresponding TFT, and in this case, a characteristic variation of each TFT caused by light and a threshold voltage variation of each TFT caused by a bias voltage may be minimized or prevented.

The lower metal layer BML may be used as a line disposed in parallel with each other of the gate line GL, the data line DL, the pixel driving power line PL, the pixel common voltage line, and the reference voltage line RL. Also, the lower metal layer BML may be used as a plurality of link lines LL electrically coupled to a plurality of pad electrodes PPe disposed in the pad portion PP. The lower metal layer BML according to an embodiment may be deposited over the substrate 10, and then, may be patterned as each of the data line DL, the pixel driving power line PL, the pixel common voltage line CVL, the reference voltage line RL, a light blocking pattern LSP, and the link line LL by using a patterning process. The lower metal layer BML according to another embodiment may be deposited over the substrate 10, and then, may be patterned as the gate line GL, a light blocking pattern LSP, and the link line LL by using a patterning process.

Each of the plurality of pad portions PP may be disposed at one periphery portion of the substrate 10 and may be electrically coupled to the link line LL. Each of the plurality of pad portions PP may include a plurality of pad electrodes PPe.

Each of the plurality of pad electrodes PPe may be electrically coupled to the link line LL through the pad contact hole PCH passing through the passivation layer 11c, the interlayer insulation layer ILD, and the buffer layer 11a, but embodiments of the present disclosure are not limited thereto. As an embodiment, when the link line LL is disposed over the buffer layer 11a, the pad electrodes PPe may be electrically coupled to the link line LL through the pad contact hole PCH passing through the passivation layer 11c and the interlayer insulation layer ILD. As another embodiment, when the link line LL is disposed over the interlayer insulation layer ILD, the pad electrodes PPe may be electrically coupled to the link line LL through the pad contact hole PCH passing through the passivation layer 11c.

The planarization layer 12 may be disposed over the substrate 10 and may provide a flat surface over the passivation layer 11c. The planarization layer 12 may cover the passivation layer 11c including the driving TFT Tdr (or the pixel circuit PC) disposed in each of the plurality of pixel areas PA. The planarization layer 12 according to an embodiment may include acrylic resin, epoxy resin, phenolic resin, polyamide-based resin, polyimide-based resin, or the like, but embodiments of the present disclosure are not limited thereto.

The planarization layer 12 according to an embodiment may be formed to cover the remaining circuit layer 11 except for the pad portions PP and the passivation layer 11c of the circuit layer 11 disposed at the periphery portion of the substrate 10. Therefore, the passivation layer 11c of the circuit layer 11 disposed at the periphery portion of the substrate 10 may be exposed without being covered by the planarization layer 12. For example, the planarization layer 12 may be disposed between the passivation layer 11c and the light emitting device layer 13, or disposed under the light emitting device layer 13.

The light emitting device layer 13 may be disposed over the planarization layer 12. The light emitting device layer 13 according to an embodiment may include a pixel electrode PE, a light emitting layer EL, and a common electrode CE.

The pixel electrode PE may be referred to as an anode electrode, a reflective electrode, a lower electrode, an anode, or a first electrode.

The pixel electrode PE may be disposed in a first region of the substrate 10. The pixel electrode PE may be disposed between the planarization layer 12 and the light emitting layer EL overlapping an emission area EA of each of the plurality of pixel areas PA defined in the first region of the substrate 10. The pixel electrode PE may be patterned in an island shape and disposed in each pixel area PA, and may be electrically coupled to the first source/drain electrode SD1 of the driving TFT Tdr of a corresponding pixel circuit PC. For example, one side of the pixel electrode PE may extend onto the first source/drain electrode SD1 of the driving TFT Tdr and may be electrically coupled to the first source/drain electrode SD1 of the driving TFT Tdr through an electrode contact hole ECH provided in the planarization layer 12.

The pixel electrode PE may include a metal material which is low in work function and is good in reflective efficiency, but embodiments of the present disclosure are not limited thereto.

The pixel electrode PE according to an embodiment of the present disclosure may have a two-layer structure including a first pixel electrode layer (or a first metal layer) PEL1 and a second pixel electrode layer (or a second metal layer) PEL2. The first pixel electrode layer PEL1 and the second pixel electrode layer PEL2 may be sequentially deposited over the planarization layer 12 and then simultaneously patterned, but embodiments of the present disclosure are not limited thereto.

The first pixel electrode layer PEL1 may be disposed over the planarization layer 12. The second pixel electrode layer PEL2 may be disposed (or stacked) on the first pixel electrode layer PEL1. The pixel electrode PE according to an embodiment may include a stacked structure of indium tin oxide (ITO) (or indium zinc oxide (IZO)) and a Mo—Ti alloy (MoTi). For example, the pixel electrode PE may be formed in a two-layer structure of ITO/MoTi or IZO/MoTi.

The first pixel electrode layer PEL1 according to an embodiment may act as the adhesive layer corresponding to the planarization layer 12 and may act as the secondary electrode of the light emitting device layer 13. The first pixel electrode layer PEL1 may include indium tin oxide (ITO) or indium zinc oxide (IZO), but embodiments of the present disclosure are not limited thereto.

The second pixel electrode layer PEL2 according to an embodiment may be disposed (or stacked) on the first pixel electrode layer PEL1. For example, the second pixel electrode layer PEL2 may act as a reflector and may perform a function of decreasing a resistance of the pixel electrode PE. The second pixel electrode layer PEL2 may include one or more material of aluminum (Al), silver (Ag), molybdenum (Mo), titanium (Ti), and a Mo—Ti alloy (MoTi), but embodiments of the present disclosure are not limited thereto.

The pixel electrode PE according to another embodiment of the present disclosure may have a three-layer structure including a first pixel electrode layer PEL1, a second pixel electrode layer PEL2 on the first pixel electrode layer PEL1, and a third pixel electrode layer (or a third metal layer) PEL3 on the second pixel electrode layer PEL2. The first pixel electrode layer PEL1, the second pixel electrode layer PEL2, and the third pixel electrode layer PEL3 may be sequentially deposited over the planarization layer 12 and then simultaneously patterned, but embodiments of the present disclosure are not limited thereto.

The third pixel electrode layer PEL3 may act as an electrode of the light emitting device layer 13 and may include ITO or IZO. For example, the pixel electrode PE may be formed in a three-layer structure of IZO/MoTi/ITO or ITO/MoTi/ITO.

The pixel electrode PE according to another embodiment may have a four-layer structure including a first pixel electrode layer PEL1, a second pixel electrode layer PEL2 on the first pixel electrode layer PEL1, a third pixel electrode layer (or a third metal layer) PEL3 on the second pixel electrode layer PEL2, and a fourth pixel electrode layer (or a fourth metal layer) on the third pixel electrode layer. The first to fourth pixel electrode layers may be sequentially deposited over the planarization layer 12 and then simultaneously patterned, but embodiments of the present disclosure are not limited thereto.

In the pixel electrode PE of the four-layer structure, the first pixel electrode layer may act as the adhesive layer corresponding to the planarization layer 12 and may act as the secondary electrode of the light emitting device layer 13, and moreover, may include one or more material of ITO, Mo, and Mo—Ti. The second pixel electrode layer may act a function of decreasing a resistance of the pixel electrode PE and may include Cu. The third pixel electrode layer may act as a reflector and may include one or more material of Al, Ag, Mo, Ti, and MoTi. The fourth pixel electrode layer may act as an electrode of the light emitting device layer 13 and may include ITO or IZO. For example, the pixel electrode PE according to another embodiment may be formed in a four-layer structure of ITO/Cu/MoTi/ITO.

The pixel electrode PE may be used as a metal layer which implements the plurality of pad electrodes disposed in each of the plurality of pad portions PP. For example, the plurality of pad electrodes may be formed of the same material together with the pixel electrode PE.

The light emitting layer EL may be disposed over the first region of the substrate 10 and disposed in at least portion of the second region of the substrate 10. The light emitting layer EL may be formed over the pixel electrode PE and may directly contact the pixel electrode PE. The pixel electrode PE may be disposed under (or below) the light emitting layer EL. For example, the pixel electrode PE may be disposed between the planarization layer 112 and the light emitting layer EL.

The light emitting layer EL according to an embodiment may be a common layer which is formed in common in each of a plurality of subpixels SP so as not to be distinguished by subpixel SP units. The light emitting layer EL may react on a current flowing between the pixel electrode PE and the common electrode CE to emit white light (or blue light). The light emitting layer EL according to an embodiment may include an organic light emitting layer, or may include a stacked or combination structure of an organic light emitting layer and a quantum dot light emitting layer.

The light emitting layer EL according to an embodiment may include two or more organic light emitting layers for emitting white light. For example, the light emitting layer EL may include a first organic light emitting layer and a second organic light emitting layer for emitting white light based on a combination of first light and second light. For example, the first organic light emitting layer may include at least one or more of a blue light emitting layer, a green light emitting layer, a red light emitting layer, a yellow light emitting layer, and a yellow-green light emitting layer. The second organic light emitting layer may include at least one or more of a blue light emitting layer, a green light emitting layer, a red light emitting layer, a yellow light emitting layer, and a yellow-green light emitting layer for emitting second light which is combined with first light from the first organic light emitting layer to generate white light.

The organic light emitting layer according to an embodiment of the present disclosure may further include at least one or more function layers for enhancing emission efficiency and/or lifetime. For example, the organic light emitting layer may be interposed between a hole functional layer and an electron functional layer.

The common electrode CE may be referred to as a cathode electrode, a transparent electrode, an upper electrode, a cathode, or a second electrode. The common electrode CE may be formed over the light emitting device layer 13 and may directly contact the light emitting layer EL or may electrically and directly contact the light emitting layer EL. The common electrode CE may include a transparent conductive material which transmits light emitted from the light emitting layer EL.

The common electrode CE according to an embodiment of the present disclosure may be formed in a single-layer structure or a multi-layer structure, which includes at least one material of graphene and a transparent conductive material which is relatively high in work function. For example, the common electrode CE may include metal oxide such as ITO or IZO, or may include a combination of oxide and metal such as ZnO:Al or SnO2:Sb.

Additionally, the light emitting device layer 13 may further include a capping layer disposed over the common electrode CE. The capping layer may improve the emission efficiency of light by adjusting a refractive index of light emitted from the light emitting device layer 13.

The bank 14 may be disposed over the planarization layer 12 to define the pixel areas PA over the substrate 10. The bank 14 may be disposed over the planarization layer 12 to cover a periphery portion of the pixel electrode PE. The bank 14 may define the emission area EA (or an opening portion) of each of the plurality of subpixels SP and may electrically isolate the pixel electrodes PE disposed in adjacent subpixels SP. The bank 14 may be formed to cover the electrode contact hole ECH disposed in each of the plurality of pixel areas PA. The bank 14 may be covered by the light emitting layer of the light emitting device layer 13. For example, the light emitting layer may be disposed over the bank 14 as well as over the pixel electrode PE of each of the plurality of subpixels SP.

The bank 14 according to an embodiment may be formed of a transparent material, for example, acrylic-based resin, epoxy-based resin, phenolic-based resin, polyamide-based resin, polyimide-based resin, or the like. For example, the bank 14 may be a transparent bank.

The bank 14 according to another embodiment may be an opaque material including a light absorbing material or a black pigment such as carbon black, for example, polyamide-based resin, acrylic-based resin, benzocyclobutene (BCB), or the like. For example, the bank 14 according to another embodiment may be a black bank.

The isolation portion 15 may be disposed in a second region, surrounding a first region, of the substrate 10. For example, the second region of the substrate 10 may be a periphery portion of the substrate 10 or a periphery portion of an outermost pixel. The first region of the substrate 10 may be the other portion except the second region.

The isolation portion 15 may be disposed in the second region of the substrate 10. For example, the isolation portion 15 may be disposed over the passivation layer 11*c* in the second region of the substrate 10. The isolation portion 15 may be disposed over the periphery portion of the substrate 10 or over the passivation layer 11*c* in the non-display portion IA to have a closed loop line shape surrounding the display portion AA one-dimensionally.

The isolation portion 15 according to an embodiment of the present disclosure may be implemented to isolate (or separate) the light emitting device layer 13 disposed in a second region of the substrate 10. The isolation portion 15 may be implemented to isolate (or separate) the light emitting device layer 13 disposed in the non-display portion IA or the periphery portion of the substrate 10. For example, the isolation portion 15 may be implemented to isolate (or separate) the light emitting device layer 13 at least once. The isolation portion 15 may be implemented to isolate (or separate) the light emitting device layer 13 at least once in the second region of the substrate 10, and thus, may prevent the penetration of water in a lateral direction of the substrate 10, thereby preventing a degradation in the light emitting layer EL disposed in the display portion AA caused by the lateral penetration of water. For example, the isolation portion 15 may be disposed between the substrate 10 and the display portion AA and may block or isolate a penetration path of water penetrating into the light emitting layer EL disposed in the display portion AA in the lateral direction of the substrate 10, thereby preventing a degradation in the light emitting layer EL caused by the lateral penetration of water.

The non-emission pattern portion 16 may be implemented in the second region of the substrate 10. The non-emission pattern portion 16 may be implemented on the passivation layer 11*c* in the second region of the substrate 10. The non-emission pattern portion 16 may be disposed on the passivation layer 11*c* in the non-display portion IA or the periphery portion of the substrate 10 to have a closed loop line shape which surrounds the display portion AA one-dimensionally. The non-emission pattern portion 16 may include a light emitting material of the light emitting layer EL, which is electrically or spatially isolated (or disconnected) from the light emitting layer EL of the light emitting device layer 13 in the display portion AA. For example, the light emitting material of the non-emission pattern portion 16 may be formed together with the light emitting layer EL of the light emitting device layer 13 disposed in the display portion AA and may be electrically or spatially isolated (or disconnected) from the light emitting layer EL in the display portion AA by the isolation portion 15.

The dam pattern portion 17 may be implemented in the second region of the substrate 10. The dam pattern portion 17 may be implemented on the passivation layer 11*c* in the second region of the substrate 10. The dam pattern portion 17 may be disposed on the passivation layer 11*c* in the inner region of the isolation portion 15 to have a closed loop line shape which surrounds the display portion AA one-dimensionally. The dam pattern portion 17 may be surrounded by the isolation portion 15. The dam pattern portion 17 may be disposed between the isolation portion 15 and the display portion AA. The dam pattern portion 17 may prevent the spread or overflow of the encapsulation layer 19 which is disposed at the substrate 10 to cover the display portion AA.

An uppermost surface of the dam pattern portion 17 according to an embodiment of the present disclosure may be disposed to be higher than an uppermost surface of the light emitting device layer 13. For example, a distance (or a height) between the substrate 10 and the uppermost surface of the dam pattern portion 17 may be greater than a distance (or a height) between the substrate 10 and the uppermost surface of the light emitting device layer 13. For example, the dam pattern portion 17 may include an at least two-layer structure.

The dam pattern portion 17 according to an embodiment of the present disclosure may include a first dam pattern 17*a* and a second dam pattern 17*b*.

The first dam pattern 17*a* and the second dam pattern 17*b* may be configured as the same or different materials to each other.

The first dam pattern 17*a* may be disposed on the passivation layer 11*c*. For example, the first dam pattern 17*a* may be disposed over the passivation layer 11*c* in the non-display portion IA to have a closed loop line shape surrounding the display portion AA one-dimensionally.

The first dam pattern 17*a* may include an organic material. The first dam pattern 17*a* according to an embodiment of the present disclosure may be formed of the same material together with the planarization layer 12, but embodiments of the present disclosure are not limited thereto. As an example, the first dam pattern 17*a* may have the same height (or thickness) as the planarization layer 12. As another example, a total height of the first dam pattern 17*a* may be two or more times a height (or a thickness) of the planarization layer 12, but embodiments of the present disclosure are not limited thereto and may be changed based on a thickness of the encapsulation layer 19. For example, the first dam pattern 17*a* may be referred to as the term such as a first dam, a first dam structure, a lower dam, a lower dam structure, a lower dam pattern, or the like.

The second dam pattern 17*b* may be disposed over the first dam pattern 17*a*. The second dam pattern 17*b* may be disposed over the first dam pattern 17*a* to have a closed loop line shape. The second dam pattern 17*b* may have a cross-sectional structure which differs from the first dam pattern 17*a*.

The second dam pattern 17*b* may include the same material as the first dam pattern 17*a*. As an example, the second dam pattern 17*b* may include the same material as the first dam pattern 17*a* or the same material as the planarization layer 12, but embodiments of the present disclosure are not limited thereto. As another example, the second dam pattern 17*b* may include the same material as the bank 14 and may be formed together with the bank 14, but embodiments of the present disclosure are not limited thereto. For example, the second dam pattern 17*b* may be referred to as the term such as a second dam, a second dam structure, an upper dam, an upper dam structure, an upper dam pattern, or the like.

A total height between the first dam pattern 17*a* and the second dam pattern 17*b* may be two or more times a height (or a thickness) of the planarization layer 12, but embodiments of the present disclosure are not limited thereto and may be changed based on a thickness of the encapsulation layer 19.

The dam pattern portion 17 according to an embodiment of the present disclosure may further include a third dam pattern 17*c*.

The third dam pattern 17c may be interposed between the first dam pattern 17a and the second dam pattern 17b. The third dam pattern 17c may be disposed over the second dam pattern 17b to have a closed loop line shape. In this case, the second dam pattern 17b may be disposed over the third dam pattern 17c to have a closed loop line shape. The first to third dam patterns 17a, 17b, and 17c may have a different cross-sectional structure. For example, the third dam pattern 17c may be referred to as the term such as a third dam, a third dam structure, a middle dam, a middle dam structure, a middle dam pattern, or the like.

The first to third dam patterns 17a, 17b, and 17c may include different materials, but embodiments of the present disclosure are not limited thereto, and at least one of the first to third dam patterns 17a, 17b, and 17c may include different material. For example, each of the first to third dam patterns 17a, 17b, and 17c may include at least one of a color filter material, a material of the planarization layer 12, and a material of the bank 14.

According to an embodiment of the present disclosure, the first dam pattern 17a may include at least one material of a color filter material, a material of the planarization layer 12, and a material of the bank 14. The second dam pattern 17b may include any one material which is the same as or different from the first dam pattern 17a of a color filter material, a material of the planarization layer 12, and a material of the bank 14. The third dam pattern 17c may include any one material which is the same as or different from the first dam pattern 17a or the second dam pattern 17b of a color filter material, a material of the planarization layer 12, and a material of the bank 14.

A thickness (or a height) of each of the first to third dam patterns 17a, 17b, and 17c may be the same as or different from each other based on the total thickness of the encapsulation layer 19, but embodiments of the present disclosure are not limited thereto, at least one of the first to third dam patterns 17a, 17b, and 17c may have different thickness (or height).

The dam pattern portion 17 according to an embodiment of the present disclosure may include a light emitting material of the light emitting layer EL electrically or spatially separated from the light emitting layer EL of the light emitting device layer 13 in the display portion AA. For example, the light emitting material of the dam pattern portion 17 may be formed to surround the dam pattern portion 17 together with the light emitting layer EL of the light emitting device layer 13 disposed in the display portion AA, and may be electrically or spatially separated from the light emitting layer EL in the display portion AA.

The light emitting display apparatus according to an embodiment of the present disclosure may further include a trench pattern portion 18.

The trench pattern portion 18 may be disposed on the substrate 10 in the inner region of the dam pattern portion 17. For example, the trench pattern portion 18 may be disposed in the inner region of the dam pattern portion 17 to surround the outermost pixel P disposed in the display portion AA. For example, the trench pattern portion 18 may be disposed between the dam pattern portion 17 and the display portion AA to have a closed loop line shape which surrounds the display portion AA. The trench pattern portion 18 may isolate (or disconnect) the light emitting layer EL of the light emitting device layer to block a lateral water penetration path in the inner region of the dam pattern portion 17, and thus, may prevent or minimize a reduction in reliability of the light emitting layer EL of the light emitting device layer caused by the lateral penetration of water. The trench pattern portion 18 may additionally isolate (or disconnect) the common electrode CE, and in this case, an end of the common electrode CE isolated by the trench pattern portion 18 may be implemented to cover the end of the light emitting layer EL isolated by the trench pattern portion 18.

The light emitting layer EL may be formed (or deposited) on the bank 14 and the pixel electrode PE of the subpixel SP disposed in the display portion AA, and simultaneously, may be formed on the non-emission pattern portion 16, the dam pattern portion 17, and the trench pattern portion 18 each disposed in the non-display portion IA.

According to an embodiment of the present disclosure, the light emitting material of the light emitting layer EL formed over the non-emission pattern portion 16 may be electrically or spatially isolated (or disconnected) from the light emitting layer EL of the display portion AA at the isolation portion 15. The dam pattern portion 17 and the light emitting material of the light emitting layer EL formed near the dam pattern portion 17 may be electrically or spatially isolated (or disconnected) from the light emitting material of the non-emission pattern portion 16 at the isolation portion 15 and may be electrically or spatially isolated (or disconnected) from the light emitting layer EL of the display portion AA at the trench pattern portion 18. The light emitting material of the light emitting device layer 13 formed on the trench pattern portion 18 may be electrically or spatially isolated (or disconnected) from the light emitting material of the dam pattern portion 17 and the light emitting device layer 13 of the display portion AA by the trench pattern portion 18.

The common electrode CE may be disposed on the light emitting layer EL and may be isolated (or disconnected) from the trench pattern portion 18 at the isolation portion 15, like the light emitting layer EL. According to an embodiment of the present disclosure, a common electrode material of the common electrode CE disposed in each of the non-emission pattern portion 16, the dam pattern portion 17, and the trench pattern portion 18 may be implemented to fully surround the light emitting material disposed in each of the non-emission pattern portion 16, the dam pattern portion 17, and the trench pattern portion 18. For example, both ends of the common electrode material of the common electrode CE disposed in each of the non-emission pattern portion 16, the dam pattern portion 17, and the trench pattern portion 18 may directly contact a surface of the passivation layer 11c, and thus, may fully seal (or encapsulate) an interface (or a boundary portion) between the surface of the passivation layer 11c and an end of the light emitting material disposed in each of the non-emission pattern portion 16, the dam pattern portion 17, and the trench pattern portion 18, thereby preventing the lateral penetration of water through the interface (or the boundary portion) between the passivation layer 11c and the light emitting material disposed in each of the non-emission pattern portion 16, the dam pattern portion 17, and the trench pattern portion 18.

The encapsulation layer 19 may be disposed over a portion, other than an outermost periphery portion including the pad portion PP, of the substrate 10 and may be implemented to cover the light emitting device layer 13. For example, the encapsulation layer 19 may be implemented to surround all of a front surface and lateral surfaces of the light emitting device layer 13. Also, the encapsulation layer 19 may directly contact the surface (or an uppermost surface) of the passivation layer 11c in the second region of the substrate 10.

As an embodiment, the encapsulation layer 19 may directly contact the surface of the passivation layer 11c at the isolation portion 15, and thus, may fully surround or envelop the non-emission pattern portion 16 and may seal (or encapsulate) the end of the non-emission pattern portion 16 and the interface of the passivation layer 11c.

As another embodiment, the encapsulation layer 19 may directly and further contact the surface of the passivation layer 11c near the dam pattern portion 17, and thus, may seal (or encapsulate) an end of the light emitting material of the dam pattern portion 17 and the interface of the passivation layer 11c.

As another embodiment, the encapsulation layer 19 may further directly contact the surface of the passivation layer 11c near the trench pattern portion 18, and thus, may seal (or encapsulate) an interface of the passivation layer and an end of the light emitting layer EL disposed in the display portion AA.

The encapsulation layer 19 may prevent the lateral penetration of water through an interface of the passivation layer and an end of the light emitting layer EL disposed in the non-display portion IA and the interface of the passivation layer and the end of the light emitting layer EL disposed in the display portion AA, and thus, may prevent the reliability of the light emitting layer EL from being reduced by the lateral penetration of water, thereby increasing the reliability of the light emitting display panel 1.

The encapsulation layer 19 according to an embodiment of the present disclosure may include first to fourth encapsulation layers 19a to 19d.

The first encapsulation layer 19a may be implemented to block oxygen or water from penetrating into the light emitting device layer 13. The first encapsulation layer 19a may be disposed on the common electrode CE and may surround the light emitting device layer 13. Therefore, all of the front surface and the lateral surfaces of the light emitting device layer 13 may be surrounded by the first encapsulation layer 19a. The first encapsulation layer 19a according to an embodiment of the present disclosure may include an inorganic material. Accordingly, the first encapsulation layer 19a may be referred to as a first inorganic encapsulation layer.

The first encapsulation layer 19a may be formed to fully surround the light emitting device layer 13 disposed in the display portion AA of the substrate 10. For example, the first encapsulation layer 19a may be formed in the display portion AA and may directly contact the surface of the passivation layer 11c at a position near the end of the light emitting device layer 13, and thus, may seal (or encapsulate) an interface (or a contact surface) between the end of the light emitting device layer 13 and the passivation layer 11c, thereby preventing or minimizing the lateral penetration of water.

Also, the first encapsulation layer 19a may be formed to fully surround the non-emission pattern portion 16 disposed in the non-display portion IA of the substrate 10. For example, the first encapsulation layer 19a may be formed on the non-emission pattern portion 16 and may directly contact the surface of the passivation layer 11c at the isolation portion 15, and thus, may seal (or encapsulate) an interface (or a contact surface) between the end of the non-emission pattern portion 16 and the passivation layer 11c, thereby preventing or minimizing the lateral penetration of water.

Also, the first encapsulation layer 19a may be formed to fully surround the dam pattern portion 17 disposed in the non-display portion IA of the substrate 10. For example, the first encapsulation layer 19a may be formed on the light emitting device layer 13 of the dam pattern portion 17 and may directly contact the surface of the passivation layer 11c at a position near the dam pattern portion 17, and thus, may seal (or encapsulate) an interface (or a contact surface) between the passivation layer 11c and the end of the light emitting device layer 13 disposed over the dam pattern portion 17, thereby preventing or minimizing the lateral penetration of water.

The first encapsulation layer 19a may directly contact the surface of the passivation layer 11c at each of the isolation portion 15 and the trench pattern portion 18, and thus, may fully seal (or encapsulate) each of an end of the light emitting device layer 13 isolated by the trench pattern portion 18 and an end of a light emitting material pattern of the light emitting device layer 13 isolated by the isolation portion 15, thereby preventing or minimizing the lateral penetration of water.

The second encapsulation layer 19b may be implemented on the first encapsulation layer 19a in the display portion AA to have a thickness which is relatively thicker than the first encapsulation layer 19a. The second encapsulation layer 19b may have a thickness for sufficiently covering particles (or an undesired material or an undesired structure element) which may be or not on the first encapsulation layer 19a. The second encapsulation layer 19b may spread to the periphery portion of the substrate 10 due to a relatively thick thickness thereof, but the spread of the second encapsulation layer 19b may be blocked by the dam pattern portion 17. For example, an end of the second encapsulation layer 19b may directly contact the first encapsulation layer 19a over the dam pattern portion 17. The second encapsulation layer 19b may be disposed on only the first encapsulation layer 19a in an inner region (or an internal region) surrounded by the dam pattern portion 17. For example, the second encapsulation layer 19b may be disposed in all of the display portion AA and the non-display portion IA including the trench pattern portion 18 between the display portion AA and the dam pattern portion 17. The second encapsulation layer 19b may be referred to as a particle cover layer. The trench pattern portion 18 may be covered by the second encapsulation layer 19b, or may be buried into the second encapsulation layer 19b. The second encapsulation layer 19b according to an embodiment of the present disclosure may include an organic material or a liquid organic material. For example, the second encapsulation layer 19b may include an organic material such as silicon oxycarbon (SiOCz), acrylic-based resin, or epoxy-based resin. Accordingly, the second encapsulation layer 19b may be referred to as an organic encapsulation layer.

The third encapsulation layer 19c may be implemented to protect the second encapsulation layer 19b in forming process the isolation portion 15. The third encapsulation layer 19c may be implemented to surround all of the second encapsulation layer 19b disposed inside from the dam pattern portion 17 and the first encapsulation layer 19a disposed outside from the dam pattern portion 17. Particularly, the third encapsulation layer 19c disposed over the non-emission pattern portion 16 may surround all of the first encapsulation layer 19a over the non-emission pattern portion 16 and the surface of the passivation layer 11c exposed at a portion near the non-emission pattern portion 16, and thus, may seal (or encapsulate) an interface (or a contact surface) between the passivation layer 11c and an end of the first encapsulation layer 19a surrounding the non-emission pattern portion 16. For example, the non-emission pattern portion 16 disposed over the passivation layer 11c may be doubly sealed or enveloped (or surrounded) by the first encapsulation layer 19a and the third encapsulation layer 19c. The third encapsulation layer 19c according to an embodiment of the present disclosure may include an inorganic material which is the same as or different from the first encapsulation layer 19a. Accordingly, the third encapsulation layer 19c may be referred to as a second inorganic encapsulation layer. For example, the non-emission pattern portion 16 may be doubly sealed or enveloped (or surrounded) by the first encapsulation layer 19a and the second inorganic encapsulation layer 19c, on the passivation layer 11c.

The fourth encapsulation layer 19d may be implemented to primarily prevent oxygen or water from penetrating into the light emitting device layer 13. The fourth encapsulation layer 19d may be implemented to surround the third encapsulation layer 19c. The fourth encapsulation layer 19d may be disposed over each of the first non-emission pattern portion 16 (or a non-emission pattern portion) and a second non-emission pattern portion 17 (or a dam pattern portion) and may directly contact the surface of the passivation layer 11c, between the first non-emission pattern portion 16 and the second non-emission pattern portion 17, and thus, may wholly surround or seal each of the first non-emission pattern portion 16 and the second non-emission pattern portion 17.

According to an embodiment of the present disclosure, the fourth encapsulation layer 19d disposed over the isolation portion 15 and the non-emission pattern portion 16 may directly contact the surface of the passivation layer 11c at the isolation portion 15 and may seal (or encapsulate) an interface (or a contact surface) between the passivation layer 11c and an end of the third encapsulation layer 19c surrounding the non-emission pattern portion 16, thereby additionally preventing or minimizing the lateral penetration of water. For example, the non-emission pattern portion 16 disposed on the passivation layer 11c may be triply sealed or enveloped (or surrounded) by the first encapsulation layer 19a, the third encapsulation layer 19c, and the fourth encapsulation layer 19d. The fourth encapsulation layer 19d according to an embodiment of the present disclosure may include an inorganic material which is the same as or different from the first encapsulation layer 19a or the third encapsulation layer 19c. Accordingly, the fourth encapsulation layer 19d may be referred to as a third inorganic encapsulation layer.

Referring again to FIGS. 3 and 5, the light emitting display apparatus according to an embodiment of the present disclosure may further include a wavelength conversion layer 21 disposed over the substrate 10.

The wavelength conversion layer 21 may convert a wavelength of light which is incident thereon from an emission area of each pixel area PA. For example, the wavelength conversion layer 21 may convert white light (or blue light), which is incident thereon from the emission area, into color light corresponding to the subpixel SP or may transmit only color light corresponding to the subpixel SP. For example, the wavelength conversion layer 21 may include at least one of a wavelength conversion member and a color filter layer.

The wavelength conversion layer 21 according to an embodiment may include a plurality of wavelength conversion members 21a and a protection layer 21b.

The plurality of wavelength conversion members 21a may be disposed over the encapsulation layer 19 disposed in the emission area EA of each of the plurality of pixel areas PA. For example, each of the plurality of wavelength conversion members 21a may be implemented to have the same size as or wider than the emission area EA of each subpixel area SPA.

The plurality of wavelength conversion members 21a according to an embodiment may be divided (or classified) into a red light filter which converts white light (or blue light) into red light, a green light filter which converts white light (or blue light) into green light, and a blue light filter which converts white light (or blue light) into blue light. For example, the red light filter (or a first light filter) may be disposed over the encapsulation layer 19 in the emission area EA of the red subpixel SP, the green light filter (or a second light filter) may be disposed over the encapsulation layer 19 in the emission area EA of the green subpixel SP, and the blue light filter (or a third light filter) may be disposed over the encapsulation layer 19 in the emission area EA of the blue subpixel SP.

The plurality of wavelength conversion members 21a according to another embodiment may be disposed over the encapsulation layer 19 of each subpixel area SPA. For example, each of the plurality of wavelength conversion members 21a may be disposed over the encapsulation layer 19 to overlap the entire corresponding subpixel area SPA.

The plurality of wavelength conversion members 21a according to another embodiment may be implemented to overlap each other at the encapsulation layer 19 overlapped with the circuit area CA (or the non-emission area) except for the emission area EA of each subpixel areas SPA. For example, two or more wavelength conversion members 21a having different colors are disposed at the encapsulation layer 19 overlapping the circuit area CA (or non-emission area) except for the emission area EA of each subpixel areas SPA. The two or more wavelength conversion members 21a disposed at the encapsulation layer 19 overlapping the circuit area CA (or non-emission area) may act as a function of a light blocking pattern which prevents color mixture between adjacent subpixels SP or between adjacent pixels P.

The protection layer 21b may be implemented to cover the wavelength conversion members 21a and to provide a flat surface over the wavelength conversion members 21a. The protection layer 21b may be disposed to cover the wavelength conversion members 21a and the encapsulation layer 19 where the wavelength conversion members 21a are not disposed. The protection layer 21b according to an embodiment may include an organic material. Alternatively, the protection layer 21b may further include a getter material for adsorbing water and/or oxygen.

Alternatively, the wavelength conversion layer 21 according to an embodiment may further include a quantum member interposed between the wavelength conversion member 21a and the encapsulation layer 19. The quantum dot member may be configured to re-emit color light set in a subpixel by re-emitting according to white light or blue light incident from the light emitting device layer 13.

Alternatively, the wavelength conversion layer 21 according to another embodiment may include two or more layers wavelength conversion members 21a disposed over the encapsulation layer 19 overlapping the circuit area CA (or non-emission area) except for the emission area EA in each subpixel areas SPA. The two or more layers wavelength conversion members 21a may act as a function of the light blocking pattern.

Alternatively, the wavelength conversion layer 21 may be changed to a wavelength conversion sheet having a sheet form and may be disposed on the encapsulation layer 19. In this case, the wavelength conversion sheet (or a quantum dot sheet) may include the wavelength conversion members 21a disposed between a pair of films. The wavelength conversion members 21a of the wavelength conversion sheet may include a quantum dot member configured to re-emit color light set in a subpixel by re-emitting according to white light or blue light incident from the light emitting device layer 13.

The light emitting display apparatus according to an embodiment of the present disclosure may further include a functional film 23 disposed over the substrate 10.

The functional film 23 may be disposed over the wavelength conversion layer 21. For example, the functional film 23 may be coupled to at the wavelength conversion layer 21 by a transparent adhesive member.

The functional film 23 according to an embodiment may include an anti-reflection layer (or an anti-reflection film) for preventing reflection of external light to enhance outdoor visibility and a contrast ratio with respect to an image displayed by the display panel. For example, the anti-reflection layer may include a circular polarization layer (or a circular polarization film) which prevents external light, reflected by TFTs and/or the pixel driving lines disposed at the substrate 10, from traveling to the outside.

The functional film 23 according to an embodiment may further include a barrier layer (or a barrier film) for primarily preventing the penetration of water or oxygen, and the barrier layer may include a material (for example, a polymer material) which is low in water transmission rate.

The functional film 23 according to an embodiment may further include a light path control layer (or a light path control film) for controlling a path of light output from each pixel P to the outside. The light path control layer may include a stacked structure where a high refraction layer and a low refraction layer are alternately stacked and may change a path of light incident from each pixel P to minimize a color shift based on a viewing angle.

The light emitting display apparatus according to an embodiment of the present disclosure may further include a side sealing member 25 disposed over the substrate 10.

The side sealing member 25 may be formed between the substrate 10 and the functional film 23 and may cover all of lateral surfaces of the circuit layer 11 and the wavelength conversion layer 21. For example, the side sealing member 25 may cover all of lateral surfaces of each of the circuit layer 11 and the wavelength conversion layer 21 exposed at the outside of the light emitting display apparatus, between the functional film 23 and the substrate 10. Also, the side sealing member 25 may cover a portion of the flexible circuit film 31 attached at each of the plurality of pad portions PP, at one periphery portion of the substrate 10. The side sealing member 25 may prevent lateral light leakage by using light, traveling to an outer surface in the wavelength conversion layer 21, of light emitted from the light emitting device ED of each subpixel SP. Particularly, the side sealing member 25 overlapping the pad portion PP of the substrate 10 may prevent or minimize the reflection of light by the pad electrodes PPe disposed in the pad portion PP.

Alternatively, the side sealing member 25 may further include a getter material for adsorbing water and/or oxygen.

Figure 6:
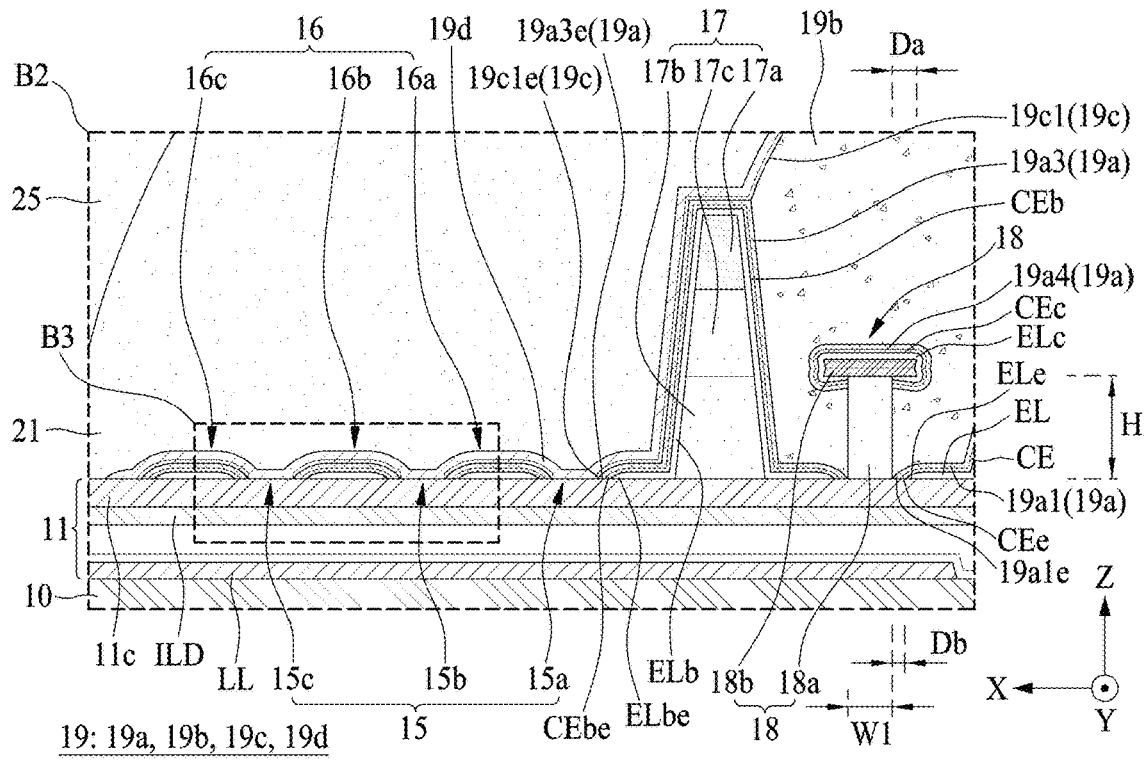
FIG. 6 is an enlarged view of a region 'B2' illustrated in FIG. 3.
Figure 7:
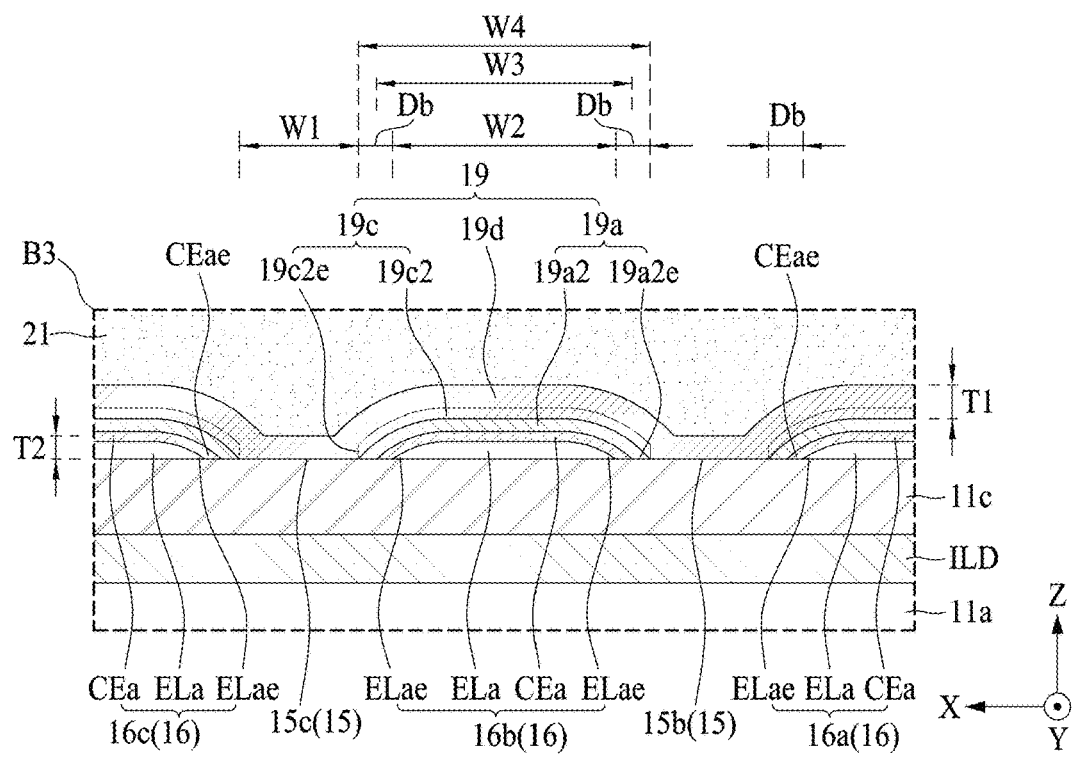
FIG. 7 is an enlarged view of a region 'B3' illustrated in FIG. 6.

FIG. 6 is an enlarged view of a region 'B2' illustrated in FIG. 3, and FIG. 7 is an enlarged view of a region 'B3' illustrated in FIG. 6 and are a diagram for describing an isolation structure of a light emitting layer and a water prevention structure of an isolated light emitting layer.

Referring to FIGS. 3, 6, and 7, a trench pattern portion 18 according to an embodiment of the present disclosure may include a first trench structure 18a and a second trench structure 18b.

The first trench structure 18a may be disposed at the passivation layer 11c between the dam pattern portion 17 and the display portion AA. The first trench structure 18a may include the same material as the planarization layer 12.

For example, the first trench structure 18a may be formed by a patterning process (or an etching process) performed on the planarization layer 12 disposed in the non-display portion IA. For example, the first trench structure 18a may be referred to as a first isolation structure material or a first tapered structure material, or the like.

A lateral surface of the first trench structure 18a according to an embodiment of the present disclosure may be implemented in an inclined structure or a tapered structure. A bottom surface of the first trench structure 18a may directly contact a surface (or a top surface) of the passivation layer 11c, and a top surface of the first trench structure 18a may be disposed on the bottom surface of the first trench structure 18a and may have a width which is narrower than the bottom surface thereof. The lateral surface of the first trench structure 18a may be formed to be inclined between the top surface and the bottom surface thereof. In the first trench structure 18a, an included angle between the bottom surface and the lateral surface may be an acute angle, and an included angle between the top surface and the lateral surface may be an obtuse angle. For example, a cross-sectional surface of the first trench structure 18a cut in a width direction may have a trapezoid shape where a top surface thereof is narrower than a bottom surface thereof.

The first trench structure 18a may have a height (or a thickness) H which is the same as the planarization layer 12, or may have a height H which is two or more times a height of the planarization layer 12. For example, the first trench structure 18a may have a height H of 2 μm or more.

The second trench structure 18b may be disposed over the first trench structure 18a. The second trench structure 18b may have at least two-layer structure which is the same as the pixel electrode PE. For example, the second trench structure 18b may include a first metal layer which is formed together with a first pixel electrode layer PEL1 of a pixel electrode PE and directly contacts the top surface of the first trench structure 18a, a second metal layer which is formed together with a second pixel electrode layer PEL2 of the pixel electrode PE and is disposed (or stacked) over the first metal layer, and a third metal layer which is formed together with a third pixel electrode layer PEL3 of the pixel electrode PE and is disposed (or stacked) over the second metal layer.

The second trench structure 18b may have a width which is wider than the top surface of the first trench structure 18a. The second trench structure 18b may protrude to the outside of a lateral surface of the first trench structure 18a. With respect to a width direction, each of one periphery portion and the other periphery portion of the second trench structure 18b may protrude to the outside of the lateral surface of the first trench structure 18a. Accordingly, the second trench structure 18b may include a protrusion portion (or a protrusion tip) including a metal material protruding to the outside of the lateral surface of the first trench structure 18a.

The second trench structure 18b according to an embodiment of the present disclosure may protrude by 5 μm from an upper lateral surface (or an upper sidewall) of the first trench structure 18a. For example, a shortest distance (or a length of a protrusion portion) Da between an end (an outer sidewall) of the second trench structure 18b and the first trench structure 18a may be 5 μm or more. For example, a distance Da between an end (an outer sidewall) of the second trench structure 18b and an upper sidewall of the first trench structure 18a may be 5 μm to 20 μm, but embodiments of the present disclosure are not limited thereto and may be set based on a shadow region (or a tail portion) ELe of the light emitting layer EL, which inevitably occurs in a process of forming the light emitting layer EL.

The lateral surface of the first trench structure 18a may have an undercut structure with respect to the second trench structure 18b. For example, the trench pattern portion 18 may include a boundary portion between the first trench structure 18a and the second trench structure 18b or an undercut region disposed over an upper lateral surface (or an upper sidewall) of the first trench structure 18a. The second trench structure 18b may protrude to the outside of the lateral surface of the first trench structure 18a based on the undercut structure, and thus, may cover the lateral surface of the first trench structure 18a. Accordingly, the second trench structure 18b may have an eaves structure with respect to the first trench structure 18a based on a protrusion portion (or a protrusion tip) protruding to the outside of the lateral surface of the first trench structure 18a.

The trench pattern portion 18 may isolate (or disconnect) the light emitting device layer 13. For example, the trench pattern portion 18 may electrically or spatially isolate (or disconnect) the light emitting layer EL, disposed in the display portion AA of the substrate 10, from the light emitting layer EL disposed in the non-display portion IA of the substrate 10.

The trench pattern portion 18 according to an embodiment of the present disclosure may isolate (or disconnect) the light emitting layer EL of the light emitting device layer 13. For example, the light emitting layer EL of the light emitting device layer 13 formed (or deposited) over the trench pattern portion 18 may be automatically isolated (or disconnected) by the undercut structure (or the eaves structure) in a deposition process, without a separate disconnection process. Accordingly, the light emitting device layer 13 may include an isolation region isolated by the trench pattern portion 18.

The isolation portion 15 according to an embodiment of the present disclosure may isolate (or disconnect) the light emitting device layer 13 disposed in the non-display portion IA or the periphery portion of the substrate 10. For example, the isolation portion 15 may isolate (or disconnect) the light emitting layer EL of the light emitting device layer 13 disposed in the non-display portion IA of the substrate 10 at least once. For example, the isolation portion 15 may isolate (or disconnect) a light emitting material, which is disposed in the non-display portion IA of the substrate 10 together with the light emitting layer EL of the light emitting device layer 13 disposed in the display portion AA of the substrate 10, at least once.

The isolation portion 15 according to an embodiment of the present disclosure may include at least two isolation patterns 15a to 15c. For example, the isolation portion 15 may include first to third isolation patterns 15a to 15c.

Each of the first to third isolation patterns 15a to 15c may have a closed loop line shape which surrounds the display portion AA. For example, the first isolation pattern 15a may be disposed adjacent to the display portion AA, or may be implemented in a closed loop line shape which surrounds the dam pattern portion 17. The second isolation pattern 15b may be implemented in a closed loop line shape which surrounds the first isolation pattern 15a and may be spatially isolated (or separated or spaced apart) from the first isolation pattern 15a. The third isolation pattern 15c may be implemented in a closed loop line shape which surrounds the second isolation pattern 15b and may be spatially isolated (or separated or spaced apart) from the second isolation pattern 15b.

Each of the first to third isolation patterns 15a to 15c may include an eaves structure for isolating (or disconnecting) the light emitting device layer 13. For example, each of the first to third isolation patterns 15a to 15c may be implemented as a region (or a portion), from which the trench pattern portion 18 is removed, by a trench pattern removing process after the trench pattern portion 18 is formed, after a process of forming the third encapsulation layer 19c of the encapsulation layer 19, and before a process of forming the fourth encapsulation layer 19d. For example, each of the first to third isolation patterns 15a to 15c may be defined as a region which does not include the light emitting device layer 13.

According to an embodiment of the present disclosure, each of the first to third isolation patterns 15a to 15c may correspond to a region from which the trench pattern portion 18 is removed, and thus, may have a width W1 which is the same as the bottom surface of the first trench structure 18a. Each of the first to third isolation patterns 15a to 15c may have a width W1 of 40 μm or less, for decreasing a bezel width of the light emitting display panel, but embodiments of the present disclosure are not limited thereto. For example, the width W1 of each of the first to third isolation patterns 15a to 15c may be set to a minimum width which enables the first trench structure 18a to be formed by a process of patterning the planarization layer 12. For example, each of the first to third isolation patterns 15a to 15c may have a width W1 of 10 μm to 30 μm.

The non-emission pattern portion 16 according to an embodiment of the present disclosure may be implemented in a closed loop line shape over the passivation layer 11c in the non-display portion IA or the periphery portion of the substrate 10. For example, the non-emission pattern portion 16 may be implemented in a closed loop line shape over the passivation layer 11c between the first to third isolation patterns 15a to 15c disposed in the non-display portion IA or the periphery portion of the substrate 10.

The non-emission pattern portion 16 according to an embodiment of the present disclosure may include a first light emitting material ELa which is formed together with the light emitting layer EL of the light emitting device layer 13 disposed in the display portion AA and is electrically or spatially isolated (or disconnected) from the light emitting layer EL of the display portion AA by the isolation portion 15.

The first light emitting material pattern ELa may be disposed over the passivation layer 11c disposed between the first to third isolation patterns 15a to 15c. For example, a bottom surface (or a lower surface) of the first light emitting material pattern ELa may directly contact the surface of the passivation layer 11c. For example, the first light emitting material pattern ELa may be spatially isolated from the light emitting layer EL of the display portion AA, and thus, may be referred to as a first light emitting layer pattern, a first light emitting layer isolation pattern, a first island light emitting material, a first island light emitting material pattern, a first island light emitting layer, or the like. Also, the first light emitting material pattern ELa may be electrically disconnected from the light emitting layer EL of the display portion AA and may not emit light, and thus, may be referred to as a first non-emission layer pattern, a first non-emission layer isolation pattern, a first island non-emission material, a first island non-emission material pattern, a first island non-emission layer, or the like.

The non-emission pattern portion 16 according to an embodiment of the present disclosure may further include a first common electrode material pattern CEa which is formed together with the common electrode CE of the light emitting device layer 13 disposed in the display portion AA and is electrically or spatially isolated from the common electrode CE of the display portion AA by the isolation portion 15. For example, the first common electrode material pattern CEa may be electrically or spatially isolated from the common electrode CE of the display portion AA, and thus, may be referred to as a first common electrode pattern, a first island common electrode material pattern, a first island common electrode, a first island common electrode pattern, or the like.

The first common electrode material pattern CEa may be disposed on the first light emitting material pattern ELa and the passivation layer 11c and may wholly surround or envelop the first light emitting material pattern ELa. For example, both ends (or a tail portion) CEae of the first common electrode material pattern CEa may directly contact the surface of the passivation layer 11c disposed (or exposed) at the isolation portion 15, and thus, may seal (or encapsulate) an interface (or a boundary portion) between the both ends (or the tail portion) CEae of the first common electrode material pattern CEa and the surface of the passivation layer 11c, thereby preventing the lateral penetration of water through an interface (or a boundary portion) between an end (or a tail portion) ELae of the first light emitting material pattern ELa and the surface of the passivation layer 11c.

The first common electrode material pattern CEa may have a width W3 which is wider than a width W2 of the first light emitting material pattern ELa. Accordingly, the end (or the tail portion) ELae of the first light emitting material pattern ELa may directly contact the surface of the passivation layer 11c disposed near the end ELae of the first light emitting material pattern ELa, thereby wholly surrounding or enveloping the first light emitting material pattern ELa.

The non-emission pattern portion 16 according to an embodiment of the present disclosure may include at least two non-emission patterns 16a to 16c. For example, the non-emission pattern portion 16 may include first to third non-emission patterns 16a to 16c.

Each of the first to third non-emission patterns 16a to 16c may have a closed loop line shape. For example, the first non-emission pattern 16a may be implemented in a closed loop line shape which surrounds the first isolation pattern 15a. The second non-emission pattern 16b may be implemented in a closed loop line shape which surrounds the first non-emission pattern 16a and may be spatially isolated (or separated or spaced apart) from the first non-emission pattern 16a by the second isolation pattern 15b. The third non-emission pattern 16c may be implemented in a closed loop line shape which surrounds the second non-emission pattern 16b and may be spatially isolated (or separated or spaced apart) from the second non-emission pattern 16b by the third isolation pattern 15c.

Each of the first to third non-emission patterns 16a to 16c may have a width W2 which is greater than the width W1 of each of the first to third isolation patterns 15a to 15c, but embodiments of the present disclosure are not limited thereto. For example, each of the first to third non-emission patterns 16a to 16c may include a material of the light emitting layer EL which passes through a space between the second trench structures 18b of the trench pattern portions 18 removed after being disposed in each of the first to third isolation patterns 15a to 15c and is deposited on the passivation layer 11c, and thus, may have the width W2 which is the same as or different from the width W1 of each of the first to third isolation patterns 15a to 15c, based on a length of a shadow region (or a tail portion) of the light emitting layer EL or a distance (or a width) between the second trench structures 18b of the trench pattern portions 18 removed after being disposed in each of the first to third isolation patterns 15a to 15c.

Each of the first to third non-emission patterns 16a to 16c may include the first light emitting material pattern ELa disposed over the passivation layer 11c, and the first common electrode material pattern CEa which is disposed over the first light emitting material pattern ELa and the passivation layer 11c and wholly surrounds or envelops the first light emitting material pattern ELa.

The light emitting display apparatus according to an embodiment of the present disclosure may further include a second light emitting material pattern ELb which is disposed between the light emitting layer EL and the first light emitting material pattern ELa and is electrically or spatially isolated from each of the light emitting layer EL and the first light emitting material pattern ELa. For example, the dam pattern portion 17 may include the second light emitting material pattern ELb.

The second light emitting material pattern ELb may be formed over the dam pattern portion 17 together with the light emitting layer EL of the light emitting device layer 13 disposed in the display portion AA and is electrically or spatially isolated (or disconnected) from the light emitting layer EL in the display portion AA.

The second light emitting material pattern ELb may be disposed over the dam pattern portion 17 and the passivation layer 11c and may wholly surround the dam pattern portion 17. The second light emitting material pattern ELb may be electrically or spatially isolated from the first light emitting material pattern ELa over the non-emission pattern portion 16 by the isolation portion 15 and may be electrically or spatially isolated (or disconnected) from the light emitting layer EL in the display portion by the trench pattern portion 18. For example, the second light emitting material pattern ELb may be spatially isolated from the light emitting layer EL of the display portion AA, and thus, may be referred to as a second light emitting layer pattern, a second light emitting layer isolation pattern, a second island light emitting material, a second island light emitting material pattern, a second island light emitting layer, or the like. Also, the second light emitting material pattern ELb may be electrically isolated (or disconnected) from the light emitting layer EL of the display portion AA and may not emit light, and thus, may be referred to as a second non-emission layer pattern, a second non-emission layer isolation pattern, a second island non-emission material, a second island non-emission material pattern, or a second island non-emission layer, or the like.

The light emitting display apparatus according to an embodiment of the present disclosure may further include a second common electrode material pattern CEb which wholly surrounds the second light emitting material pattern ELb. For example, the dam pattern portion 17 may further include the second common electrode material pattern CEb which wholly surrounds the second light emitting material pattern ELb. For example, the second common electrode material pattern CEb and the second light emitting material pattern ELb disposed over the dam pattern portion 17 may be electrically or spatially isolated (or disconnected) from the light emitting device layer 13 of the display portion AA, and thus, may be referred to as a second non-emission pattern portion.

The second common electrode material pattern CEb may be disposed over the second light emitting material pattern ELb together with the common electrode CE of the light emitting device layer 13 disposed in the display portion AA and may be electrically or spatially isolated (or disconnected) from the common electrode CE of the display portion AA. For example, the second common electrode material pattern CEb may be electrically or spatially isolated (or disconnected) from the common electrode CE of the display portion AA, and thus, may be referred to as a second common electrode pattern, a second island common electrode material pattern, a second island common electrode, a second island common electrode pattern, or the like.

The second common electrode material pattern CEb may be disposed over the second light emitting material pattern ELb and the passivation layer 11c and may wholly surround or envelop the second light emitting material pattern ELb. For example, both ends (or a tail portion) CEbe of the second common electrode material pattern CEb may directly contact the surface of the passivation layer 11c disposed (or exposed) at a portion near the dam pattern portion 17, and thus, may seal (or encapsulate) an interface (or a boundary portion) between the both ends (or the tail portion) CEbe of the second common electrode material pattern CEb and the surface of the passivation layer 11c, thereby preventing the lateral penetration of water through an interface (or a boundary portion) between an end (or a tail portion) ELbe of the second light emitting material pattern ELb and the surface of the passivation layer 11c.

The second common electrode material pattern CEb may have a width W which is wider than a width of the second light emitting material pattern ELb. Accordingly, the end (or the tail portion) ELbe of the second light emitting material pattern ELb may directly contact the surface of the passivation layer 11c disposed near the end ELbe of the second light emitting material pattern ELb, thereby wholly surrounding or enveloping the second light emitting material pattern ELb.

The light emitting display apparatus according to an embodiment of the present disclosure may further include a third light emitting material pattern ELc which is disposed between the light emitting layer EL and the second light emitting material pattern ELb and is electrically or spatially isolated (or disconnected) from the light emitting layer EL.

The second light emitting material pattern ELb may be disposed over the trench pattern portion 18. For example, the trench pattern portion 18 may include the third light emitting material pattern ELc.

The third light emitting material pattern ELc may be formed over the trench pattern portion 18 together with the light emitting layer EL of the light emitting device layer 13 disposed in the display portion AA and is electrically or spatially isolated (or disconnected) from the light emitting layer EL in the display portion AA by the trench pattern portion 18. The third light emitting material pattern ELc may be electrically or spatially isolated (or disconnected) from the second light emitting material pattern ELb over the dam pattern portion 17 by the trench pattern portion 18.

According to an embodiment of the present disclosure, a deposition material of the light emitting layer EL may have linearity, and thus, may not be deposited on a lateral surface of the first trench structure 18a covered by the second trench structure 18b based on an undercut structure (or an eaves structure) of the trench pattern portion 18. Therefore, the light emitting layer EL formed (or deposited) on the trench pattern portion 18 may be isolated (or disconnected) between the first trench structure 18a and the second trench structure 18b. Accordingly, the third light emitting material pattern ELc may be electrically or spatially isolated (or disconnected) from the light emitting layer EL of the display portion AA by the trench pattern portion 18 in performing a deposition process, and thus, a separate patterning process of isolating (or disconnecting) the light emitting layer EL may be omitted.

The third light emitting material pattern ELc may surround the second trench structure 18b of the trench pattern portion 18. For example, the third light emitting material pattern ELc may not be formed on the lateral surface of the first trench structure 18b and may be formed on a top surface (or a front surface) of the second trench structure 18b. Also, the third light emitting material pattern ELc may be additionally formed on a bottom surface (or a rear surface) of the second trench structure 18b. For example, the third light emitting material pattern ELc may be spatially isolated (or disconnected) from the light emitting layer EL of the display portion AA, and thus, may be referred to as a third light emitting layer pattern, a third light emitting layer isolation pattern, a third island light emitting material, a third island light emitting material pattern, a third island light emitting layer, or the like. Also, the third light emitting material pattern ELc may be electrically isolated (or disconnected) from the light emitting layer EL of the display portion AA and may not emit light, and thus, may be referred to as a third non-emission layer pattern, a third non-emission layer isolation pattern, a third island non-emission material, a third island non-emission material pattern, a third island non-emission layer, or the like.

A shortest distance Db between the first trench structure 18a and an end (or a tail portion) ELe of the light emitting layer EL isolated by the trench pattern portion 18 may be 1 μm or more, but embodiments of the present disclosure are not limited thereto. For example, the shortest distance Db between the first trench structure 18a and the end (or the tail portion) ELe of the light emitting layer EL may be 1 μm or more, based on the shortest distance Da between the end (the outer sidewall) of the second trench structure 18b and the first trench structure 18a. Likewise, the shortest distance Db between the first trench structure 18a and an end (or a tail portion) ELbe of the second light emitting material pattern ELb isolated by the trench pattern portion 18 may be 1 μm or more, but embodiments of the present disclosure are not limited thereto. For example, the shortest distance Db between the first trench structure 18a and the end (or the tail portion) ELbe of the second light emitting material pattern ELb may be 1 μm or more, based on the shortest distance Da between the end (the outer sidewall) of the second trench structure 18b and the first trench structure 18a.

The light emitting display apparatus according to an embodiment of the present disclosure may further include a third common electrode material pattern CEc which wholly surrounds the third light emitting material pattern ELc. For example, the trench pattern portion 18 may further include the third common electrode material pattern CEc which wholly surrounds the third light emitting material pattern ELc. For example, the third common electrode material pattern CEc and the third light emitting material pattern ELc disposed over the trench pattern portion 18 may be electrically or spatially isolated (or disconnected) from the light emitting device layer 13 of the display portion AA, and thus, may be referred to as a third non-emission pattern portion.

The third common electrode material pattern CEc may be disposed over the third light emitting material pattern ELc together with the common electrode CE of the light emitting device layer 13 disposed in the display portion AA and may be electrically or spatially isolated (or disconnected) from the common electrode CE of the display portion AA. For example, the third common electrode material pattern CEc may be electrically or spatially isolated (or disconnected)

from the common electrode CE of the display portion AA, and thus, may be referred to as a third common electrode pattern, a third island common electrode material pattern, a third island common electrode, a third island common electrode pattern, or the like.

The third common electrode material pattern CEc may be disposed on the third light emitting material pattern ELc disposed in the second trench structure 18*b* of the trench pattern portion 18. For example, the third common electrode material pattern CEc may not be formed on the lateral surface of the first trench structure 18*b* and may be formed on a top surface (or a front surface) and a lateral surface of the third light emitting material pattern ELc on the second trench structure 18*b*, and thus, may be electrically or spatially isolated (or disconnected) from the common electrode CE disposed in the display portion AA. Also, the third common electrode material pattern CEc may be additionally formed to surround the third common electrode material pattern CEc on a bottom surface (or a rear surface) of the second trench structure 18*b*.

The common electrode material (or the deposition material) of the common electrode CE may not be deposited on the lateral surface of the first trench structure 18*a* based on the undercut structure (or the eaves structure) of the trench pattern portion 18 and a height H of the first trench structure 18*a*. Therefore, the third common electrode material pattern CEc formed (or deposited) on the trench pattern portion 18 may be isolated (or disconnected) between the first trench structure 18*a* and the second trench structure 18*b*. Accordingly, the third common electrode material pattern CEc may be automatically isolated (or disconnected) from the common electrode CE by the trench pattern portion 18 in performing a deposition process, and thus, a separate patterning process for isolating (or disconnecting) the common electrode CE may be omitted.

An end (or a tail portion) CEe of the common electrode CE isolated by the trench pattern portion 18 may cover the end (or the tail portion) ELe of the light emitting layer EL. For example, the end (or the tail portion) CEe of the common electrode CE may directly contact a surface of the passivation layer 11*c* disposed (or exposed) between the end (or the tail portion) ELe of the light emitting layer EL and the first trench structure 18*a*, and thus, may seal (or encapsulate) an interface (or a boundary portion) between the end (or the tail portion) ELe of the light emitting layer EL and the surface of the passivation layer 11*c*, thereby preventing the lateral penetration of water through the interface (or the boundary portion) between the end (or the tail portion) ELe of the light emitting layer EL isolated by the trench pattern portion 18 and the surface of the passivation layer 11*c*.

The encapsulation layer 19 according to an embodiment of the present disclosure may include first to fourth encapsulation layers 19*a* to 19*d*.

The first encapsulation layer 19*a* may be disposed over a portion, other than the isolation portion 15 and an outermost periphery portion including the pad portion PP, of the substrate 10 and may be implemented to cover the light emitting device layer 13 and a material pattern of the light emitting device layer 13.

The first encapsulation layer 19*a* according to an embodiment of the present disclosure may include a 1-1$^{th}$ encapsulation material pattern 19*a*1 disposed over the display portion AA and a 1-2$^{th}$ encapsulation material pattern 19*a*2 disposed over the non-emission pattern portion 16 in the non-display portion IA of the substrate 10.

The 1-1$^{th}$ encapsulation material pattern 19*a*1 may wholly surround the light emitting device layer 13 disposed in the display portion AA of the substrate 10. The 1-1$^{th}$ encapsulation material pattern 19*a*1 may directly contact the surface of the passivation layer 11*c* disposed (or exposed) near the end CEe of the light emitting device layer 13 disposed in the display portion AA. For example, an end (or a tail portion) 19*ale* of the 1-1$^{th}$ encapsulation material pattern 19*a*1 may seal (or encapsulate) an interface (or a contact surface) between the passivation layer 11*c* and the end CEe of the light emitting device layer 13 disposed in the display portion AA, thereby preventing or minimizing the lateral penetration of water.

The 1-2$^{th}$ encapsulation material pattern 19*a*2 may wholly surround the non-emission pattern portion 16 (or a first non-emission pattern portion) disposed in the non-display portion IA of the substrate 10. The 1-2$^{th}$ encapsulation material pattern 19*a*2 may directly contact the surface of the passivation layer 11*c* which is disposed on the non-emission pattern portion 16 and is disposed (or exposed) at the isolation portion 15 near the non-emission pattern portion 16, and thus, may seal (or encapsulate) an interface (or a contact surface) between the passivation layer 11*c* and an end CEae of the non-emission pattern portion 16, thereby preventing or minimizing the lateral penetration of water.

According to an embodiment of the present disclosure, the 1-2$^{th}$ encapsulation material pattern 19*a*2 may have a width W4 which is wider than a width W3 of the non-emission pattern portion 16. Therefore, an end (or a tail portion) 19*a*2*e* of the 1-2$^{th}$ encapsulation material pattern 19*a*2 may directly contact the surface of the passivation layer 11*c* near the non-emission pattern portion 16. Accordingly, the 1-2$^{th}$ encapsulation material pattern 19*a*2 may surround the first common electrode material pattern CEa disposed in the non-emission pattern portion 16 and may seal (or encapsulate) an interface (or a contact surface) between the passivation layer 11*c* and an end CEae of the first common electrode material pattern CEa, thereby preventing or minimizing the lateral penetration of water.

According to an embodiment of the present disclosure, the 1-2$^{th}$ encapsulation material pattern 19*a*2 may wholly surround each of the at least two non-emission patterns 16*a* to 16*c* of the non-emission pattern portion 16, and thus, may prevent the lateral penetration of water through the first light emitting material pattern ELa disposed over the at least two non-emission patterns 16*a* to 16*c*.

The first encapsulation layer 19*a* according to an embodiment of the present disclosure may further include a 1-3$^{th}$ encapsulation material pattern 19*a*3 disposed over the dam pattern portion 17 in the non-display portion IA of the substrate 10.

The 1-3$^{th}$ encapsulation material pattern 19*a*3 may wholly surround the second non-emission pattern portion disposed over the dam pattern portion 17. The 1-3$^{th}$ encapsulation material pattern 19*a*3 may be disposed over the second non-emission pattern portion and may directly contact the surface of the passivation layer 11*c* at a position near the dam pattern portion 17, and thus, may seal (or encapsulate) an interface (or a contact surface) between an end CEbe of the second non-emission pattern portion and the passivation layer 11*c*, thereby preventing or minimizing the lateral penetration of water. For example, the second non-emission pattern portion may include a second light emitting material pattern ELb and a second common electrode material pattern CEb. For example, an end 19*a*3*e* of the 1-3$^{th}$ encapsulation material pattern 19*a*3 may directly contact the surface of the passivation layer 11*c* at a position near an end CEbe of the second common electrode material pattern CEb, and thus, may seal (or encapsulate) an interface (or a contact surface)

between the end CEbe of the second common electrode material pattern CEb and the passivation layer 11c, thereby preventing or minimizing the lateral penetration of water.

The first encapsulation layer 19a according to an embodiment of the present disclosure may further include a 1-4$^{th}$ encapsulation material pattern 19a4 disposed over the trench pattern portion 18 in the non-display portion IA of the substrate 10.

The 1-4$^{th}$ encapsulation material pattern 19a4 may wholly surround the third non-emission pattern portion disposed over the trench pattern portion 18. The 1-4$^{th}$ encapsulation material pattern 19a4 may be disposed over the third non-emission pattern portion and may directly contact the surface of the first trench structure 18b of the trench pattern portion 18, and thus, may surround the third non-emission pattern portion. For example, the third non-emission pattern portion may include a third light emitting material pattern ELc and a third common electrode material pattern CEc. For example, an end of the 1-4$^{th}$ encapsulation material pattern 19a4 may directly contact the surface of the first trench structure 18b at a position near an end of the third common electrode material pattern CEc.

The second encapsulation layer 19b (or an organic encapsulation layer) may be implemented on the first encapsulation layer 19a in the display portion AA surrounded by the dam pattern portion 17. The second encapsulation layer 19b may have a thickness which is relatively thicker than the first encapsulation layer 19a. The second encapsulation layer 19b may cover the trench pattern portion 18. The spread of the second encapsulation layer 19b may be blocked by the dam pattern portion 17.

The third encapsulation layer 19c (or a second inorganic encapsulation layer) may be implemented on the second encapsulation layer 19b and the first encapsulation layer 19a disposed in the non-display portion IA of the substrate 10. The third encapsulation layer 19c may be implemented to wholly surround each of the second encapsulation layer 19b, the first encapsulation layer 19a over an outer portion of the dam pattern portion 17, and the first encapsulation layer 19a in the non-emission pattern portion 16. The third encapsulation layer 19c may prevent the damage of the second encapsulation layer 19b in a process of removing a trench structure (or a trench pattern portion) disposed in the isolation portion 15 to form the isolation portion 15.

The third encapsulation layer 19c according to an embodiment of the present disclosure may include a 3-1$^{th}$ encapsulation material pattern 19c1 wholly surrounding the second encapsulation layer 19b, and a 3-1$^{th}$ encapsulation material pattern 19c2 wholly surrounding the first encapsulation layer 19a over the non-emission pattern portion 16.

The 3-1$^{th}$ encapsulation material pattern 19c1 may be disposed over the second encapsulation layer 19b to seal (or encapsulate) an interface between the encapsulation layer 19b and the first encapsulation layer 19a, thereby sealing the second encapsulation layer 19b together with the first encapsulation layer 19a.

The 3-1$^{th}$ encapsulation material pattern 19c1 may additionally surround the first encapsulation layer 19a over an outer portion of the dam pattern portion 17. An end 19c1e of the 3-1$^{th}$ encapsulation material pattern 19c1 may seal (or encapsulate) an interface (or a contact surface) between the passivation layer 11c and an end 19a3e of the first encapsulation layer 19a disposed over the dam pattern portion 17, thereby preventing or minimizing the lateral penetration of water. For example, the end 19c1e of the 3-1$^{th}$ encapsulation material pattern 19c1 may directly contact the surface of the passivation layer 11c disposed near an end 19a3e of a 1-3$^{th}$ encapsulation layer 19a3, and thus, may seal (or encapsulate) an interface (or an interface) between the passivation layer 11c and the end 19a3e of the 1-3$^{th}$ encapsulation layer 19a3.

The end 19c1e of the 3-1$^{th}$ encapsulation material pattern 19c1 may be implemented in a vertical surface form which is parallel to a thickness direction Z of the substrate 10, without a tail portion. For example, the end 19c1e of the 3-1$^{th}$ encapsulation material pattern 19c1 may include a vertical sidewall which is vertical to the surface (or a top surface) of the passivation layer 11c. A shortest distance Db between the vertical sidewall of the 3-1$^{th}$ encapsulation material pattern 19c1 and the dam pattern portion 17 may be 1 μm or more.

The 3-2$^{th}$ encapsulation material pattern 19c2 may seal (or encapsulate) an interface between the passivation layer 11c and the first encapsulation layer 19a disposed over the non-emission pattern portion 16, and thus, may seal the non-emission pattern portion 16 together with the passivation layer 11c.

According to an embodiment of the present disclosure, the 3-2$^{th}$ encapsulation material pattern 19c2 may have a width which is wider than a width W4 of the 1-2$^{th}$ encapsulation material pattern 19a2 disposed over the non-emission pattern portion 16. Therefore, an end (or a tail portion) 19c2e of the 3-2$^{th}$ encapsulation material pattern 19c2 may directly contact the surface of the passivation layer 11c at a position near an end (or a tail portion) 19a2e of the 1-2$^{th}$ encapsulation material pattern 19a2. Accordingly, the end (or the tail portion) 19c2e of the 3-2$^{th}$ encapsulation material pattern 19c2 may seal (or encapsulate) an interface (or a contact surface) between the passivation layer 11c and the end (or the tail portion) 19a2e of the 1-2$^{th}$ encapsulation material pattern 19a2, thereby preventing or minimizing the lateral penetration of water.

The end 19c2e of the 3-2$^{th}$ encapsulation material pattern 19c2 may be implemented in a vertical surface form which is parallel to the thickness direction Z of the substrate 10, without a tail portion. For example, the end 19c2e of the 3-2$^{th}$ encapsulation material pattern 19c2 may include a vertical sidewall which is vertical to the surface (or the top surface) of the passivation layer 11c. A shortest distance Db between the vertical sidewall of the 3-2$^{th}$ encapsulation material pattern 19c2 and the non-emission pattern portion 16 may be 1 μm or more.

The fourth encapsulation layer 19d may be disposed on the third encapsulation layer 19c and the isolation portion 15 and may be implemented to wholly surround each of the third encapsulation layer 19c and the isolation portion 15.

The fourth encapsulation layer 19d according to an embodiment of the present disclosure may be deposited over the substrate 10 including the third encapsulation layer 19c and the isolation portion 15, and thus, may be implemented in a single-layer structure over a portion, other than an outermost periphery portion including the pad portion PP, of the substrate 10 without being isolated (or disconnected). The fourth encapsulation layer 19d may be disposed on the third encapsulation layer 19c to directly contact the surface of the passivation layer 11c at each of an outer portion of the isolation portion 15 and an outer portion of the non-emission pattern portion 16, and thus, may wholly seal (or encapsulate) each of the third encapsulation layer 19c and the non-emission pattern portion 16, thereby primarily preventing or minimizing the lateral penetration of water. For example, the fourth encapsulation layer 19d may be disposed on the 3-2$^{th}$ encapsulation material pattern 19c2 over the non-emission pattern portion 16, the 3-1$^{th}$ encapsulation material pattern 19c1, the isolation portion 15 to directly contact the surface of the passivation layer 11c at each of the outer portion of the isolation portion 15 and the outer portion of the non-emission pattern portion 16, and thus, may seal (or encapsulate) an interface (or a contact surface) between the passivation layer 11c and each of the end 19c1e of the 3-1$^{th}$ encapsulation material pattern 19c1 and the end 19c2e of the 3-2$^{th}$ encapsulation material pattern 19c2.

According to an embodiment of the present disclosure, the third encapsulation layer 19c and the fourth encapsulation layer 19d may include the same inorganic material. In this case, the encapsulation layer 19 disposed over the non-emission pattern portion 16 and the encapsulation layer 19 disposed over the isolation portion 15 may have different thicknesses T1 and T2. For example, the encapsulation layer 19 disposed over the non-emission pattern portion 16 may have a first thickness T1 by a stack structure of the third encapsulation layer 19c and the fourth encapsulation layer 19d. Also, the encapsulation layer 19 disposed over the isolation portion 15 may have a second thickness T2 which is thinner than the first thickness T1, by a single-layer structure of the fourth encapsulation layer 19d. For example, the encapsulation layer 19 may have the first thickness T1 over the non-emission patterns 16a to 16c and may have the second thickness T2 which is thinner than the first thickness T1, between the non-emission patterns 16a to 16c. Accordingly, in order to effectively prevent the lateral penetration of water, the fourth encapsulation layer 19d may be formed to have a thickness T2 which is relatively thicker than a thickness "T1-T2" of the third encapsulation layer 19c.

The first light emitting material pattern ELa disposed in each of the non-emission patterns 16a to 16c of the non-emission pattern portion 16 may be sealed (or encapsulated) in a triple structure based on each of the first common electrode material pattern CEa, the first encapsulation layer 19a, and the fourth encapsulation layer 19d, which directly contact the surface of the passivation layer 11c, or may be sealed (or encapsulated) in a quadruple structure based on the first common electrode material pattern CEa, the first encapsulation layer 19a, the third encapsulation layer 19c, and the fourth encapsulation layer 19d, thereby completely blocking or preventing the lateral penetration of water into the first light emitting material pattern ELa.

As described above, the light emitting display apparatus according to an embodiment of the present disclosure may include the non-emission pattern portion 16, which is disposed at the periphery portion of the substrate 10 so as to be spatially isolated from the light emitting layer EL disposed on the passivation layer 11c and includes a light emitting material of the light emitting layer EL, and the encapsulation layer 19 which wholly surrounds the non-emission pattern portion 16 and seals an interface between the non-emission pattern portion 16 and the passivation layer 11c, and thus, the lateral penetration of water in a lateral direction of the substrate 10 may be prevented, thereby preventing reliability from being reduced by the lateral penetration of water.

FIGS. 8A to 8G are diagrams illustrating a method of manufacturing a light emitting display apparatus according to an embodiment of the present disclosure and illustrate a forming process performed up to an encapsulation layer over a substrate.

A manufacturing method performed up to an encapsulation layer in a light emitting display apparatus according to an embodiment of the present disclosure will be described below with reference to FIGS. 8A to 8G.

Figure 8A:
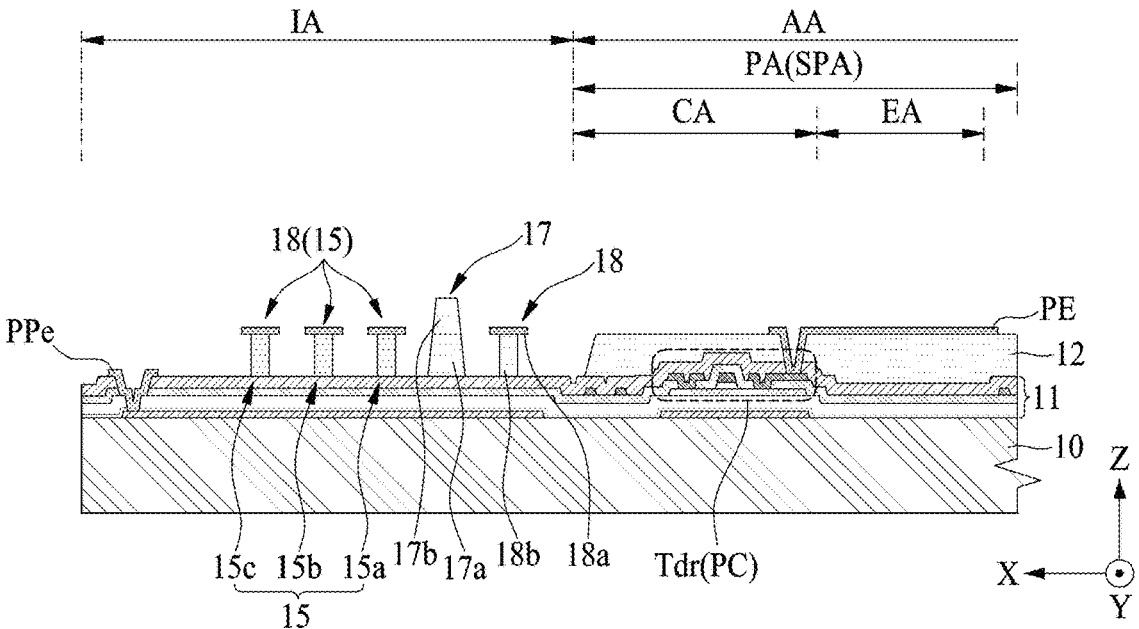
FIGS. 8A to 8G are diagrams illustrating a method of manufacturing a light emitting display apparatus according to an embodiment of the present disclosure.

As seen in FIG. 8A, a circuit layer 11 including a pixel circuit PC including a driving TFT Tdr may be formed over a substrate 10.

Subsequently, a planarization layer 12 may be formed over the circuit layer 11.

Subsequently, the planarization layer 12 may be selectively removed through a selective patterning process performed on the planarization layer 12, and thus, an electrode contact hole exposing a first source/drain electrode of the driving TFT Tdr may be formed in each subpixel area SPA, first and third dam patterns 17a and 17c may be formed in a dam pattern portion 17 of the substrate 10, and a first trench structure 18a may be formed in a trench pattern portion 18 of the substrate 10. At this time, the first trench structure 18a may be additionally formed over the isolation portion 15 of the substrate 10.

Subsequently, a pixel electrode material may be formed over the planarization layer 12.

Subsequently, by selectively removing the pixel electrode material through an electrode patterning process, a pixel electrode PE connected to the first source/drain electrode of the driving TFT Tdr through the electrode contact hole, a second trench structure 18b formed of the pixel electrode material over the first trench structure 18a of each of the trench pattern portion 18 and the isolation portion 15, and a pad electrode PPe over a pad portion may be formed in each subpixel area SPA.

Figure 8B:
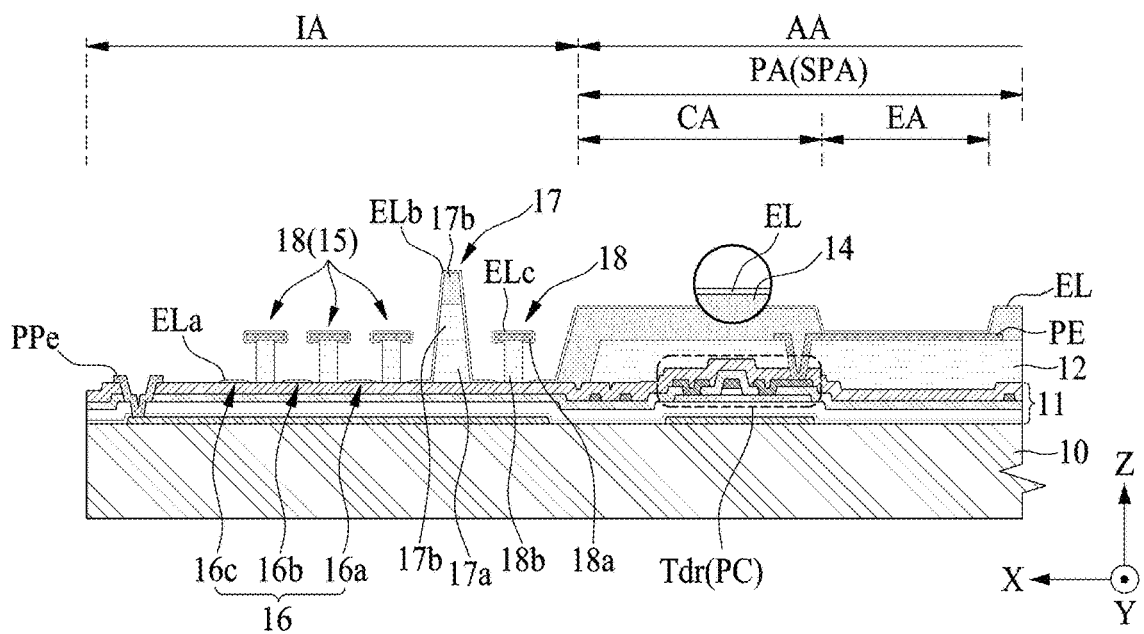

Subsequently, as seen in FIG. 8B, a bank material may be formed over the substrate 10, and by selectively removing the bank material through a selective patterning process performed over the bank material, a bank 14 covering a periphery portion of the pixel electrode PE may be formed over the planarization layer 12 of a display portion AA and a second dam pattern 17b including the bank material may be formed over a third dam pattern 17c of the dam pattern portion 17.

Subsequently, by depositing a light emitting material over the substrate 10, a light emitting layer EL may be formed over the bank 14 and the pixel electrode PE of the display portion AA, and first to third light emitting material patterns ELa, ELb, and ELc electrically or spatially isolated from the light emitting layer EL of the display portion AA may be formed.

A portion of the light emitting material deposited over the isolation portion 15 may pass through a region of the second trench structure 18b disposed in the isolation portion 15 and may be directly deposited over a surface of the passivation layer 11c, thereby forming the first light emitting material pattern ELa of the non-emission pattern portion 16. Also, the other portion of the light emitting material deposited over the isolation portion 15 may be deposited over the second trench structure 18b disposed in the isolation portion 15. The first light emitting material pattern ELa may be electrically or spatially isolated from the light emitting material deposited over the second trench structure 18b based on an eaves structure between the first trench structure 18a and the second trench structure 18b disposed over the isolation portion 15. For example, an end (or a tail portion) of the first light emitting material pattern ELa may be spaced apart from the first trench structure 18a by a shadow region based on a protrusion portion of the second trench structure 18b protruding from a lateral surface of the first trench structure 18a.

The light emitting material deposited over the dam pattern portion 17 may surround the dam pattern portion 17 and may be directly deposited over a surface of the passivation layer 11c near the dam pattern portion 17, thereby forming the second light emitting material pattern ELb. The second light emitting material pattern ELb may be electrically or spatially isolated from the first light emitting material pattern ELa disposed in the non-emission pattern portion 16 based on the eaves structure between the first trench structure 18a and the second trench structure 18b disposed over the isolation portion 15. For example, an end (or a tail portion) of the second light emitting material pattern ELb may be spaced apart from the first trench structure 18a due to a shadow region based on a protrusion portion of the second trench structure 18b protruding from the lateral surface of the first trench structure 18a.

The light emitting material deposited over the trench pattern portion 18 may be deposited over the second trench structure 18b to form the third light emitting material pattern ELc. The third light emitting material pattern ELc may be electrically or spatially isolated from each of an end of the light emitting layer EL and the second light emitting material pattern ELb disposed in the dam pattern portion 17 based on the eaves structure between the first trench structure 18a and the second trench structure 18b of the trench pattern portion 18.

Figure 8C:
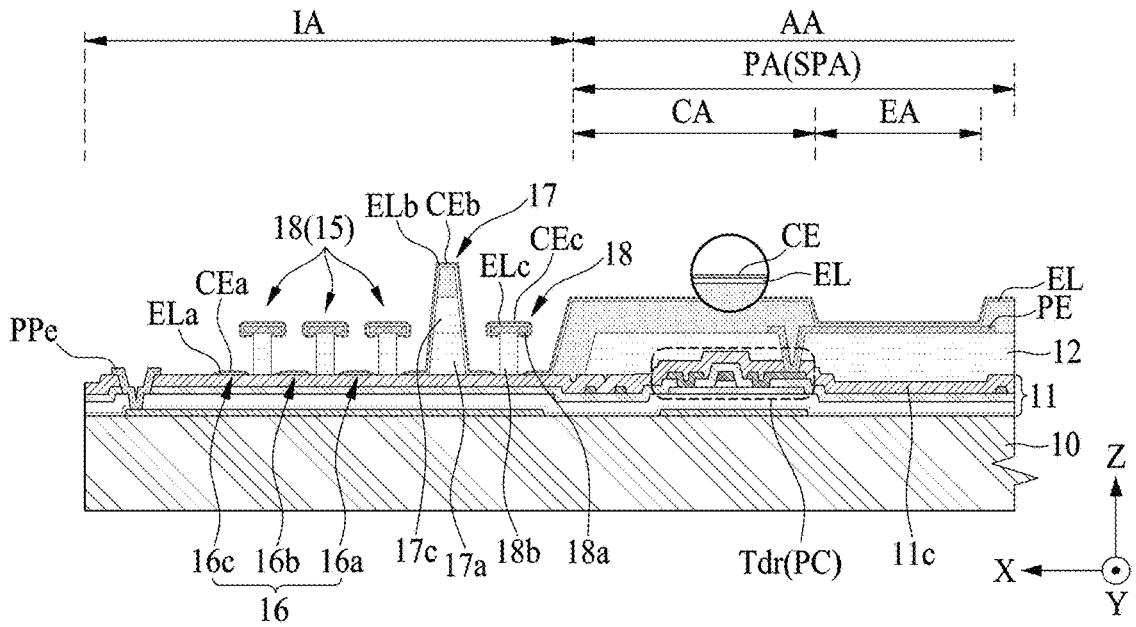

Subsequently, as seen in FIG. 8C, by depositing a common electrode material over the substrate 10, the common electrode CE may be formed over the light emitting layer EL of the display portion AA and may form first to third common electrode material patterns CEa, CEb, and CEc which are electrically or spatially isolated from the common electrode CE of the display portion AA.

A common electrode material deposited over the display portion AA may be directly deposited over the light emitting layer EL and the surface of the passivation layer 11c near the light emitting layer EL to form a common electrode CE. The common electrode CE may have a width which is wider than the light emitting layer EL disposed in the display portion AA, and thus, an end (or a tail portion) of the common electrode CE may seal an interface between an end of the light emitting layer EL and the passivation layer 11c. For example, the end (or the tail portion) of the common electrode CE may be spaced apart from the first trench structure 18a due to a shadow region based on the protrusion portion of the second trench structure 18b protruding from the lateral surface of the first trench structure 18a.

A portion of the common electrode material deposited over the isolation portion 15 may pass through a region of the second trench structure 18b disposed in the isolation portion 15 and may be directly deposited over the first light emitting material pattern ELa and a surface of the passivation layer 11c near the first light emitting material pattern ELa, thereby forming the first common electrode material pattern CEa of the non-emission pattern portion 16. Also, the other portion of the common electrode material deposited over the isolation portion 15 may be deposited over the second trench structure 18b disposed in the isolation portion 15. The first common electrode material pattern CEa may be electrically or spatially isolated from the common electrode material deposited over the second trench structure 18b based on the eaves structure between the first trench structure 18a and the second trench structure 18b disposed over the isolation portion 15. The first common electrode material pattern CEa may have a width which is wider than the first light emitting material pattern ELa disposed in the non-emission pattern portion 16, and thus, an end (or a tail portion) of the first common electrode material pattern CEa may seal an interface between an end of the first light emitting material pattern ELa and the passivation layer 11c. For example, an end (or a tail portion) of the first common electrode material pattern CEa may be spaced apart from the first trench structure 18a by a shadow region based on a protrusion portion of the second trench structure 18b protruding from the lateral surface of the first trench structure 18a.

A common electrode material deposited on the dam pattern portion 17 may be directly deposited over the second light emitting material pattern ELb and the surface of the passivation layer 11c near the second light emitting material pattern ELb to form a second common electrode material pattern CEb. The second common electrode material pattern CEb may be electrically or spatially isolated from the first common electrode material pattern CEa deposited in the non-emission pattern portion 16 based on the eaves structure between the first trench structure 18a and the second trench structure 18b disposed over the isolation portion 15. The second common electrode material pattern CEb may have a width which is wider than the second light emitting material pattern ELb disposed in the dam pattern portion 17, and thus, an end (or a tail portion) of the second common electrode material pattern CEb may seal an interface between an end of the second light emitting material pattern ELb and the passivation layer 11c. For example, the end (or the tail portion) of the second common electrode material pattern CEb may be spaced apart from the first trench structure 18a due to a shadow region based on the protrusion portion of the second trench structure 18b protruding from the lateral surface of the first trench structure 18a.

A common electrode material deposited over the trench pattern portion 18 may be deposited over the second light emitting material pattern ELb to form a third common electrode material pattern CEc. The third common electrode material pattern CEc may be electrically or spatially isolated from the second common electrode material pattern CEb deposited at an end of the common electrode CE and the dam pattern portion 17 based on the eaves structure between the first trench structure 18a and the second trench structure 18b of the trench pattern portion 18.

Figure 8D:
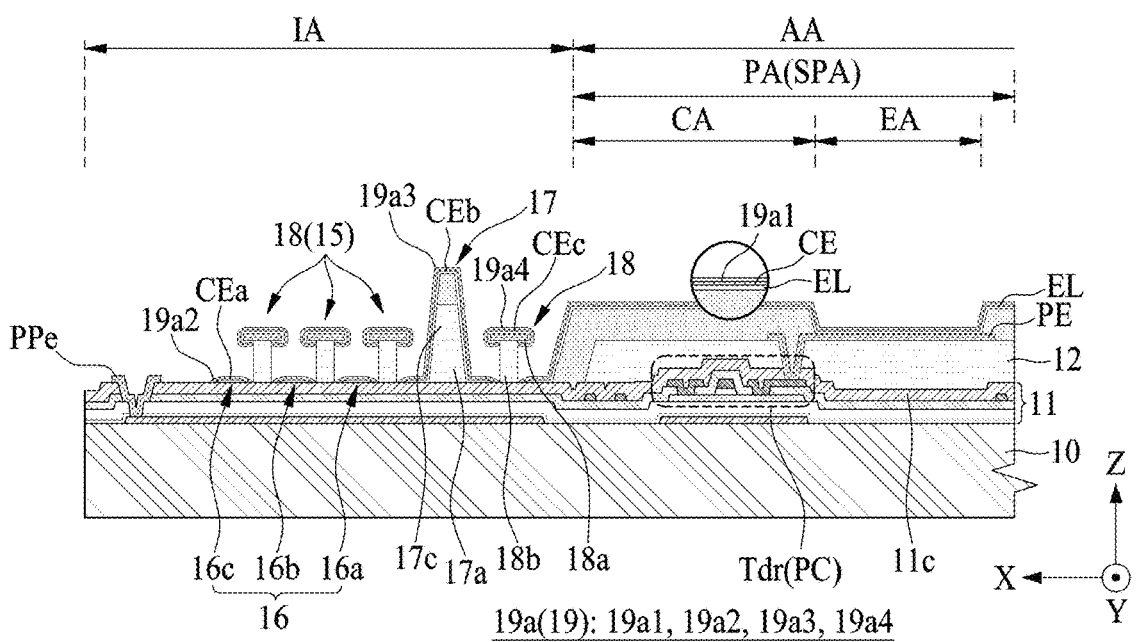

Subsequently, as seen in FIG. 8D, by depositing a first inorganic material over the substrate 10, a first encapsulation layer (or a first inorganic encapsulation layer) 19a including $1\text{-}1^{th}$ to $1\text{-}4^{th}$ encapsulation material patterns 19a1 to 19a4 apart from one another may be formed over the substrate 10.

The first inorganic material deposited over the display portion AA may be deposited over the common electrode CE of the display portion AA to form the $1\text{-}1^{th}$ encapsulation material pattern 19a1. The $1\text{-}1^{th}$ encapsulation material pattern 19a1 may have a width which is wider than common electrode CE disposed in the display portion AA, and thus, an end (or a tail portion) of the $1\text{-}1^{th}$ encapsulation material pattern 19a1 may seal an interface between an end of the common electrode CE and the passivation layer 11c. For example, the end (or the tail portion) of the $1\text{-}1^{th}$ encapsulation material pattern 19a1 may be spaced apart from the first trench structure 18a due to a shadow region based on the protrusion portion of the second trench structure 18b protruding from the lateral surface of the first trench structure 18a.

A portion of the first inorganic material deposited over the isolation portion 15 may pass through a region of the second trench structure 18b disposed in the isolation portion 15 and may be directly deposited over the first common electrode material pattern CEa and a surface of the passivation layer 11c near the first common electrode material pattern CEa, thereby forming the $1\text{-}2^{th}$ encapsulation material pattern 19a2 of the non-emission pattern portion 16. Also, the other portion of the first inorganic material deposited over the isolation portion 15 may be deposited on the common electrode material over the second trench structure 18b disposed in the isolation portion 15. The 1-2$^{th}$ encapsulation material pattern 19a2 may be isolated (or disconnected) from the first inorganic material deposited over the second trench structure 18b based on the eaves structure between the first trench structure 18a and the second trench structure 18b disposed over the isolation portion 15. The 1-2$^{th}$ encapsulation material pattern 19a2 may have a width which is wider than the first common electrode material pattern CEa disposed in the non-emission pattern portion 16, and thus, an end (or a tail portion) of the 1-2$^{th}$ encapsulation material pattern 19a2 may seal an interface between an end of the first common electrode material pattern CEa and the passivation layer 11c. For example, an end (or a tail portion) of the 1-2$^{th}$ encapsulation material pattern 19a2 may be spaced apart from the first trench structure 18a by a shadow region based on a protrusion portion of the second trench structure 18b protruding from the lateral surface of the first trench structure 18a.

The first inorganic material deposited over the dam pattern portion 17 may be directly deposited on the second common electrode material pattern CEb over the dam pattern portion 17 and the surface of the passivation layer 11c near the second common electrode material pattern CEb to form a 1-3$^{th}$ encapsulation material pattern 19a3. The 1-3$^{th}$ encapsulation material pattern 19a3 may be isolated (or disconnected) from the 1-2$^{th}$ encapsulation material pattern 19a2 disposed in the non-emission pattern portion 16 based on the eaves structure between the first trench structure 18a and the second trench structure 18b disposed on the isolation portion 15. The 1-3$^{th}$ encapsulation material pattern 19a3 may have a width which is wider than the second common electrode material pattern CEb disposed in the dam pattern portion 17, and thus, an end (or a tail portion) of the 1-3$^{th}$ encapsulation material pattern 19a3 may seal an interface between an end of the second common electrode material pattern CEb and the passivation layer 11c. For example, the end (or the tail portion) of the 1-3$^{th}$ encapsulation material pattern 19a3 may be spaced apart from the first trench structure 18a due to a shadow region based on the protrusion portion of the second trench structure 18b protruding from the lateral surface of the first trench structure 18a.

The first inorganic material deposited over the trench pattern portion 18 may be directly deposited on the second trench structure pattern 18b to form a 1-4$^{th}$ encapsulation material pattern 19a4. The 1-4$^{th}$ encapsulation material pattern 19a4 may be isolated (or disconnected) from each of the 1-1$^{th}$ encapsulation material pattern 19a1 and the 1-3$^{th}$ encapsulation material pattern 19a3 disposed in the dam pattern portion 17 based on the eaves structure between the first trench structure 18a and the second trench structure 18b of the trench pattern portion 18.

Figure 8E:
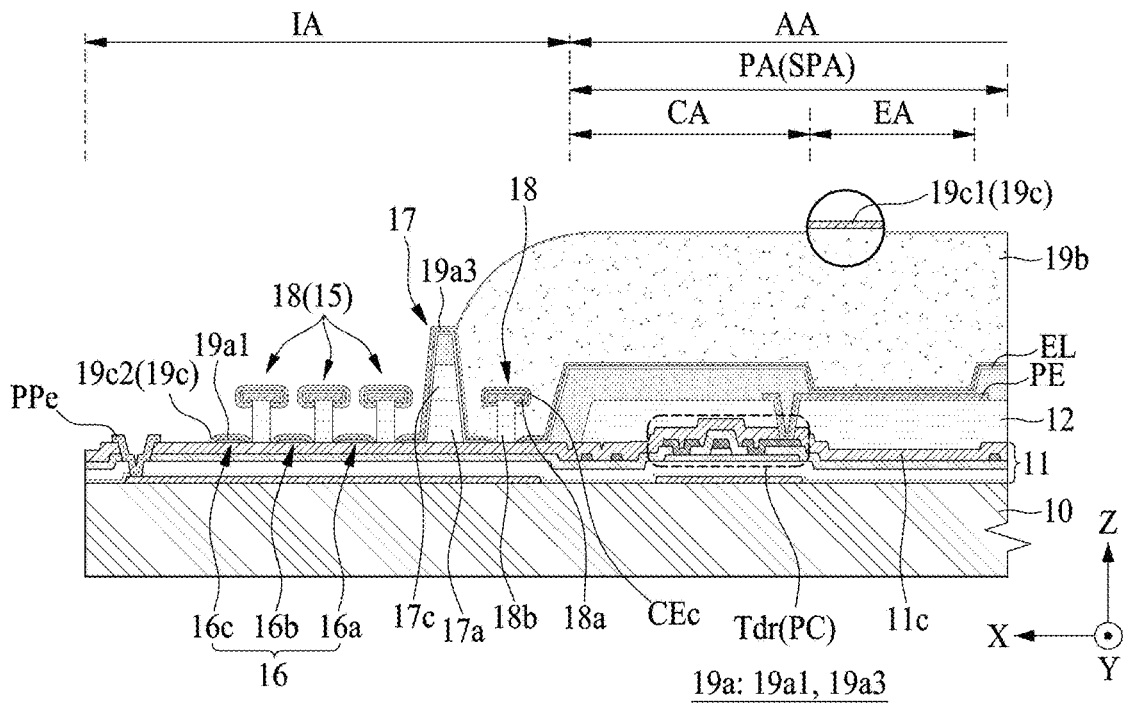

Subsequently, as seen in FIG. 8E, an organic material may be formed in the display portion AA, a second encapsulation layer 19b may be formed over a first encapsulation layer 19a in a region defined by the dam pattern portion 17. An organic material may completely cover the trench pattern portion 18. The spread of the organic material may be prevented by the dam pattern portion 17.

Subsequently, a third encapsulation layer (or a second inorganic encapsulation layer) 19c including 3-1$^{th}$ and 3-2$^{th}$ encapsulation material patterns 19c1 and 19c2 isolated from each other over the substrate 10 may be formed by depositing a second inorganic material on the substrate 10.

The second inorganic material deposited over the display portion AA and the dam pattern portion 17 may be deposited over an outer portion of each of the second encapsulation layer 19b and the dam pattern portion 17 of the display portion AA to form the 3-1$^{th}$ encapsulation material pattern 19c1. The 3-1$^{th}$ encapsulation material pattern 19c1 and the 1-1$^{th}$ encapsulation material pattern 19a1 may have a width which is wider than the common electrode CE disposed in the display portion AA, and thus, the end (or the tail portion) of the 1-1$^{th}$ encapsulation material pattern 19a1 may seal an interface between the end of the common electrode CE and the passivation layer 11c. For example, the end (or the tail portion) of the 1-1$^{th}$ encapsulation material pattern 19a1 may directly contact the lateral surface of the first trench structure 18a of the trench pattern portion 18. Accordingly, the end (or the tail portion) of the 1-1$^{th}$ encapsulation material pattern 19a1 may have a vertical surface form which is parallel to the thickness direction of the substrate 10.

A portion of the second inorganic material deposited over the isolation portion 15 may pass through a region of the second trench structure 18b disposed in the isolation portion 15 and may be directly deposited over the first encapsulation material pattern 19a1 and a surface of the passivation layer 11c near the first encapsulation material pattern 19a1, thereby forming the 3-2$^{th}$ encapsulation material pattern 19c2 of the non-emission pattern portion 16. Also, the other portion of the second inorganic material deposited over the isolation portion 15 may be deposited on the first inorganic material over the second trench structure 18b disposed in the isolation portion 15. The 3-2$^{th}$ encapsulation material pattern 19c2 may be isolated (or disconnected) from the second inorganic material deposited over the second trench structure 18b based on the eaves structure between the first trench structure 18a and the second trench structure 18b disposed over the isolation portion 15. The 3-2$^{th}$ encapsulation material pattern 19c2 may have a width which is wider than the first encapsulation material pattern 19a1 disposed in the non-emission pattern portion 16, and thus, an end (or a tail portion) of the 2-2$^{th}$ encapsulation material pattern 19c2 may seal an interface between an end of the first encapsulation material pattern 19a1 and the passivation layer 11c. For example, an end (or a tail portion) of the 3-2$^{th}$ encapsulation material pattern 19c2 may directly contact the lateral surface of the first trench structure 18a disposed in the isolation portion 15. Accordingly, the end (or the tail portion) of the 3-2$^{th}$ encapsulation material pattern 19c2 may have a vertical surface form which is parallel to the thickness direction of the substrate 10.

Figure 8F:
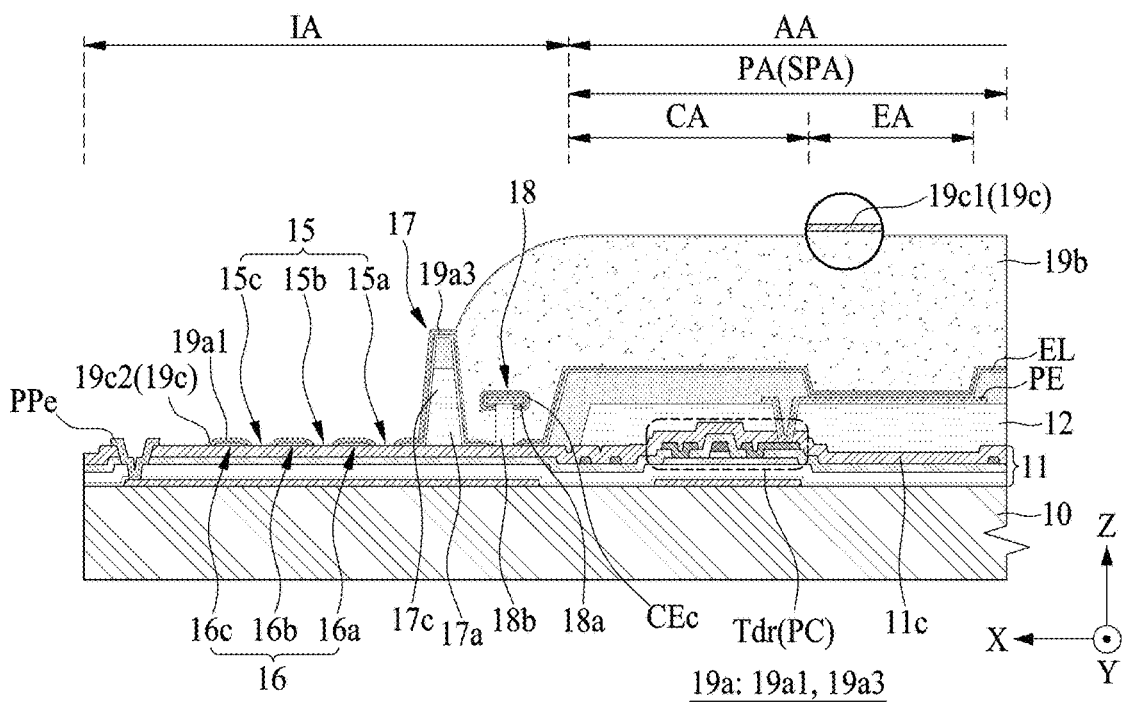

Subsequently, as seen in FIG. 8F, the isolation portion 15 may be formed over the substrate 10 by removing a trench structure including the first trench structure 18a and the second trench structure 18b disposed in the isolation portion 15 of the substrate 10 through a patterning process. For example, the trench structure disposed in the isolation portion 15 may be removed by a dry etching process using an oxygen gas.

Figure 8G:
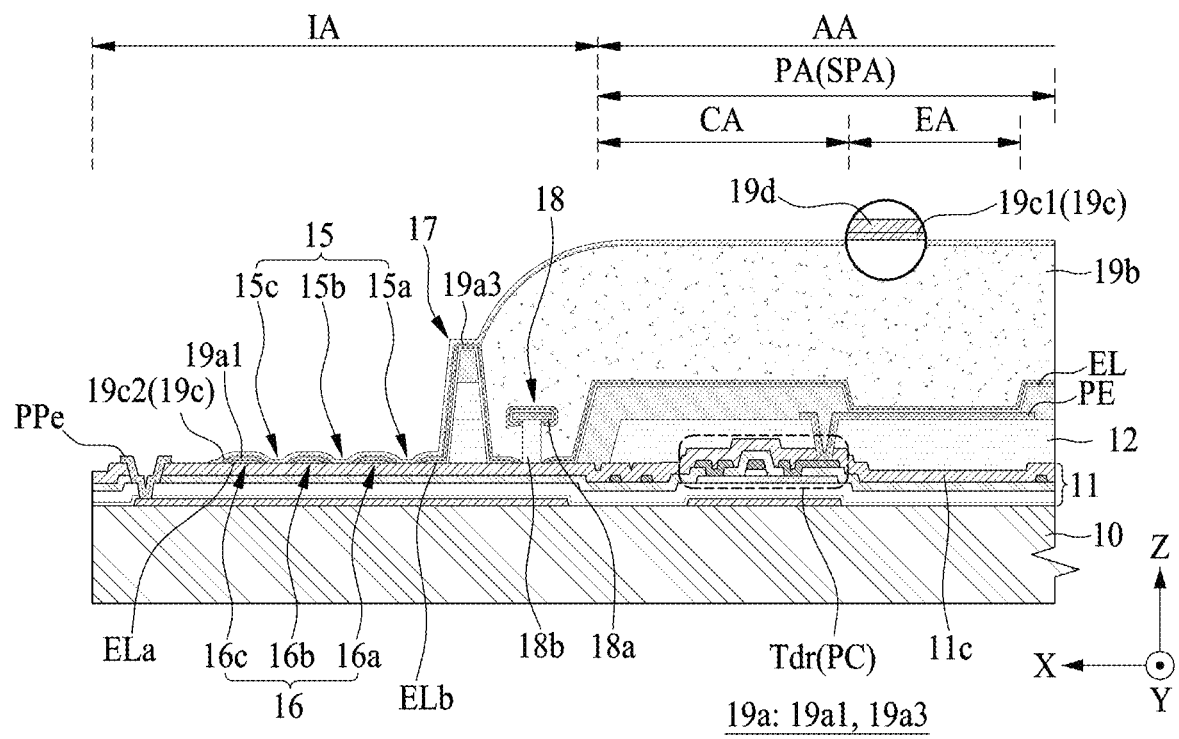

Subsequently, as seen in FIG. 8G, by depositing a third inorganic material over the substrate 10, the fourth encapsulation layer 19d may be formed on the third encapsulation layer 19c and the isolation portion 15.

The fourth encapsulation layer 19d may directly contact the 3-1$^{th}$ encapsulation material pattern 19c1 over the display portion AA and the dam pattern portion 17, the 3-2$^{th}$ encapsulation material pattern 19c2 over the non-emission pattern portion 16, and the passivation layer 11c of the isolation portion 16. Therefore, the fourth encapsulation layer 19d may wholly surround the 3-1$^{th}$ encapsulation material pattern 19c1 and may seal an interface between the end of the 3-1$^{th}$ encapsulation material pattern 19c1 and the passivation layer 11c. Also, the fourth encapsulation layer 19d may wholly surround the 3-2$^{th}$ encapsulation material pattern 19c2 and may seal an interface between the end of the 3-2$^{th}$ encapsulation material pattern 19c2 and the passivation layer 11c. Therefore, each of the first light emitting material pattern ELa of the non-emission pattern portion 16 and the second light emitting material pattern ELb of the dam pattern portion 17 electrically or spatially isolated from the light emitting layer EL of the display portion AA may be additionally sealed by the fourth encapsulation layer 19d and the passivation layer 11c, and thus, the lateral penetration of water may be completely blocked.

Subsequently, as illustrated in FIG. 3, the wavelength conversion layer 21 may be formed over the fourth encapsulation layer 19d of the encapsulation layer 19, and the functional film 23 may be attached over the wavelength conversion layer 21. Subsequently, flexible circuit films 31 may be attached over the pad portion. Subsequently, the side sealing member 25 may be formed between the functional film 23 and the substrate 10, and thus, may cover all of lateral surfaces of each of the wavelength conversion layer 21 and the circuit layer 11 exposed at the outside of the light emitting display apparatus.

As described above, like the light emitting display apparatus illustrated in FIGS. 1 to 8G, the light emitting display apparatus according to another embodiment of the present disclosure may prevent or minimize a reduction in reliability of the light emitting layer caused by the side transmission of water or moisture, whereby the non-emission pattern portion 15 and the isolation portion 16 may be disposed in the inner region of the outermost pixel Po due to the decrease of the first margin area MA1 and the second margin area MA2 according to the increase in reliability of the light emitting layer, and thus, the light emitting display apparatus may have an air-bezel structure or a non-bezel structure where the display portion AA is surrounded by air instead of an opaque non-display portion.

Figure 9:
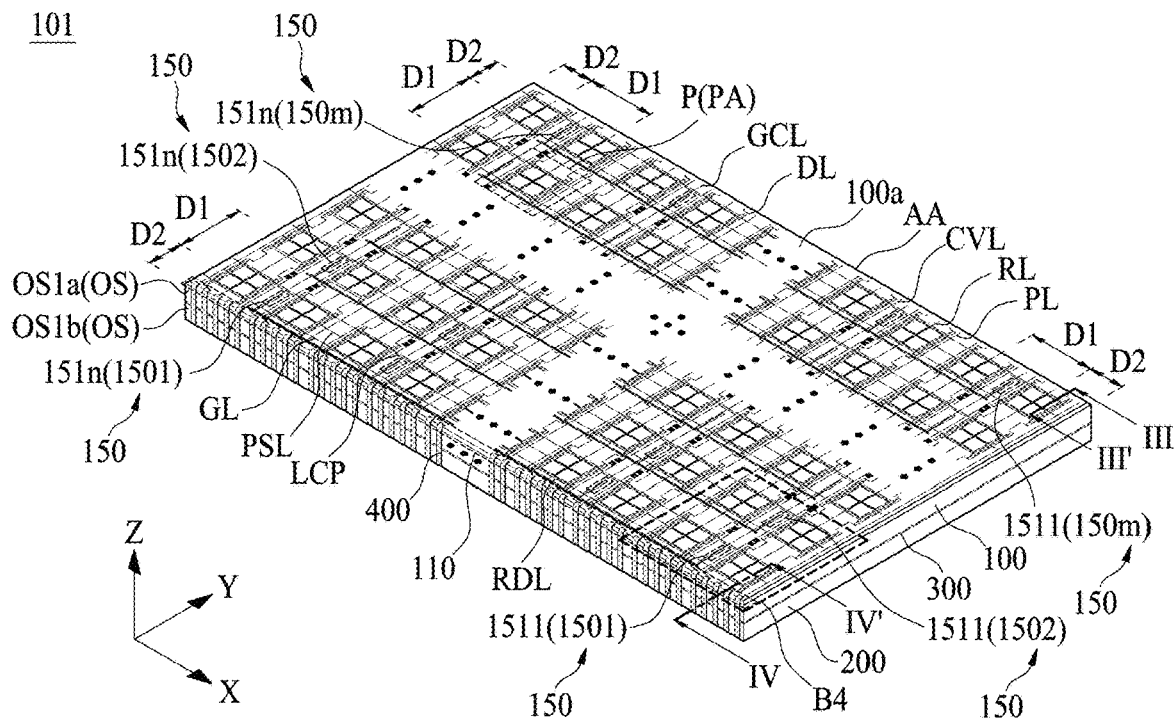
FIG. 9 is a front perspective view illustrating a light emitting display apparatus according to another embodiment of the present disclosure.
Figure 10:
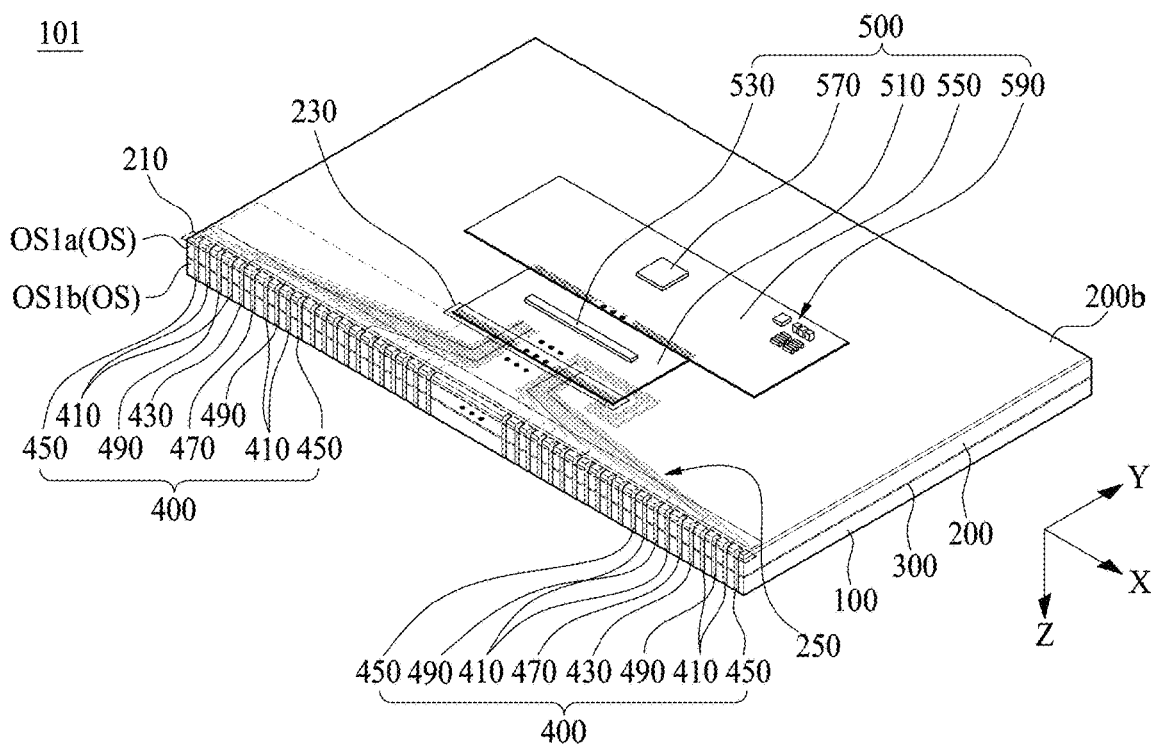
FIG. 10 is a rear perspective view illustrating a light emitting display apparatus illustrated in FIG. 9.

FIG. 9 is a front perspective view illustrating a light emitting display apparatus according to another embodiment of the present disclosure, and FIG. 10 is a rear perspective view illustrating a light emitting display apparatus illustrated in FIG. 9.

Referring to FIGS. 9 and 10, the light emitting display apparatus (or light emitting display panel) 101 according to another embodiment of the present disclosure may include a first substrate 100, a second substrate 200, a coupling member 300, and a routing portion 400.

The first substrate 100 may be referred to as a display substrate, a pixel array substrate, an upper substrate, a front substrate, a base substrate, or the like. The first substrate 100 may be a glass substrate, or may be a thin glass substrate or a plastic substrate, which is bendable or flexible.

The first substrate 100 according to an embodiment may include a plurality of pixel driving lines and a plurality of pixels P.

The pixel driving lines may be provided over a first surface 100a of the first substrate 100 and may transfer a signal needed for driving (light emitting) of each of the plurality of pixels P. For example, the pixel driving line may include a plurality of data lines DL, a plurality of gate lines GL, a plurality of pixel driving power lines (or a first power line) PL, a plurality of pixel common voltage lines (or a second power line) CVL, and a plurality of pixel reference voltage lines (or a sensing line) RL.

According to an embodiment, each of the plurality of data lines DL, the plurality of gate lines GL, the plurality of pixel driving power lines PL, the plurality of pixel common voltage lines CVL, and the plurality of pixel reference voltage lines RL may be directly coupled to each of the pads of the first pad portion 110 disposed at a first periphery portion of the first surface 100a of the first substrate 100 or may be coupled to through a pad connection line (or a pad link line).

The first pad portion 110 may be included within a plurality of outermost pixels Po disposed at the first periphery portion of the first substrate 100 parallel to a first direction X. Here, the first periphery portion of the first surface 100a of the first substrate 100 may include a first outer surface (or one lateral surface) OS1a of an outer surface OS of the first substrate 100.

The first pad portion 110 may include a plurality of first pads which are disposed in parallel with one another in the first direction X on a passivation layer 11c exposed at the first periphery portion of the first surface 100a of the first substrate 100.

The plurality of pixels P may be respectively disposed in a plurality of pixel areas PA which are arranged at a first interval (or a first pitch) D1 in the first direction X and a second direction Y. Each of the plurality of pixels P may include a light emitting device (or a light emitting element), which emits light based on a top emission type based on a signal supplied through corresponding pixel driving line adjacent thereto and irradiates the light onto a portion over the first surface 100a of the first substrate 100, and a pixel circuit which is connected to pixel driving lines adjacent thereto to allow the self-light emitting device to emit light. For example, the pixel circuit may include a driving thin film transistor (TFT) which provides the light emitting device with a data current corresponding to a data signal supplied through the data line DL.

Each of the plurality of pixels P may have a first length parallel to the first direction X and a second length parallel to the second direction Y. For example, the first length may be referred to as a first width, a widthwise length, or a widthwise width. The second length may be referred to as a second width, a lengthwise length, or a lengthwise width. The first length and/or the second length of the pixel P may be referred to as a pixel pitch.

In each of the plurality of pixels P, each of the first length and the second length may be the same as the first interval D1. Thus, a distance (or a shortest length) D1 between center portions of adjacent pixels P along the first direction X and the second direction Y may be the same. Accordingly, each of the plurality of pixels P may have the same size.

A distance between an outermost pixel of the plurality of pixels P and the outer surface OS of the first substrate 100 may be half or less of the first interval D1. A second interval D2 between a center portion of the outermost pixel and the outer surface OS of the first substrate 100 may be half or less of the first interval D1, and thus, a whole front surface of the first substrate 100 (or a whole front surface of the display apparatus) may be implemented as the display portion AA. Accordingly, the light emitting display apparatus according to another embodiment of the present disclosure may have an air-bezel structure where the display portion AA is surrounded by air.

For example, when the second interval D2 is greater than half of the first interval D1, the first substrate 100 may have a greater size than the display portion AA by an area between an end of the outermost pixel (or the end of the display portion AA) and the outer surface OS of the first substrate 100, and thus, an area between the end of the outermost pixel and the outer surface OS of the first substrate 100 may be provided as a non-display portion surrounding all of the display portion AA. Therefore, the first substrate 100 may necessarily include a bezel area based on a non-display portion surrounding all of the display portion AA. On the other hand, when the second interval D2 is half or less of the first interval D1, the end of the outermost pixel (or the end AAa of the display portion AA) may overlap the outer surface OS of the first substrate 100 or may be disposed in a space outside the outer surface OS of the first substrate 100, and thus, the display portion AA may be implemented (or disposed) at the whole front surface of the first substrate 100.

The first substrate 100 according to an embodiment may further include a gate driving circuit 150 which is disposed in the display portion AA.

The gate driving circuit 150 according to an embodiment may be implemented with a shift register including a plurality of stage circuit portions 1501 to 150m (where m is an integer of 2 or more). That is, the light emitting display apparatus according to another embodiment of the present disclosure may include a shift register which is disposed in the display portion AA of the first substrate 100 to supply the scan signal to the pixels P.

Each of the plurality of stage circuit portions 1501 to 150m may include a plurality of branch circuits 1511 to 151n (where n is an integer of 2 or more) which are disposed apart from one another in each horizontal line of the first substrate 100 in the first direction X. The plurality of branch circuits 1511 to 151n may include at least one TFT (or a branch TFT) and may be disposed between two adjacent pixels P (or pixel areas PA) within one horizontal line along the first direction X. For example, the branch circuits 1511 to 151n may be disposed one by one between two adjacent pixels P (or pixel areas PA) within one horizontal line along the first direction X. Each of the plurality of stage circuit portions 1501 to 150m may generate the scan signal in a predetermined order in response to a gate control signal supplied through the first pad portion 110 and may supply the scan signal to the gate line GL. For example, the gate control signal may include a start signal, a plurality of shift clocks, at least one gate driving voltage, and at least one gate common voltage.

The first substrate 100 may further include a plurality of gate control line groups GCL which are coupled to the gate driving circuit 150. Each of the gate control line groups GCL may be selectively coupled to the plurality of branch circuits 1511 to 151n respectively disposed in the plurality of stage circuit portions 1501 to 150m.

The gate control line group GCL according to an embodiment may include a start signal line, a plurality of shift clock lines, at least one gate driving voltage line, and at least one gate common voltage line. The plurality of shift clock lines according to an embodiment may be divided (or classified) into a plurality of scan clock lines and a plurality of carry clock lines. Here, the plurality of carry clock lines may be omitted.

The first pad portion 110 may further include a first gate pad portion including a plurality of first gate pads coupled to the gate control line group GCL.

The second substrate 200 may be referred to as a wiring substrate, a link substrate, a lower substrate, a rear substrate, or link glass. The second substrate 200 may be a glass substrate, or may be a thin glass substrate or a plastic substrate, which is bendable or flexible. The second substrate 200 may include the same material as the first substrate 100. For example, the size of the second substrate 200 and the size of the first substrate 100 may be the same or substantially the same.

The second substrate 200 may be coupled (or connected) to a second surface of the first substrate 100 by using the coupling member 300. The second substrate 200 may include a front surface which faces the second surface of the first substrate 100 or is coupled to the coupling member 300, a rear surface (or a back surface) opposite to the front surface, and an outer surface OS between the front surface and the rear surface. The second substrate 200 may transfer a signal to the pixel driving lines and may increase the stiffness of the first substrate 100.

The light emitting display apparatus according to another embodiment of the present disclosure may further include a second pad portion 210 disposed over the second substrate 200.

The second pad portion 210 may be disposed at a first periphery portion of a rear surface 200b of the second substrate 200 overlapping the first pad portion 110 disposed on the first substrate 100. The first periphery portion of the rear surface 200b of the second substrate 200 may include a first outer surface (or one surface) OS1b of the outer surface OS of the second substrate 200.

The second pad portion 210 may include a plurality of second pads which are arranged at a certain interval in the first direction X to respectively overlap the pads of the first pad portion 110.

The light emitting display apparatus according to another embodiment of the present disclosure may further include a third pad portion (or an input pad portion) 230 and a link line portion 250 which are disposed on the second substrate 200.

A third pad portion 230 may be disposed at the rear surface 200b of the second substrate 200. For example, the third pad portion 230 may be disposed at a center portion adjacent to the first periphery portion of the rear surface 200b of the second substrate 200. The third pad portion 230 according to an embodiment may include a plurality of third pads (or input pads) which are apart from one another by a certain interval.

The link line portion 250 may be disposed between the second pad portion 210 and the third pad portion 230. For example, the link line portion 250 may include a plurality of link lines which individually (or respectively) connect the second pads of the second pad portion 210 to the third pads of the third pad portion 230.

The coupling member 300 may be disposed between the first substrate 100 and the second substrate 200. The first substrate 100 and the second substrate 200 may be opposite-bonded to each other by the coupling member 300. For example, the second surface 100b of the first substrate 100 may be coupled to one surface of the coupling member 300, and the front surface 200a of the second substrate 200 may be coupled to the other surface of coupling member 300. Accordingly, the first substrate 100 and the second substrate 200 opposite-bonded (or coupled) to each other by the coupling member 300 may be referred to as a light emitting display panel 101.

The routing portion 400 may be referred to as a side routing portion or a printing line portion. The routing portion 400 may be disposed to surround the outer surface OS of the first substrate 100 and the outer surface OS of the second substrate 200. The routing portion 400 according to an embodiment may include a plurality of routing lines 410, 430, 450, 470, and 490 which are disposed at each of the first outer surface (or one surface) OS1a of the outer surface OS of the first substrate 100 and the first outer surface (or one surface) OS1b of the outer surface OS of the second substrate 200.

Each of the plurality of routing lines 410, 430, 450, 470, and 490 may be formed to surround each of the first outer surface OS1a of the first substrate 100 and the first outer surface OS1b of the second substrate 200. As an embodiment, the plurality of routing lines 410, 430, 450, 470, and 490 may be respectively (or individually) coupled between the pads of the first pad portion 110 and the pads of the second pad portion 210.

Alternatively, the second substrate 100 may be omitted, and in this case, the second pad unit 210, the third pad portion (or input pad portion) 230, and the link line unit 250 may be directly disposed at the rear surface 100b of the substrate 100. Moreover, the routing portion 400 may include a plurality of routing lines 410, 430, 450, 470, and 490 disposed to surround the outer surface (OS) of the first substrate 100.

The light emitting display apparatus 101 according to an embodiment of the present disclosure may further include a driving circuit unit 500.

The driving circuit unit 500 may drive (or emit light) the pixels P disposed on the first substrate 100 based on digital video data and a timing synchronization signal supplied from a display driving system to allow the display portion AA to display an image corresponding to image data. The driving circuit unit 500 may be connected to the third pad portion 230 disposed on the rear surface 200b of the second substrate 200 and may output, to the third pad portion 230, a data signal, a gate control signal, and a driving power for driving (or emitting light) the pixels P disposed on the first substrate 100. For example, the driving circuit unit 500 may have a size which is less than the second substrate 200, and thus, may be covered by the second substrate 200 and may not be exposed at the outer surface of the second substrate 200 or the outer surface of the first substrate 100.

The driving circuit unit 500 according to an embodiment may include a flexible circuit film 510, a driving integrated circuit (IC) 530, a printed circuit board (PCB) 550, a timing controller 570, and a power circuit part 590. The driving circuit unit 500 having such a configuration may be the same as the driving circuit part 30 illustrated in FIG. 1, and thus, their repetitive descriptions are omitted or may be brief.

The flexible circuit film 510 may be coupled to the third pad portion 230 disposed at the rear surface 200b of the second substrate 200.

The driving IC 530 may be mounted at the flexible circuit film 510. The driving IC 530 may be connected to the plurality of data lines DL, the plurality of pixel driving power lines PL, the plurality of pixel common voltage lines CVL, and a plurality of reference voltage lines RL through the flexible circuit film 510, the third pad portion 230, the link line portion 250, the second pad portion 210, the routing portion 400, and the first pad portion 110. The driving IC 530 may receive subpixel data and a data control signal provided from the timing controller 570, and convert the subpixel data into an analog data signal based on the data control signal to supply the analog data signal to a corresponding data line DL. Also, the driving IC 530 may generate a reference voltage, a pixel driving voltage, and a pixel common voltage and may supply the reference voltage, the pixel driving voltage, and the pixel common voltage to corresponding voltage line RL, power line PL, and common voltage line CVL.

The driving IC 530 may sense a characteristic value of a driving TFT disposed in the pixel P through the plurality of reference voltage lines RL disposed on the first substrate 100, generate sensing raw data corresponding to a sensing value, and provide the sensing raw data to the timing controller 570.

The PCB 550 may be coupled to the other periphery portion of the flexible circuit film 510. The PCB 550 may transfer a signal and power between elements of the driving circuit unit 500.

The timing controller 570 may be mounted at the PCB 550 and may receive the digital video data and the timing synchronization signal provided from the display driving system through a user connector disposed at the PCB 550.

The timing controller 570 may align the digital video data based on the timing synchronization signal to generate pixel data matching a pixel arrangement structure disposed in the display portion AA and may provide the generated pixel data to the driving IC 530.

The timing controller 570 may generate each of the data control signal and the gate control signal based on the timing synchronization signal, control a driving timing of the driving IC 530 based on the data control signal, and control a driving timing of the gate driving circuit 150 based on the gate control signal. For example, the timing synchronization signal may include a vertical synchronization signal, a horizontal synchronization signal, a data enable signal, and a main clock (or a dot clock).

The timing controller 570 may drive each of the driving IC 530 and the gate driving circuit 150 based on an external sensing mode during a predetermined external sensing period, generate compensation data for compensating for a characteristic variation of the driving TFT of each pixel P based on the sensing raw data provided from the driving IC 530, and modulate pixel data based on the generated compensation data. For example, the timing controller 570 may drive each of the driving IC 530 and the gate driving circuit 150 based on the external sensing mode for each external sensing period corresponding to a blank period (or a vertical blank period) of the vertical synchronization signal.

The power circuit part 590 may be mounted at the PCB 550 and may generate various source voltages needed for displaying an image on the pixels P by using an input power supplied from the outside to provide the generated source voltage to a corresponding circuit.

Figure 11A:
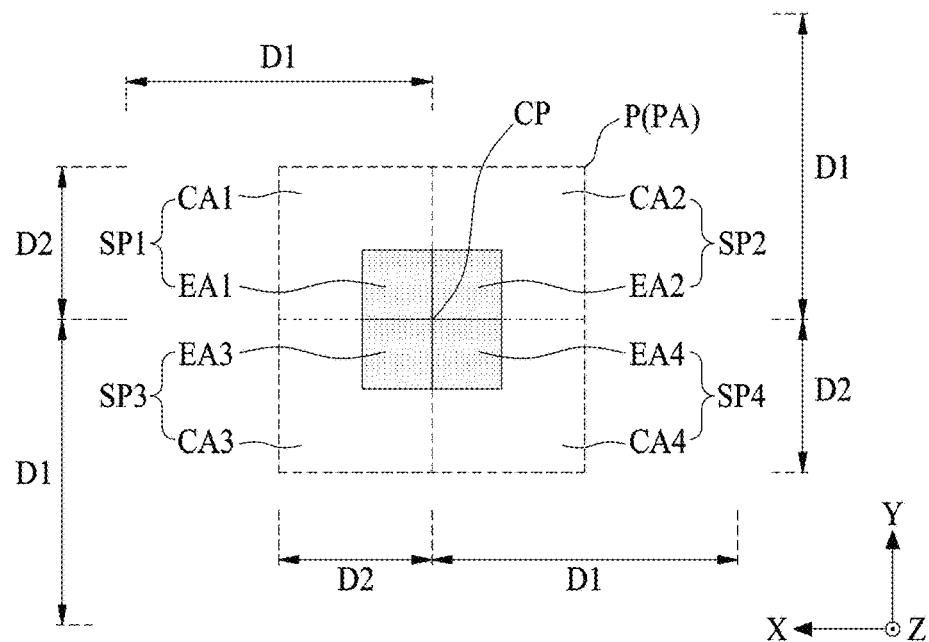
FIG. 11A is a diagram illustrating one pixel according to an embodiment illustrated in FIG. 9.
Figure 11B:
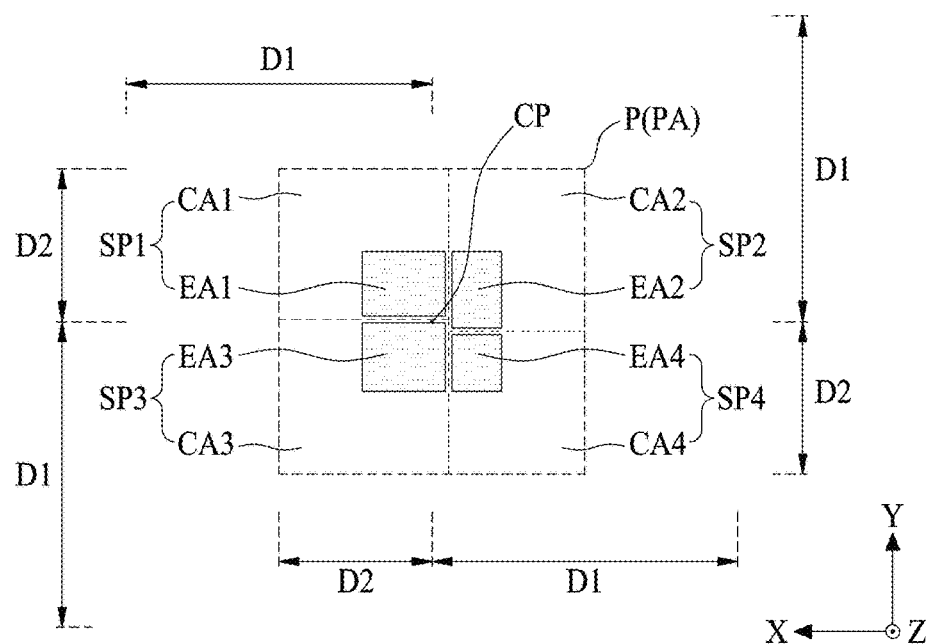
FIG. 11B is a diagram illustrating one pixel according to another embodiment illustrated in FIG. 9.

FIG. 11A is a diagram illustrating one pixel according to an embodiment illustrated in FIG. 9, and FIG. 11B is a diagram illustrating one pixel according to another embodiment illustrated in FIG. 9.

Referring to FIGS. 9 and 11A, one pixel P or one pixel area PA according to an embodiment of the present disclosure may include first to fourth subpixels SP1 to SP4.

The first subpixel SP1 may be disposed in a first subpixel area of the pixel area PA, the second subpixel SP2 may be disposed in a second subpixel area of the pixel area PA, the third subpixel SP3 may be disposed in a third subpixel area of the pixel area PA, and the fourth subpixel SP4 may be disposed in a fourth subpixel area of the pixel area PA.

As an embodiment, the first subpixel SP1 may be implemented to emit light of a first color, the second subpixel SP2 may be implemented to emit light of a second color, the third subpixel SP3 may be implemented to emit light of a third color, and the fourth subpixel SP4 may be implemented to emit light of a fourth color. Each of the first to fourth colors may be different. For example, the first color may be red, the second color may be blue, the third color may be white, and the fourth color may be green.

As another embodiment, some of the first to fourth colors may be the same. For example, the first color may be red, the second color may be first green, the third color may be second green, and the fourth color may be blue.

The first to fourth subpixels SP1 to SP4 may respectively include a plurality of emission areas EA1 to EA4 and a plurality of circuit areas CA1 to CA4.

The emission areas EA1 to EA4 (or a light emitting portion) may be may be disposed close to the central portion CP of the pixel P inside the subpixel area.

The emission areas EA1 to EA4 of each of the first to fourth subpixels SP1 to SP4 according to an embodiment may be implemented to have the same size (or same area). For example, the emission areas EA1 to EA4 of each of the first to fourth subpixels SP1 to SP4 may have a uniform quad structure or a uniform stripe structure. For example, in the first to fourth subpixels SP1 to SP4 having a uniform quad structure or a uniform stripe structure, the emission areas EA1 to EA4 may be configured to have a size smaller than each of four equal division regions of the pixel P and may be disposed close to a center portion CP of the pixel P inside the corresponding subpixel area.

The emission areas EA1 to EA4 of each of the first to fourth subpixels SP1 to SP4 according to another embodiment may be implemented to have different sizes as illustrated in FIG. 11B. For example, the emission areas EA1 to EA4 of each of the first to fourth subpixels SP1 to SP4 may have a non-uniform quad structure or a non-uniform stripe structure.

A size of each of the first to fourth subpixels SP1 to SP4 having a non-uniform quad structure (or a non-uniform stripe structure) may be set based on a resolution, emission efficiency, image quality, or the like. As an embodiment, when the emission areas EA1 to EA4 have a non-uniform quad structure (or a non-uniform stripe structure), of the emission areas EA1 to EA4 of each the first to fourth subpixels SP1 to SP4, the emission area EA4 of the fourth subpixel SP4 may have a smallest size, and the emission area EA3 of the third subpixel SP3 may have a largest size, but embodiments of the present disclosure are not limited thereto.

Referring again to FIGS. 9, 11A, and 11B, in the first to fourth subpixels SP1 to SP4, each of the emission areas EA1 to EA4 may be spaced apart from each other in the first direction X and the second direction Y, but embodiments of the present disclosure are not limited thereto, and may be immediately adjacent to each other without a separation space (or a spaced apart space).

The circuit areas CA1 to CA4 of each of the first to fourth subpixels SP1 to SP4 may be disposed around (or near) a corresponding emission area of the emission areas EA1 to EA4. For example, the circuit areas CA1 to CA4 may be referred to as a non-emission area, or a periphery portion.

Alternatively, in order to increase an aperture ratio of the subpixels SP1 to SP4 corresponding to sizes of the emission areas EA1 to EA4 or decrease the pixel pitch D1 as a resolution of the pixel P is higher, the emission areas EA1 to EA4 of each of the first to fourth subpixels SP1 to SP4 may extend onto the circuit areas CA1 to CA4 to overlap some or all of the circuit areas CA1 to CA4. For example, each of the emission areas EA1 to EA4 of the first to fourth subpixels SP1 to SP4 may be implemented over the first substrate 100 to overlap a corresponding circuit area of the circuit areas CA1 to CA4. In this case, the emission areas EA1 to EA4 may have a size which is equal to or wider than the circuit areas CA1 to CA4.

Alternatively, each of the plurality of pixels P according to another embodiment of the present disclosure may include first to third subpixels SP1 to SP3.

The emission areas EA1 to EA3 of the first to third subpixels SP1 to SP3 may respectively have a rectangular shape which includes a short side parallel to the first direction X and a long side parallel to the second direction Y, and for example, may be disposed a 1×3 form or a 1×3 stripe form. For example, the first subpixel may be a red subpixel, the second subpixel may be a blue subpixel, and the third subpixel may be a green subpixel, but embodiments of the present disclosure are not limited thereto.

Figure 12:
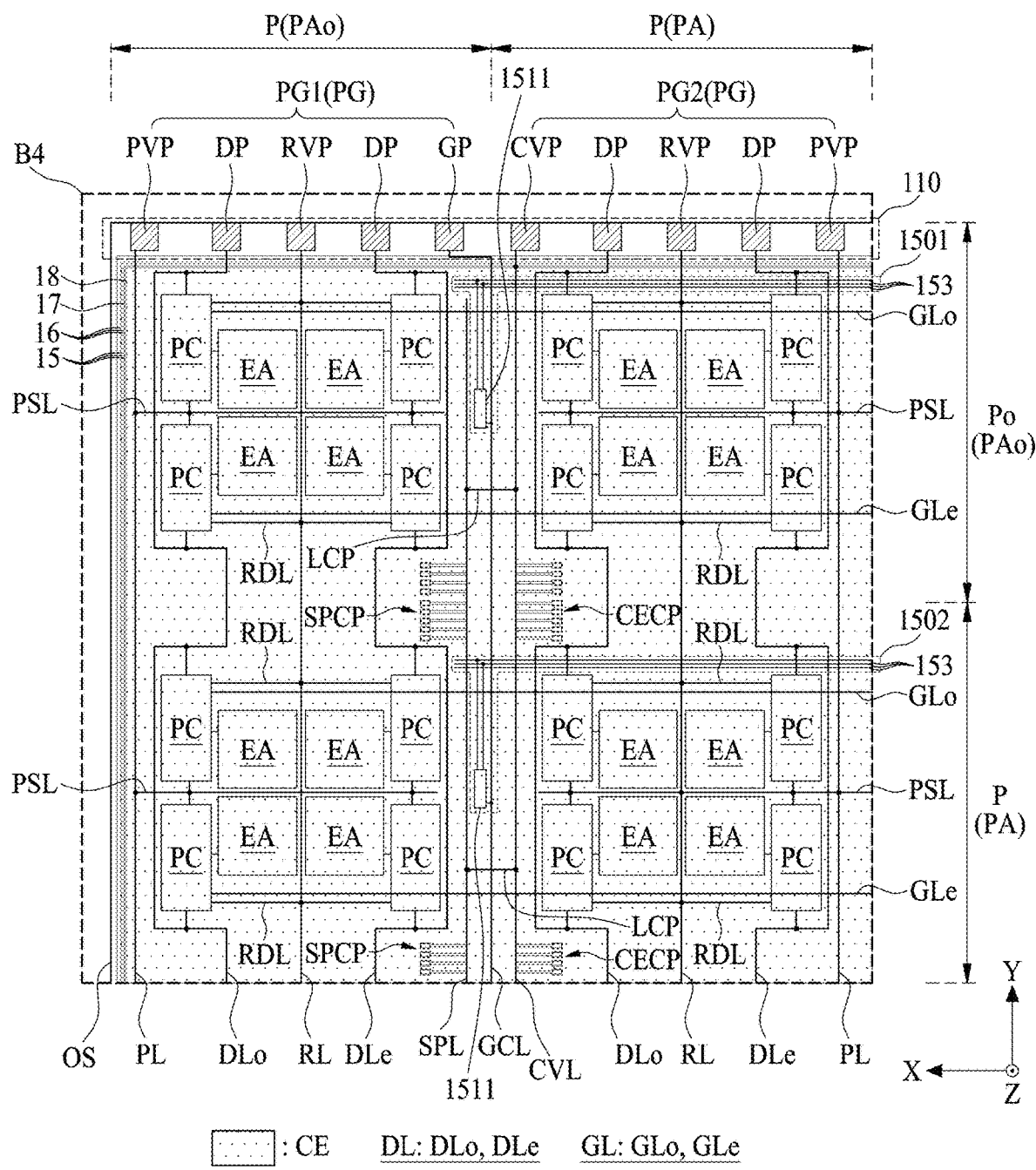
FIG. 12 is an enlarged view of a region 'B4' illustrated in FIG. 9.
Figure 13:
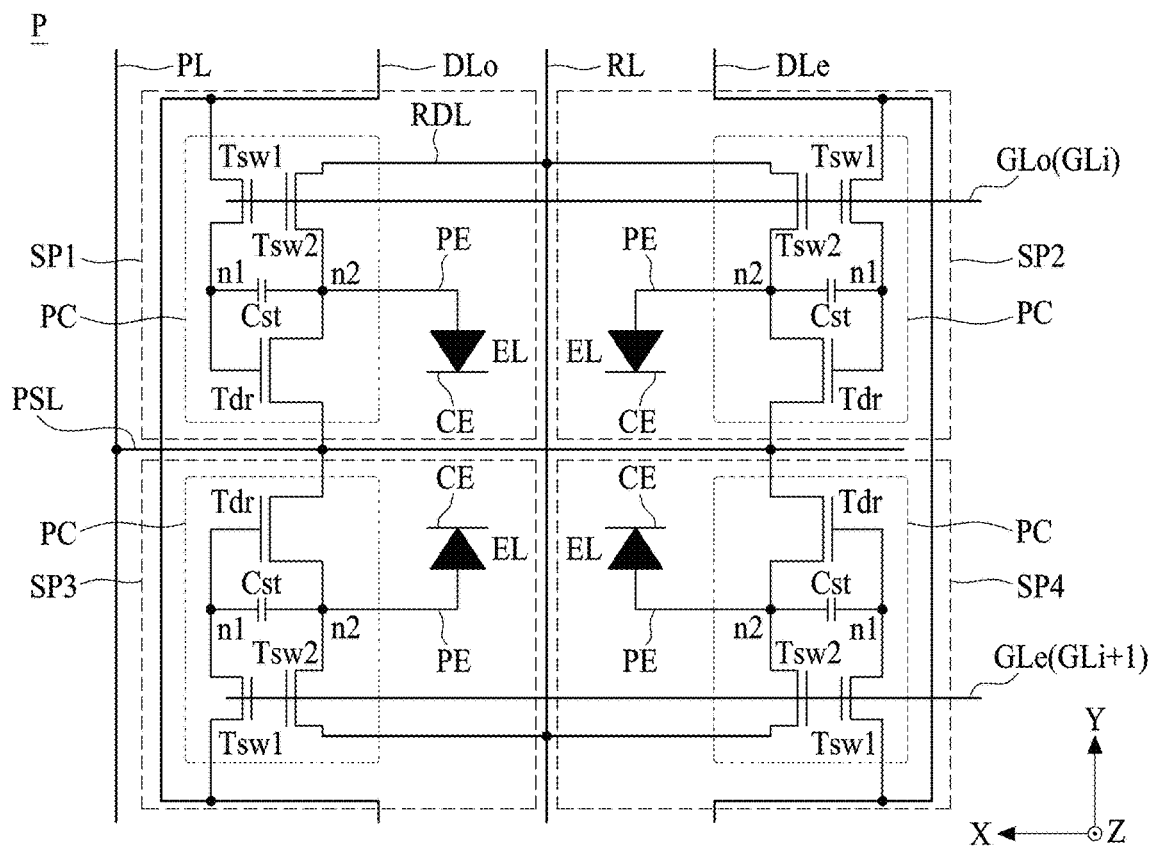
FIG. 13 is a circuit diagram illustrating one pixel illustrated in FIGS. 9 and 12.

FIG. 12 is an enlarged view of a region 'B4' illustrated in FIG. 9, and FIG. 13 is a circuit diagram illustrating one pixel illustrated in FIGS. 9 and 12. FIGS. 12 and 13 are diagrams for describing a plurality of pixels disposed in a first substrate.

Referring to FIGS. 9, 12, and 13, a first substrate 100 according to an embodiment of the present disclosure may include a plurality of data lines DL, a plurality of gate lines GL, a plurality of pixel driving power lines PL, a plurality of pixel common voltage lines CVL, a plurality of reference voltage lines RL, a plurality of pixels P, a common electrode CE, a plurality of common electrode contact portions CECP, a first pad portion 110, an isolation portion 15, and a non-emission pattern portion 16.

The plurality of data lines DL may extend long in a second direction Y and may be disposed apart from one another by a predetermined interval in a display portion AA of the first substrate 100 along the first direction X. For example, in the plurality of data lines DL, an odd-numbered data line DLo may be disposed at a first periphery portion of each of a plurality of pixel areas PA arranged at the first substrate 100 along the second direction Y, and an even-numbered data line DLe may be disposed at a second periphery portion of each of the plurality of pixel areas PA arranged at the first substrate 100 along the second direction Y.

The plurality of gate lines GL may extend long in the first direction X and may be disposed apart from one another by a predetermined interval in the display portion AA of the first substrate 100 along the second direction Y. For example, an odd-numbered gate line GLo of the plurality of gate lines GL may be disposed at a third periphery portion of each of the plurality of pixel areas PA arranged on the first substrate 100 along the first direction X. An even-numbered gate line GLe of the plurality of gate lines GL may be disposed at a fourth periphery portion of each of the plurality of pixel areas PA arranged on the first substrate 100 along the first direction X.

The plurality of pixel driving power lines PL may extend long in the second direction Y and may be disposed apart from one another by a predetermined interval in the display portion AA of the first substrate 100 along the first direction X. For example, in the plurality of pixel driving power lines PL, an odd-numbered pixel driving power line PL may be disposed at a first periphery portion of an odd-numbered pixel area PA with respect to the first direction X, and an even-numbered pixel driving power line PL may be disposed at a second periphery portion of an even-numbered pixel area PA with respect to the first direction X.

Two adjacent pixel driving power lines PL of the plurality of pixel driving power lines PL may be connected to a plurality of power sharing lines PSL disposed in each of pixel areas PA arranged in the second direction Y. For example, the plurality of pixel driving power lines PL may be electrically connected to one another by the plurality of power sharing lines PSL, and thus, may have a ladder structure or a mesh structure. The plurality of pixel driving power lines PL may have a ladder structure or a mesh structure, and thus, the voltage drop (IR drop) of the pixel driving power caused by a line resistance of each of the plurality of pixel driving power lines PL may be prevented or minimized. Accordingly, the light emitting display apparatus according to the present disclosure may prevent or minimize the degradation in image quality caused by a deviation of the pixel driving power supplied to each of the pixels P.

Each of the plurality of power sharing lines PSL may branch from an adjacent pixel driving power line PL in parallel with the first direction X and may be disposed in a middle region of each pixel area PA.

The plurality of pixel common voltage lines CVL may extend long in the second direction Y and may be disposed apart from one another by a predetermined interval in the display portion AA of the first substrate 100 along the first direction X. For example, each of the plurality of pixel common voltage lines CVL may be disposed at a first periphery portion of an even-numbered pixel area PA with respect to the first direction X.

The plurality of reference voltage lines RL may extend long in the second direction Y and may be disposed apart from one another by a predetermined interval in the display portion AA of the first substrate 100 in the first direction X. Each of the plurality of reference voltage lines RL may be disposed in a center region of each of the pixel areas PA arranged in the second direction Y.

Each of the plurality of reference voltage lines RL may be shared by two adjacent subpixels ((SP1, SP2) (SP3, SP4)) in the first direction X in each pixel area PA. To this end, each of the plurality of reference voltage lines RL may include a reference branch line RDL. The reference branch line RDL may branch (or protrude) to the two adjacent subpixels ((SP1, SP2) (SP3, SP4)) in the first direction X in each pixel area PA and may be electrically coupled to the two adjacent subpixels ((SP1, SP2) (SP3, SP4)).

The plurality of pixels P may be respectively disposed in the plurality of pixel areas PA which is defined to have an equal size in the display portion AA of the substrate 100.

Each of the plurality of pixels P may include at least three subpixels. For example, each of the plurality of pixels P may include first to fourth subpixels SP1 to SP4.

Each of the first to fourth subpixels SP1 to SP4 may include a pixel circuit PC and a light emitting device layer.

The pixel circuit PC according to an embodiment may be disposed in a circuit area of the pixel area PA and may be coupled to gate lines GLo and GLe adjacent thereto, data lines DLo and DLe adjacent thereto, and the pixel driving power line PL. For example, a pixel circuit PC disposed in a first subpixel SP1 may be coupled to an odd-numbered data line DLo and an odd-numbered gate line GLo, a pixel circuit PC disposed in a second subpixel SP2 may be coupled to an even-numbered data line DLe and an odd-numbered gate line GLo, a pixel circuit PC disposed in a third subpixel SP3 may be coupled to an odd-numbered data line DLo and an even-numbered gate line GLe, and a pixel circuit PC disposed in a fourth subpixel SP4 may be coupled to an even-numbered data line DLe and an even-numbered gate line GLe.

The pixel circuit PC of each of the first to fourth subpixels SP1 to SP4 may sample a data signal supplied from corresponding data lines DLo and DLe in response to a scan signal supplied from corresponding gate lines GLo and GLe and may control a current flowing from the pixel driving power line PL to the light emitting device layer based on a sampled data signal.

The pixel circuit PC according to an embodiment may sample a data signal by using three TFTs Tsw1, Tsw2, and Tdr and one capacitor Cst illustrated in FIG. 2, and may control a current flowing in the light emitting device layer based on a sampled data signal. The pixel circuit PC may be substantially the same as the pixel circuit PC illustrated in FIG. 2, and thus, its repetitive description is omitted or may be brief.

The pixel circuit PC of each of the first to fourth subpixels SP1 to SP4 according to another embodiment may be implemented as a pixel driving chip through a semiconductor manufacturing process, disposed in a circuit area of a corresponding pixel area PA, and connected to gate lines GLo and GLe adjacent thereto, data lines DLo and DLe adjacent thereto, and the pixel driving power line PL. For example, the pixel driving chip may be a minimum-unit microchip or one chipset and may be a semiconductor packaging device which includes two or more transistors and one or more capacitors and has a fine size. Such a pixel driving chip may sample a data signal supplied from corresponding data lines DLo and DLe in response to a scan signal supplied from corresponding gate lines GLo and GLe and may control a current flowing from the pixel driving power line PL to the light emitting device layer based on a sampled data signal.

The light emitting device layer may be disposed in an emission area EA of the pixel area PA, electrically coupled to the pixel circuit PC, and electrically coupled to the common electrode CE. The light emitting device layer may emit light with a current flowing from the pixel circuit PC to the common electrode CE. The light emitting device layer may be substantially the same as the light emitting device layer illustrated in FIG. 2, and thus, its repetitive description is omitted or may be brief.

The common electrode CE may be disposed in a display portion AA of the first substrate 100 and may be electrically coupled to the light emitting device layer of each of the plurality of pixels P. For example, the common electrode CE may be disposed in a region, other than a first pad portion 110 disposed in the first substrate 100, of the display portion AA of the first substrate 100.

Each of the plurality of common electrode contact portions CECP may electrically couple the common electrode CE to a corresponding pixel common voltage line CVL of the plurality of pixel common voltage lines CVL in between two adjacent pixels P of the plurality of pixels P overlapping each of the plurality of pixel common voltage lines CVL. With respect to the second direction Y, each of the plurality of common electrode contact portions CECP according to an embodiment may be electrically coupled to a corresponding pixel common voltage line CVL of the plurality of pixel common voltage lines CVL at a portion between the plurality of pixels P or at a boundary portion between the plurality of pixels P and may be electrically coupled to a portion of the common electrode CE, and thus, may electrically connect the common electrode CE to a corresponding pixel common voltage line CVL of the plurality of pixel common voltage lines CVL.

Each of the plurality of common electrode contact portions CECP may be disposed between two adjacent pixels P of the plurality of pixels P to electrically couple the common electrode CE to each of the plurality of pixel common voltage lines CVL, and thus, may prevent or minimize the voltage drop (IR drop) of the pixel common power caused by a surface resistance of the common electrode CE. Accordingly, the light emitting display apparatus according to the present disclosure may prevent or minimize the degradation in image quality caused by a deviation of the pixel driving power supplied to each of the pixels P arranged in the display portion AA.

According to an embodiment, each of the plurality of common electrode contact portions CECP may be formed together with a pixel electrode PE having a two-layer structure so as to be electrically coupled to each of the plurality of pixel common voltage lines CVL. Each of the plurality of common electrode contact portions CECP may be coupled to the common electrode CE through a side contact structure having a ")"-shaped cross-sectional structure or a "("-shaped cross-sectional structure. For example, when each of the plurality of common electrode contact portions CECP is formed of first and second metal layers, each of the plurality of common electrode contact portions CECP may include a side contact structure corresponding to an undercut structure or a tapered structure formed on the lateral surface of the first metal layer by an etching speed difference between the first metal layer and the second metal layer. For example, when each of the plurality of common electrode contact portions CECP is formed of first to three metal layers, each of the plurality of common electrode contact portions CECP may include a side contact structure corresponding to an undercut structure or a tapered structure formed on the lateral surface of the second metal layer by an etching speed difference between the second metal layer and the third metal layer.

The first pad portion 110 may be disposed at a first periphery portion of the first surface of the first substrate 100 parallel to the first direction X. The first pad portion 110 may be disposed at a third periphery portion of each of outermost pixel areas PAo disposed at the first periphery portion of the first substrate 100. With respect to the second direction Y, an end of the first pad portion 110 may overlap or may be aligned with an end of each of the outermost pixel areas PAo. Therefore, the first pad portion 110 may be included (or disposed) in each of the outermost pixel areas PAo disposed at the first periphery portion of the first substrate 100, and thus, a non-display portion (or a bezel area) based on the first pad portion 110 may not be formed or may not be on in the first substrate 100.

The first pad portion 110 may include a plurality of first pads which are disposed in parallel with one another in the first direction X at the first periphery portion of the first substrate 100.

The first pad portion 110 according to an embodiment may include a plurality of pad groups PG. Two or more pad groups PG of the plurality of pad groups PG may include at least one data pad DP and at least one gate pad GP. For example, the first pad portion 110 according to an embodiment may include a plurality of pad groups PG which are arranged in the order of a pixel driving voltage pad PVP, a data pad DP, a reference voltage pad RVP, a data pad DP, a gate pad GP, a pixel common voltage pad CVP, a data pad DP, a reference voltage pad RVP, a data pad DP, and a pixel driving voltage pad PVP along the first direction X.

Each of the plurality of pad groups PG may be coupled to two adjacent pixels P disposed along the first direction X. For example, the plurality of pad groups PG may include a first pad group PG1 including a pixel driving voltage pad PVP, a data pad DP, a reference voltage pad RVP, a data pad DP, and a gate pad GP continuously disposed in an odd-numbered pixel area PA along the first direction X, and a second pad group PG2 including a pixel common voltage pad CVP, a data pad DP, a reference voltage pad RVP, a data pad DP, and a pixel driving voltage pad PVP continuously disposed in an even-numbered pixel area PA along the first direction X.

The first substrate 100 according to the present disclosure may further include a plurality of secondary power lines SPL and a plurality of secondary power contact portions SPCP.

Each of the plurality of secondary power lines SPL may extend long in the second direction Y and may be disposed adjacent to a corresponding pixel common voltage line CVL of the plurality of pixel common voltage lines CVL. Each of the plurality of secondary power lines SPL may be electrically coupled to an adjacent pixel common voltage line CVL without being electrically coupled to the pixel common voltage pad CVP and may be supplied with a pixel common power through the adjacent pixel common voltage line CVL. To this end, the first substrate 100 according to the present disclosure may further include a plurality of line connection patterns LCP which electrically couple a pixel common voltage line CVL and a secondary power line SPL adjacent to each other.

Each of the plurality of line connection patterns LCP may be disposed on the first substrate 100 so that the line connection pattern LCP and a pixel common voltage line CVL and a secondary power line SPL adjacent to each other intersect with each other and may electrically couple a pixel common voltage line CVL and a secondary power line SPL adjacent to each other by using a line jumping structure. For example, one side of each of the plurality of line connection patterns LCP may be electrically coupled to a portion of the secondary power line SPL through a first line contact hole formed at an insulation layer over the secondary power line SPL, and the other side of each of the plurality of line connection patterns LCP may be electrically coupled to a portion of the pixel common voltage line CVL through a second line contact hole formed at an insulation layer over the pixel common voltage line CVL.

Each of the plurality of secondary power contact portions SPCP may electrically couple the common electrode CE to each of the plurality of secondary power lines SPL in between the plurality of pixels P overlapping each of the plurality of secondary power lines SPL. With respect to the second direction Y, each of the plurality of secondary power contact portions SPCP according to an embodiment may be electrically coupled to each of the plurality of secondary power lines SPL at a portion between the plurality of pixels P or a boundary portion between the plurality of pixels P and may be electrically coupled to a portion of the common electrode CE, and thus, may electrically couple the common electrode CE to each of the plurality of secondary power lines SPL. Therefore, the common electrode CE may be additionally coupled to each of the plurality of secondary power lines SPL through the secondary power contact portions SPCP. Accordingly, the light emitting display apparatus according to an embodiment of the present disclosure may prevent or minimize the degradation in image quality caused by a deviation of the pixel common power supplied to each of the pixels P arranged in the display portion AA. Also, in the light emitting display apparatus according to the present disclosure, although the pixel common voltage pad CVP connected to each of the plurality of secondary power lines SPL is not additionally disposed (or formed), the pixel common power may be supplied to each of the plurality of secondary power lines SPL through each of the pixel common voltage line CVL and the plurality of line connection patterns LCP. Each of the plurality of secondary power contact portions SPCP may electrically coupled a corresponding secondary power line of the plurality of secondary power lines SPL to the common electrode CE through a side contact structure having a side contact structure having a ")"-shaped cross-sectional structure or a "("-shaped cross-sectional structure, like each of the plurality of common electrode contact portions CECP.

The isolation portion 15 may be disposed in a second region surrounding the first region of the first substrate 100. For example, the second region of the first substrate 100 may be a periphery portion of the first substrate 100 or a periphery portion of the outermost pixel Po. The first region of the first substrate 100 may be a remaining portion other than the second region. The isolation portion 15 may be implemented to separate (or disconnect or isolate) the light emitting layer EL inside the outermost pixels Po disposed along the periphery portion of the first substrate 100. For example, the isolation portion 15 may separate (or disconnect), at least once, the light emitting layer EL inside the outermost pixels Po. The isolation portion 15 according to an embodiment may include at least two or more isolation patterns. Each of at least two or more isolation patterns may be implemented to have a closed loop line shape along the outermost pixel Po disposed at the periphery portion of the first substrate 100. As such, except that the isolation portion 15 is implemented in the outermost pixel Po disposed along the periphery portion of the first substrate 100, the isolation portion 15 is substantially the same as the isolation portion 15 illustrated in FIGS. 1 to 8G, and thus, like reference numerals refer to like elements and their repetitive descriptions are omitted or will be briefly given.

The non-emission pattern portion 16 may be implemented to have a closed loop line shape along the outermost pixel Po disposed at the periphery portion of the first substrate 100. For example, the non-emission pattern portion 16 may be implemented to have a closed loop line shape over the passivation layer between a first to third isolation patterns inside the outermost pixel Po disposed at the periphery portion of the first substrate 100. The non-emission pattern portion 16 may include a first light emitting material pattern formed together with the light emitting layer EL of the light emitting device layer and electrically or spatially separated from the light emitting layer EL by the isolation portion 15. For example, the first light emitting material pattern may be disposed over the passivation layer between the isolation patterns. The non-emission pattern portion 16 may further include a first common electrode material pattern formed over the first light emitting material pattern together with the common electrode CE and electrically or spatially separated from the common electrode CE by the isolation portion 15. For example, the first common electrode material pattern may be disposed over the first light emitting material pattern and the passivation layer to surround or completely surround the first light emitting material pattern. The non-emission pattern portion 16 according to an embodiment includes at least two or more non-emission patterns. Each of at least two or more non-emission patterns may have a closed loop line shape. For example, each of at least two or more non-emission patterns may be implemented to have a closed loop line shape to surround each of the isolation patterns. As such, except that the non-emission pattern portion 16 is implemented in the outermost pixel Po disposed along the periphery portion of the first substrate 100, the non-emission pattern portion 16 is substantially the same as the non-emission pattern portion 16 illustrated in FIGS. 1 to 8G, and thus, like reference numerals refer to like elements and their repetitive descriptions are omitted or will be briefly given.

The first substrate 100 according to an embodiment of the present disclosure may further a dam pattern portion 17.

The dam pattern portion 17 may be implemented to have a closed loop line shape along the outermost pixel Po disposed at the periphery portion of the first substrate 100. For example, the dam pattern portion 17 may be implemented to have a closed loop line shape over the passivation layer so as to be surrounded by the isolation portion 15 inside the outermost pixel Po disposed at the periphery portion of the first substrate 100. The dam pattern portion 17 according to an embodiment may include a first dam pattern over the passivation layer, a second dam pattern over the first dam pattern, and further include a third dam pattern between the first dam pattern and the second dam pattern. The dam pattern portion 17 may include a second light emitting material pattern formed over the second dam pattern together with the light emitting layer EL of the light emitting device layer and electrically or spatially separated from the light emitting layer EL. The dam pattern portion 17 according to an embodiment may further include a second common electrode material pattern formed over the second light emitting material pattern together with the common electrode CE and electrically or spatially separated from the common electrode CE. As such, except that the dam pattern portion 17 is implemented in the outermost pixel Po disposed along the periphery portion of the first substrate 100, the dam pattern portion 17 is substantially the same as the dam pattern portion 17 illustrated in FIGS. 1 to 8G, and thus, like reference numerals refer to like elements and their repetitive descriptions are omitted or will be briefly given.

The first substrate 100 according to an embodiment of the present disclosure may further a trench pattern portion 18.

The trench pattern portion 18 may be implemented to have a closed loop line shape along the outermost pixel Po disposed at the periphery portion of the first substrate 100. For example, the trench pattern portion 18 may be implemented to have a closed loop line shape over the passivation layer so as to be surrounded by the dam pattern portion 17 inside the outermost pixel Po disposed at the periphery portion of the first substrate 100. The trench pattern portion 18 may isolate (or separate) the light emitting layer EL of the light emitting device layer in an inner region of the dam pattern portion 17, and thus, the trench pattern portion 18 may block a lateral water transmission path, and may prevent or minimize a reduction in reliability of the light emitting layer EL caused by the lateral penetration of water. The trench pattern portion 18 may be implemented to additionally isolate (or separate) the common electrode CE, in this case, an end of the common electrode CE isolated by the trench pattern portion 18 may be implemented to cover an end of the light emitting device layer EL isolated by the trench pattern portion 18. The trench pattern portion 18 according to an embodiment may include a first trench structure over the passivation layer, and a second trench structure over the first trench structure. The second trench structure may include a protruding portion (or protruding tip) protruded to the outside of the lateral surface of the first trench structure, whereby the second trench structure may have an eaves structure with respect to the first trench structure based the protruding portion (or protruding tip) protruded to the outside of the lateral surface of the first trench structure. The trench pattern portion 18 may isolate (or separate) the light emitting layer EL of the light emitting device layer by the eaves structure of the second trench structure with respect to the first trench structure or the undercut structure of the first trench structure with respect to the second trench structure. As such, except that the trench pattern portion 18 is implemented in the outermost pixel Po disposed along the periphery portion of the first substrate 100, the trench pattern portion 18 is substantially the same as the trench pattern portion 18 illustrated in FIGS. 1 to 8G, and thus, like reference numerals refer to like elements and their repetitive descriptions are omitted or will be briefly given.

Figure 14:
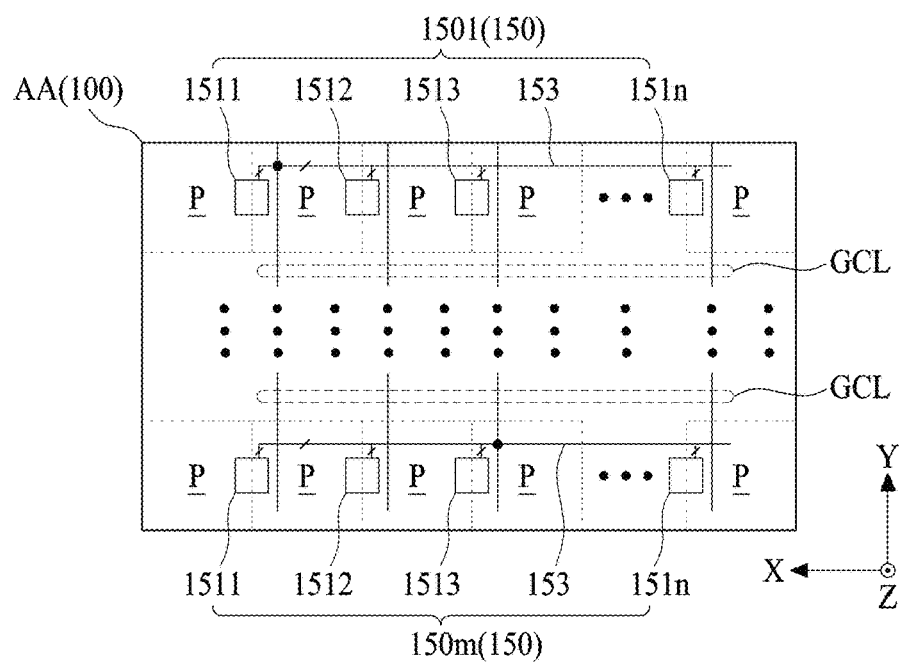
FIG. 14 is a diagram illustrating a gate driving circuit implemented in a display portion illustrated in FIGS. 9 and 12.

FIG. 14 is a diagram illustrating a gate driving circuit disposed in a display portion illustrated in FIGS. 9 and 12.

Referring to FIGS. 9, 12, and 14, a gate driving circuit 150 according to an embodiment of the present disclosure may be disposed in a display portion AA of a first substrate 100 and may be coupled to a gate control line group GCL disposed in the display portion AA of the first substrate 100.

First, the gate control line group GCL may include a plurality of gate control lines coupled to the gate driving circuit 150 in the display portion AA of the first substrate 100. The gate control line group GCL according to an embodiment may include a start signal line, a plurality of shift clock lines, at least one gate driving voltage line, and at least one gate common voltage line. Each of the lines of the gate control line group GCL may extend long in the second direction Y and may be disposed apart from one another by a predetermined interval in the display portion AA of the first substrate 100 in the first direction X. For example, each of the lines of the gate control line group GCL may be disposed between at least one or more pixels P in the first direction X.

A gate driving circuit 150 according to an embodiment may be implemented with a shift register including a plurality of stage circuit portions 1501 to 150m.

Each of the plurality of stage circuit portions 1501 to 150m may be individually disposed at each horizontal line of a first surface 100a of the first substrate 100 in the first direction X and may be dependently coupled to one another in the second direction Y. Each of the plurality of stage circuit portions 1501 to 150m may generate a scan signal in a predetermined order in response to a gate control signal supplied through the first pad portion 110 and the gate control line group GCL and may supply the scan signal to a corresponding gate line GL.

Each of the plurality of stage circuit portions 1501 to 150m according to an embodiment may include a plurality of branch circuits 1511 to 151n and a branch network 153.

Each of the plurality of branch circuits 1511 to 151n may be selectively coupled to the lines of the gate control line group GCL through the branch network 153 and may be electrically coupled to one another through the branch network 153. Each of the plurality of branch circuits 1511 to 151n may generate the scan signal based on a gate control signal supplied through each of lines of the gate control line group GCL, and may supply the scan signal to a corresponding gate line GL.

Each of the plurality of branch circuits 1511 to 151n may include at least one TFT of a plurality of TFTs configuring each of the stage circuit portions 1501 to 150m. Any one of the plurality of branch circuits 1511 to 151n may include a pull-up TFT coupled to the gate line GL. Another one of the plurality of branch circuits 1511 to 151n may include a pull-down TFT coupled to the gate line GL.

Each of the plurality of branch circuits 1511 to 151n according to an embodiment may be disposed in a circuit area between two adjacent pixels P or in a circuit area between two pixels P, in each horizontal line of the first substrate 100, but embodiments of the present disclosure are not limited thereto. For example, each of the plurality of branch circuits 1511 to 151n may be disposed in a circuit area between one or more adjacent pixels P based on the number of TFTs configuring one stage circuit portion and the number of pixels P disposed in one horizontal line.

The branch network 153 may be disposed in each horizontal line of the first substrate 100 and may electrically couple the plurality of branch circuits 1511 to 151n to each other. The branch network 153 according to an embodiment may include a plurality of control nodes and a network line.

The plurality of control nodes may be disposed in each horizontal line of the first substrate 100 and may be selectively connected to the plurality of branch circuits 1511 to 151n in one horizontal line. For example, the plurality of control nodes may be disposed in an upper edge region (or a lower edge region) of pixel areas arranged in each horizontal line of the first substrate 100.

The network line may be selectively coupled to the lines of the gate control line group GCL disposed in the first substrate 100 and may be selectively coupled to the plurality of branch circuits 1511 to 151n. For example, the network line may transfer the gate control signal, supplied through the lines of the gate control line group GCL, to corresponding branch circuits 1511 to 151n and may transfer a signal between the plurality of branch circuits 1511 to 151n.

As described above, according to the present embodiment, because the gate driving circuit 150 is disposed in the display portion AA of the first substrate 100, a second interval D2 between a center portion of the outermost pixel area PAo and each of the outer surfaces OS of the first substrate may be equal to or less than half of a first interval (or a pixel pitch) D1 between adjacent pixel areas PA. For example, when the gate driving circuit 150 is not disposed in the display portion AA of the substrate 10 and is disposed at a periphery portion of the first substrate 100 as illustrated in FIG. 1, the second interval D2 may not be equal to or less than half of the first interval D1. Accordingly, in the light emitting display apparatus according to another embodiment of the present disclosure, the gate driving circuit 150 may be disposed in the display portion AA of the first substrate 100, and thus, the second interval D2 may be implemented to be equal to or less than half of the first interval D1.

Figure 15:
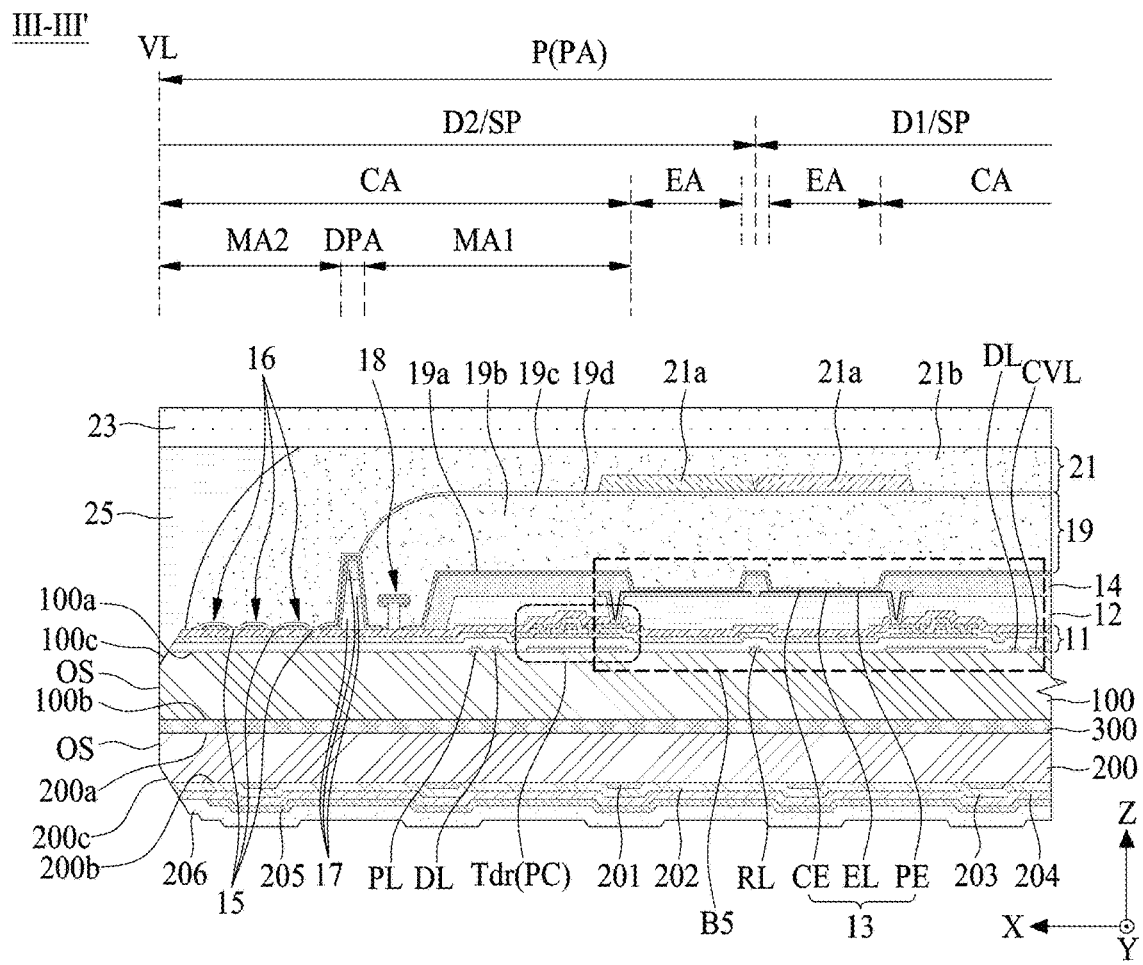
FIG. 15 is a cross-sectional view taken along line illustrated in FIG. 9.
Figure 16:
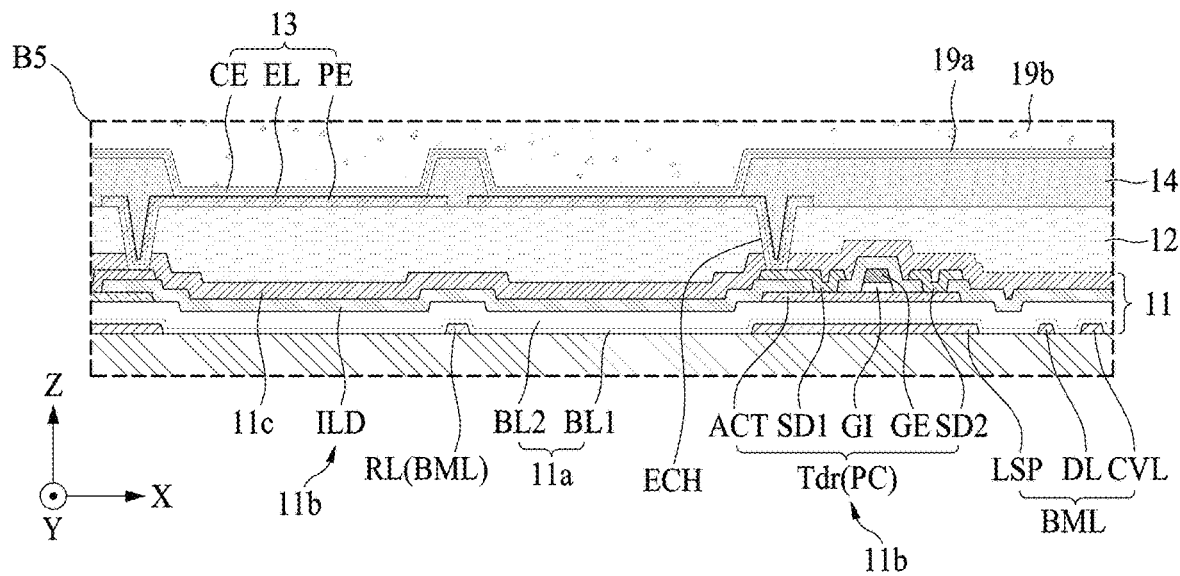
FIG. 16 is an enlarged view of a region 'B5' illustrated in FIG. 15.

FIG. 15 is a cross-sectional view taken along line illustrated in FIG. 9, and FIG. 16 is an enlarged view of a region 'B5' illustrated in FIG. 15. In describing the FIGS. 15 and 16, elements which are the same as or correspond to the elements of FIG. 9 are referred to by like reference numerals, and their repetitive descriptions are omitted or will be briefly given.

Referring to FIGS. 9, 15, and 16, a light emitting display apparatus according to another embodiment of the present disclosure may include a first substrate 100 and a second substrate 200 which are coupled (or bonded) to each other by a coupling member 300. In describing the first substrate 100 and the second substrate 200, elements which are the same as or correspond to the elements of FIG. 9 are referred to by like reference numerals, and their repetitive descriptions are omitted or will be briefly given below.

The first substrate 100 according to an embodiment may include a display portion AA. A whole first substrate 100 may implement the display portion AA. For example, the display portion AA may be the whole front surface of the first substrate 100. For example, a size of the display portion AA may be the same as or substantially the same as the first substrate 100.

The display portion AA may include a circuit layer 11, a planarization layer 12, a light emitting device layer 13, a bank 14, an isolation portion 15, a non-emission pattern portion 16, a dam pattern portion 17, a trench pattern portion 18, an encapsulation layer 19, a wavelength conversion layer 21, a functional film 23, and a side sealing member 25. Except for an arrangement structure of a light emitting device layer 13 and a pixel circuit PC of a pixel P, an isolation portion 15, a non-emission pattern portion 16, a dam pattern portion 17, a trench pattern portion 18 disposed inside an outermost pixels Po of the first substrate 100, the elements disposed at the display portion AA are substantially the same as the elements disposed at the substrate 10 illustrated in FIGS. 3 to 8G. In the following description, and thus, like reference numerals refer to like elements and their repetitive descriptions are omitted or will be briefly given.

The circuit layer 11 may be disposed on a first surface 100a of the first substrate 100. The circuit layer 11 may be referred to as a pixel array layer or a TFT array layer. The circuit layer 11 according to an embodiment may include a lower metal layer BML, a buffer layer 11a, and a circuit array layer 11b.

The lower metal layer BML may be used as a pixel driving line which is disposed in a second direction Y on the first surface 100a of the first substrate 100. For example, the lower metal layer BML may be formed on the first surface 10a of the first substrate 100, and then, may be patterned as a plurality of data lines DL, a plurality of pixel driving power lines PL, a plurality of pixel common voltage lines CVL, a plurality of reference voltage lines RL, a light blocking pattern LSP, and the gate control line group GCL by using a patterning process.

The buffer layer 11a may be disposed on the first surface 100a of the first substrate 100 to cover the lower metal layer BML. The buffer layer 11a may include a first buffer layer BL1 covering the lower metal layer BML and a second buffer layer BL2 covering the first buffer layer BL1.

The pixel array layer 11b may include a pixel circuit PC including a driving TFT Tdr disposed in each of a plurality of pixel areas PA over the buffer layer 11a.

The driving TFT Tdr disposed in each of the plurality of pixel areas PA may include an active layer ACT, a gate insulation layer GI, a gate electrode GE, an interlayer insulation layer ILD, a first source/drain electrode SD1, a second source/drain electrode SD2, and a passivation layer 11c. Each of first and second switching TFTs Tsw1 and Tsw2 configuring the pixel circuit PC may be formed together with the driving TFT Tdr, and thus, their detailed descriptions are omitted or may be brief.

A source/drain metal layer implementing the source/drain electrodes SD1 and SD2 may be used as a pixel driving line which is disposed in a first direction X. For example, the source/drain metal layer may be formed over the first surface 100a of the first substrate 100, and then, may be patterned as a gate line GL, a network line and a plurality of control nodes of a branch network 153, a plurality of power sharing lines PSL, a plurality of line connection patterns LCP, and a reference branch line RDL through a patterning process.

The light emitting device layer 13 may be disposed over the planarization layer 12 and may emit light toward an upper side of the first surface 100a of the first substrate 100 based on a top emission type, but embodiments of the present disclosure are not limited thereto.

The light emitting device layer 13 according to an embodiment may include a pixel electrode PE, a light emitting layer EL, and a common electrode CE.

The pixel electrode PE may be disposed over the planarization layer 12 overlapping an emission area EA of each of the plurality of pixel areas PA. The pixel electrode PE may be patterned and disposed in an island shape in each pixel area PA and may be electrically coupled to the first source/drain electrode SD1 of the driving TFT Tdr of a corresponding pixel circuit PC. One side of the pixel electrode PE may extend onto the first source/drain electrode SD1 of the driving TFT Tdr in the emission area EA of the pixel area PA and may be electrically coupled to the first source/drain electrode SD1 of the driving TFT Tdr through an electrode contact hole ECH provided in the planarization layer 12.

A metal layer (or a pixel electrode layer) implementing the pixel electrode PE may be used as pads PVP, DP, RVP, DP, GP, and CVP of a first pad portion 110. For example, the metal layer implementing the pixel electrode PE may be formed over the first surface 100a of the first substrate 100, and then, may be patterned as the pads PVP, DP, RVP, DP, GP, and CVP of the first pad portion 110 through a patterning process.

The light emitting layer EL may be formed over the pixel electrode PE and may directly contact the pixel electrode PE. The light emitting layer EL may be a common layer which is formed in common in each of a plurality of subpixels SP so as not to be distinguished by subpixel SP units. The light emitting layer EL may react on a current flowing between the pixel electrode PE and the common electrode CE to emit white light (or blue light).

The common electrode CE may be formed over the light emitting layer EL and may directly contact the light emitting layer EL or may electrically and directly contact the light emitting layer EL. The common electrode CE may include a transparent conductive material which transmits light emitted from the light emitting layer EL.

The bank 14 may be disposed over the planarization layer 12 to cover a periphery portion of the pixel electrode PE. The bank 14 may define an emission area EA (or an opening portion) of the subpixel SP and may electrically isolate pixel electrodes PE disposed in adjacent subpixel SP. The bank 14 may be formed to cover an electrode contact hole ECH provided in the subpixel SP. The bank 104 may be covered by the light emitting layer EL.

The first substrate 100 according to an embodiment may further include a first margin area MA1, a second margin area MA2, and a dam pattern area DPA. For example, the first margin area MA1, the second margin area MA2, and the dam pattern area DPA may be a second region surrounding a first region of the first substrate 100.

The first margin area MA1 may be disposed between an emission area EA of the outermost pixel Po and the dam pattern area DPA. The first margin area MA1 may have a first width between an end of the emission area EA (or the bank 14) of the outermost pixel Po and the dam pattern area DPA based on a shadow region (or a tail portion) of the light emitting layer EL inevitably occurring in a process of forming the light emitting layer EL.

The second margin area MA2 may be disposed between the outer surface OS of the first substrate 100 and the dam pattern area DPA. The second margin area MA2 may have a second width between the outer surface OS of the first substrate 100 and the dam pattern area DPA based on the reliability margin of the light emitting layer EL against water. The second margin area MA2 according to an embodiment may include a pad margin area overlapping the first pad portion 110 disposed at a first periphery portion of the first surface 100a of the first substrate 100.

The dam pattern area DPA may be disposed between the first margin area MA1 and the second margin area MA2. The dam pattern area DPA may have a third width corresponding to between the first margin area MA1 and the second margin area MA2.

A width of each of the first margin area MA1, the second margin area MA2, and the dam pattern area DPA may be implemented so that a second interval D2 between a center portion of the outermost pixel Po and the outer surface OS of the first substrate 100 is half or less of a first interval (or a pixel pitch) D1 between two adjacent pixel areas PA, with respect to the first direction X.

The isolation portion 15 may be disposed to have a closed loop line shape in the second margin area MA2 defined in the outermost pixel Po. The isolation portion 15 according to an embodiment includes at least two or more isolation patterns disposed to have a closed loop line shape in the second margin area MA2. Except that the isolation portion 15 is implemented in the second margin area MA2 defined in the outermost pixel Po, the isolation portion 15 is substantially the same as the isolation portion 15 illustrated in FIGS. 1 to 8G, and thus, like reference numerals refer to like elements and their repetitive descriptions are omitted or will be briefly given.

The non-emission pattern portion 16 may be disposed to have a closed loop line shape between the isolation portions 15 inside the second margin area MA2 defined in the outermost pixel Po. The non-emission pattern portion 16 according to an embodiment includes at least two or more non-emission patterns disposed to have a closed loop line shape in the second margin area MA2. Except that the non-emission pattern portion 16 is implemented in the second margin area MA2 defined in the outermost pixel Po, non-emission pattern portion 16 is substantially the same as non-emission pattern portion 16 illustrated in FIGS. 1 to 8G, and thus, like reference numerals refer to like elements and their repetitive descriptions are omitted or will be briefly given.

The dam pattern portion 17 may be disposed to have a closed loop line shape in the dam pattern area DPA between the first margin area MA1 and the second margin area MA2. The dam pattern portion 17 may be implemented to be spaced apart from the end of the emission area EA by the first width of the first margin area MA1 with respect to the first direction X. Moreover, the dam pattern portion 17 may be implemented to be spaced apart from the outer surface OS of the first substrate 100 by the second width of the second margin area MA2 with respect to the first direction X. Except that the dam pattern portion 17 is configured to be disposed inside the outermost pixel Po disposed along one periphery portion of the first substrate 100, the dam pattern portion 17 may be substantially the same as the dam pattern portion 17 illustrated in FIGS. 1 to 8G, and thus, like reference numerals refer to like elements and their repetitive descriptions are omitted or will be briefly given.

The trench pattern portion 18 may be disposed to have a closed loop line shape in the first margin area MA1 defined in the outermost pixel Po. The trench pattern portion 18 according to an embodiment includes a first trench structure which is disposed to have a closed loop line shape in the first margin area MA1, and a second trench structure which is disposed over the first trench structure. The second trench structure may include a protruding portion (or protruding tip) protruded to the outside of the lateral surface of the first trench structure, whereby the second trench structure may have an eaves structure with respect to the first trench structure based the protruding portion (or protruding tip) protruded to the outside of the lateral surface of the first trench structure. Except that the trench pattern portion 18 is implemented in the first margin area MA1 defined in the outermost pixel Po, the trench pattern portion 18 may be substantially the same as the trench pattern portion 18 illustrated in FIGS. 1 to 8G, and thus, like reference numerals refer to like elements and their repetitive descriptions are omitted or will be briefly given.

The encapsulation layer 19 may be disposed over a remaining portion except for an outermost periphery portion of the first surface 100a of the first substrate 100 to cover the light emitting device layer 13. For example, the encapsulation layer 19 may be implemented to surround all of a front surface and lateral surfaces of the light emitting device layer 13. The encapsulation layer 19 according to an embodiment may include first to fourth encapsulation layers 19a, 19b, 19c, and 19d. The first to fourth encapsulation layers 19a, 19b, 19c, and 19d may be substantially the same as the first to third encapsulation layers 19a, 19b, 19c, and 19d of the encapsulation layer 19 illustrated in FIGS. 3 to 8G, and thus, like reference numerals refer to like elements and their repetitive descriptions are omitted or will be briefly given.

The wavelength conversion layer 21 may convert a wavelength of light incident from the emission area EA of the subpixel SP. For example, the wavelength conversion layer 21 may convert white light (or blue light), which is incident from the emission area EA, into colored light corresponding to a corresponding pixel P. The wavelength conversion layer 21 according to an embodiment may include a plurality of wavelength conversion patterns 21a and a protection layer 21b. The wavelength conversion layer 21 may be substantially the same as the wavelength conversion layer 21 illustrated in FIGS. 3 and 5, and thus, like reference numerals refer to like elements and their repetitive descriptions are omitted or will be briefly given.

The functional film 23 may be disposed over the wavelength conversion layer 21. For example, the functional film 23 may be coupled to the wavelength conversion layer 21 by using a transparent adhesive member. The functional film 23 according to an embodiment may further include at least one or more of an anti-reflection layer (or an anti-reflection film), a barrier layer (or a barrier film), and a light path control layer (or a light path control film) described above.

The side sealing member 25 may be formed between the first substrate 100 and the functional film 23 and may cover all of side (or lateral) surfaces of each of the circuit layer 11 and the wavelength conversion layer 21. For example, the side sealing member 25 may cover all of lateral surfaces of each of the circuit layer 11 and the wavelength conversion layer 21 which are exposed at the outside of the light emitting display apparatus, between the functional film 13 and the first substrate 100. Also, the side sealing member 25 may cover a first chamfer 100c which is formed (or disposed) at a corner portion between the first surface 100a and the outer surface OS of the first substrate 100 through a chamber process. For example, each of the outermost outer surface of the first substrate 100, an outer surface of the side sealing member 25, and an outer surface of the functional film 23 may be disposed (or aligned) at the same vertical line VL.

Referring to FIGS. 10 and 15, the second substrate 200 according to an embodiment may include a metal pattern layer coupled to the routing portion 400, and an insulation layer which insulates the metal pattern layer.

The metal pattern layer (or a conductive pattern layer) may include a plurality of metal layers. The metal pattern layer according to an embodiment may include a first metal layer 201, a second metal layer 203, and a third metal layer 205. The insulation layer may include a plurality of insulation layers. For example, the insulation layer may include a first insulation layer 202, a second insulation layer 204, and a third insulation layer 206. The insulation layer may be referred to as a rear insulation layer or a pattern insulation layer.

The first metal layer 201, the second metal layer 203, and the third metal layer 205 may be used as pads of the second pad portion 210, pads of the third pad portion 230, and link lines of the link line portion 250, which are disposed at the rear surface 200b of the second substrate 200. For example, the first metal layer 201 may be used as some link lines of the plurality of link lines, and the third metal layer 205 may be used as pads and the other link lines of the plurality of link lines. The second metal layer 203 may be used as a jumping line (or a bridge line) for electrically connecting link lines disposed on different layers.

The first insulation layer 202 may be implemented over the rear surface 200b of the second substrate 200 to cover the first metal layer 201. The second insulation layer 204 may be implemented over the first insulation layer 202 to cover the second metal layer 203. The third insulation layer 206 may be implemented over the second insulation layer 204 200 to cover the third metal layer 205.

The coupling member 300 may be disposed between the first substrate 100 and the second substrate 200. Therefore, the first substrate 100 and the second substrate 200 may be opposite-bonded to each other by a coupling member 300. The coupling member 300 according to an embodiment may be a transparent adhesive member or a double-sided tape including an OCA (an optically clear adhesive) or an OCR (an optically clear resin). According to another embodiment, the coupling member 300 may include a glass fiber.

The coupling member 300 according to an embodiment may be disposed in a whole space between the first substrate 100 and the second substrate 200. For example, all of the second surface 100b of the first substrate 100 may be coupled to all of one surface of the coupling member 300, and all of a front surface 200a of the second substrate 200 may be coupled to all the other surface of the coupling member 300.

The coupling member 300 according to another embodiment may be disposed in a pattern structure between the first substrate 100 and the second substrate 200. For example, the coupling member 300 may have a line pattern structure or a mesh pattern structure. The mesh pattern structure may further include a bent portion which discharges an air bubble, occurring between the first substrate 100 and the second substrate 200 in a process of bonding the first substrate 100 to the second substrate 200, to the outside.

Figure 17:
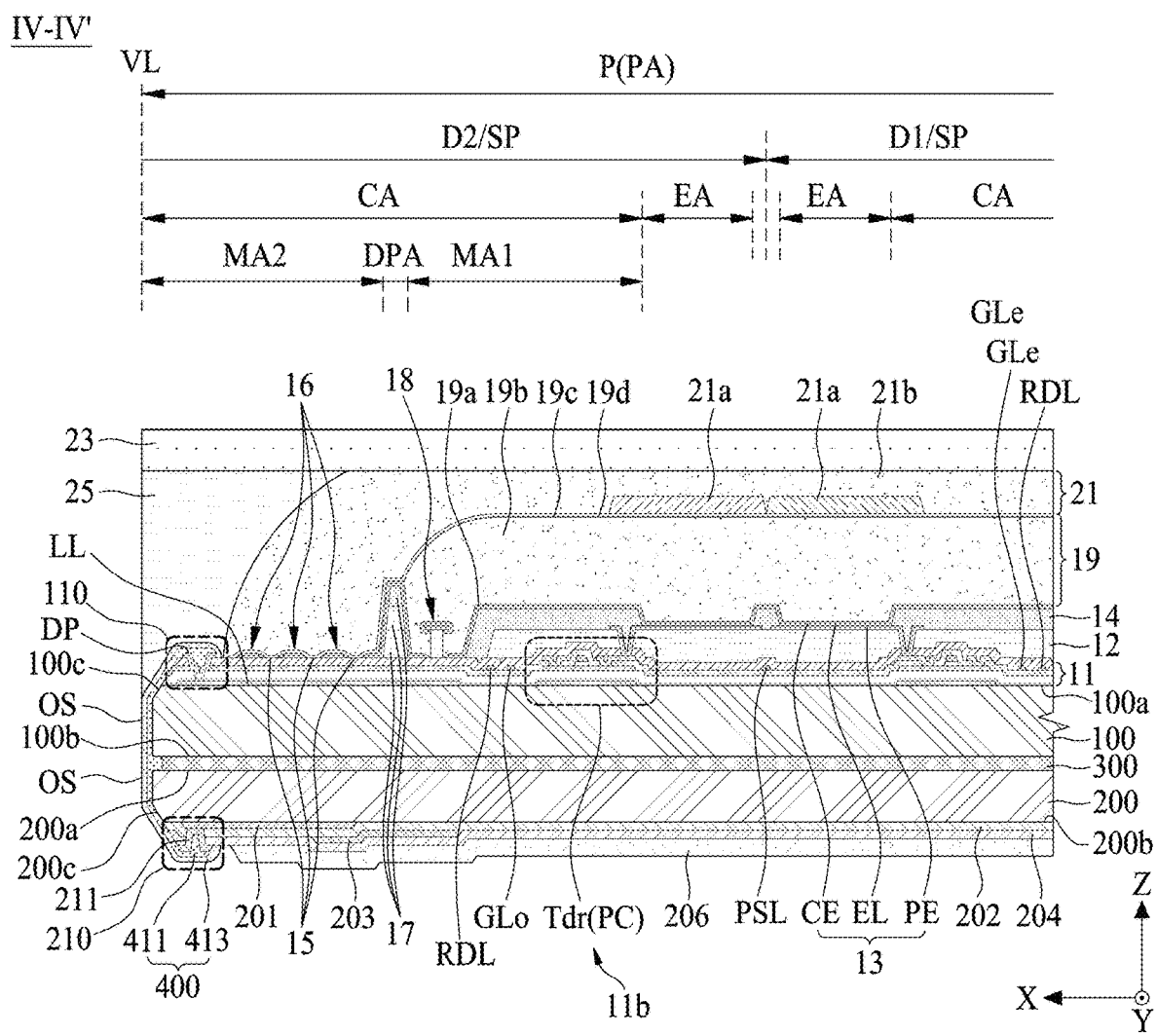
FIG. 17 is a cross-sectional view taken along line IV-IV' illustrated in FIG. 9.

FIG. 17 is a cross-sectional view taken along line IV-IV' illustrated in FIG. 9 and is a diagram for describing a cross-sectional structure of a first pad portion, a second pad portion, and a routing portion of a light emitting display apparatus according to another embodiment of the present disclosure. In describing FIG. 17, elements which are the same or correspond to the elements of FIG. 9 are referred to by like reference numerals, and their repetitive descriptions are omitted or will be briefly described below.

Referring to FIGS. 9, 10, 15, and 17, in a light emitting display apparatus according to another embodiment of the present disclosure, a first pad portion 110 may include a plurality of pads PVP, DP, RVP, GP, and CVP disposed at a first periphery portion of a first surface 100a of a first substrate 100. For example, each of the pads PVP, DP, RVP, GP, and CVP of the first pad portion 110 may be electrically coupled to a corresponding line through a pad contact hole. For example, each of a plurality of pixel common voltage pads CVP disposed in the first pad portion 110 may be individually coupled to a corresponding pixel common voltage line CVL of a plurality of pixel common voltage lines CVL through a pad contact hole.

In the light emitting display apparatus according to another embodiment of the present disclosure, a second pad portion 210 may include a plurality of second pads 211 which are disposed at a first periphery portion overlapping the first pad portion 110 of a rear surface 200b of the second substrate 200.

Each of the plurality of second pads 211 may be electrically coupled to a corresponding link line through a pad contact hole disposed in a first insulation layer 202 and/or a second insulation layer 204 disposed at the rear surface 200b of the second substrate 200. Also, the plurality of second pads 211 may be respectively and individually coupled to the pads PVP, DP, RVP, GP, and CVP of the first pad portion 110 through a routing portion 400.

The routing portion 400 may be disposed to surround an outer surface OS of the first substrate 100 and an outer surface OS of the second substrate 200. For example, the routing portion 400 may be disposed at each of a first outer surface (or one surface) OS1a of the outer surface OS of the first substrate 100 and a first outer surface (or one surface) OS1b of the outer surface OS of the second substrate 200.

The routing portion 400 according to an embodiment may include a plurality of routing lines 411 which are disposed at each of the first outer surface (or one surface) OS1a of the outer surface OS of the first substrate 100 and the first outer surface (or one surface) OS1b of the outer surface OS of the second substrate 200.

Each of the plurality of routing lines 411 may be formed to surround each of the first outer surface OS1a of the first substrate 100 and the first outer surface OS1b of the second substrate 200. For example, each of the plurality of routing lines 411 may be formed through a printing process using a conductive paste. For example, the conductive paste may include Ag paste, but embodiments of the present disclosure are not limited thereto.

In each of the plurality of routing lines 411, one end portion thereof may surround a first chamfer 100c and each of the pads PVP, DP, RVP, GP, and CVP of the first pad portion 110 disposed at a first periphery portion of the first substrate 100, the other end portion thereof may surround a second chamfer 200c and the second pad 211 of the second pad portion 210 disposed at a first periphery portion of the second substrate 200, and a center portion thereof between the one end portion and the other end portion may surround each of the first outer surface OS1a of the first substrate 100 and the first outer surface OS1b of the second substrate 200.

The routing portion 400 according to an embodiment of the present disclosure may further include an edge coating layer 413.

The edge coating layer 413 may be implemented to cover the plurality of routing lines 411. The edge coating layer 413 according to an embodiment may be implemented to cover all of the first periphery portion and the first outer surface OS1a of the first substrate 100 and the first periphery portion and the first outer surface OS1b of the second substrate 200, in addition to the plurality of routing lines 411. The edge coating layer 413 may prevent the corrosion of each of the plurality of routing lines 411 including a metal material or electrical short circuit between the plurality of routing lines 411. Also, the edge coating layer 413 may prevent or minimize the reflection of external light caused by the plurality of routing lines 411 and the pads of the first pad portion 110. The edge coating layer 413 according to an embodiment may include a light blocking material including black ink.

A top surface of the edge coating layer 413 covering the first chamfer 100c of the first substrate 100 may be covered by the side sealing member 25.

An outer surface of the edge coating layer 413 may be an outermost outer surface of the first substrate 100. Thus, each of the outermost outer surface of the first substrate 100, an outer surface of the side sealing member 25, and an outer surface of the functional film 23 may be disposed at the same vertical line VL.

As described above, like the light emitting display apparatus illustrated in FIGS. 1 to 8G, the light emitting display apparatus according to another embodiment of the present disclosure may prevent or minimize a reduction in reliability of the light emitting layer caused by the side transmission of water or moisture, whereby the non-emission pattern portion 15 and the isolation portion 16 may be disposed in the inner region of the outermost pixel Po due to the decrease of the first margin area MA1 and the second margin area MA2 according to the increase in reliability of the light emitting layer, and thus, the light emitting display apparatus may have an air-bezel structure or a non-bezel structure where the display portion AA is surrounded by air instead of an opaque non-display portion.

Figure 18:
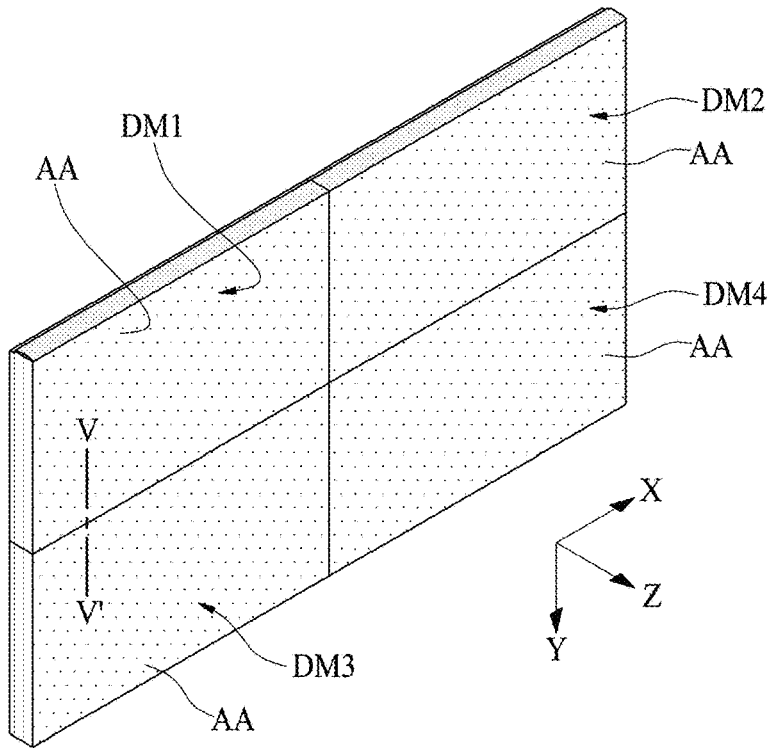
FIG. 18 is a diagram illustrating a multi-screen display apparatus according to an embodiment of the present disclosure.
Figure 19:
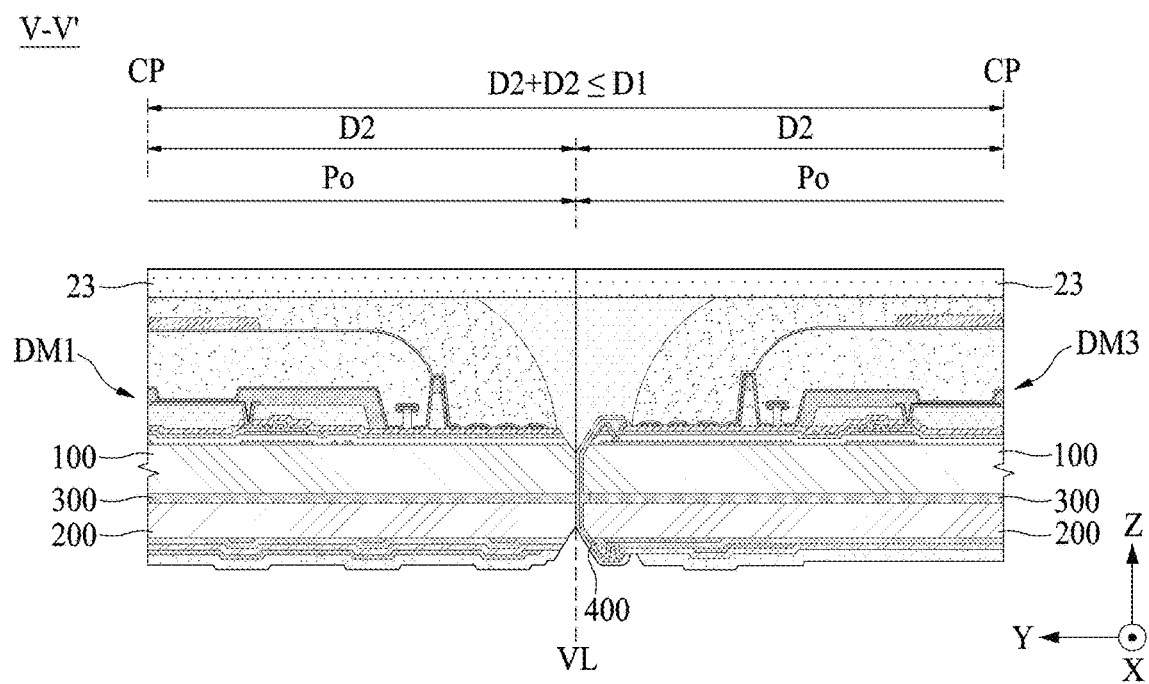
FIG. 19 is a cross-sectional view taken along line V-V' illustrated in FIG. 18.

FIG. 18 is a diagram illustrating a multi-screen display apparatus according to an embodiment of the present disclosure, and FIG. 19 is a cross-sectional view taken along line V-V' illustrated in FIG. 18. FIGS. 18 and 19 illustrate a multi-screen display apparatus implemented by tiling the display apparatus according to another embodiment of the present disclosure illustrated in FIGS. 9 to 17.

Referring to FIGS. 18 and 19, the multi-screen display apparatus (or a tiling display apparatus) according to an embodiment of the present disclosure may include a plurality of display devices DM1 to DM4.

The plurality of display devices DM1 to DM4 may each display an individual image or may divisionally display one image. Each of the plurality of display devices DM1 to DM4 may include the light emitting display apparatus according to an embodiment of the present disclosure illustrated in FIGS. 9 to 17, and thus, their repetitive descriptions are omitted or will be briefly given.

The plurality of display devices DM1 to DM4 may be tiled on a separate tiling frame to contact each other at a lateral surface thereof. For example, the plurality of display devices DM1 to DM4 may be tiled to have an N×M form, thereby implementing a multi-screen display apparatus having a large screen. For example, N is a positive integer of 1 or more and M is a positive integer of 2 or more, but embodiments of the present disclosure are not limited thereto, for example, N is a positive integer of 2 or more and M is a positive integer of 1 or more.

Each of the plurality of display devices DM1 to DM4 may not include a bezel area (or a non-display portion) surrounding all of a display portion AA where an image is displayed, and may have an air-bezel structure where the display portion AA is surrounded by air. For example, in each of the plurality of display devices DM1 to DM4, all of a first surface of a first substrate 100 may be implemented as the display portion AA.

According to the present embodiment, in each of the plurality of display devices DM1 to DM4, a second interval D2 between a center portion CP of an outermost pixel Po and an outermost outer surface VL of the first substrate 100 may be implemented to be half or less of a first interval D1 (or a pixel pitch) between adjacent pixels. Accordingly, in two adjacent display devices DM1 to DM4 coupled to (or contacting) each other at lateral surfaces thereof along the first direction X and the second direction Y based on a lateral coupling manner, an interval "D2+D2" between adjacent outermost pixel areas PAo may be equal to or less than the first interval D1 between two adjacent pixels. Referring to FIG. 19, in first and third display devices DM1 and DM3 coupled to (or contacting) each other at lateral surfaces thereof along the second direction Y, the interval "D2+D2" between a center portion CP of an outermost pixel Po of the first display device DM1 and a center portion CP of an outermost pixel Po of the third display device DM3 may be equal to or less than the first interval D1 (or a pixel pitch) between two adjacent pixels disposed in each of the first and third display devices DM1 and DM3.

Therefore, the interval "D2+D2" between center portions CP of outermost pixels Po of two adjacent display devices DM1 to DM4 coupled to (or contacting) each other at lateral surfaces thereof along the first direction X and the second direction Y may be equal to or less than the first interval D1 between two adjacent pixels disposed in each of the display devices DM1 to DM4, and thus, there may be no seam or boundary portion between two adjacent display devices DM1 to DM4, whereby there may be no dark area caused by a boundary portion provided between the display devices DM1 to DM4. As a result, the image displayed on the multi-screen display device in which each of the plurality of display devices DM1, DM2, DM3, and DM4 is tiled in an N×M form may be displayed continuously without a sense of disconnection (or discontinuity) at boundary portion between the plurality of display devices DM1, DM2, DM3, and DM4.

In FIGS. 18 and 19, it is illustrated that the plurality of display devices DM1 to DM4 are tiled in a 2×2 form, but embodiments of the present disclosure are not limited thereto, and the plurality of display devices DM1 to DM4 may be tiled in an x×1 form, a 1×y form, or an x×y form. For example, x and y may be two or more natural numbers equal to or different from each other. For example, x may be two or more natural numbers or equal to y. y may be two or more natural number greater or less than x.

As described above, when display portion AA of each of the plurality of display devices DM1 to DM4 is one screen and displays one image, a multi-screen display apparatus according to the present disclosure may display an image which is not disconnected and is continuous at a boundary portion between the plurality of display devices DM1 to DM4, and thus, the immersion of a viewer watching an image displayed by the multi-screen display apparatus may be enhanced.

The light emitting display apparatus according to the present disclosure may be applied to all electronic devices including a light emitting display panel. For example, the light emitting display apparatus according to the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic books, portable multimedia players (PMPs), personal digital assistants (PDAs), MP3 players, mobile medical apparatuses, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, etc.

According to some embodiments of the present disclosure, a light emitting display apparatus, which has a thin bezel width and prevents the reliability of a light emitting device from being reduced by penetration of water, and a multi-screen display apparatus including the light emitting display apparatus may be provided.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the light emitting display apparatus and the multi-screen display apparatus including the same of the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display apparatus comprising:
   a substrate;
   a passivation layer disposed over the substrate;
   a light emitting device layer including a light emitting layer disposed over the passivation layer;
   a non-emission pattern portion including a light emitting material pattern disposed over the passivation layer at a periphery portion of the substrate and electrically isolated from the light emitting layer; and
   an encapsulation layer disposed over the light emitting device layer and the non-emission pattern portion,
   wherein the encapsulation layer wholly surrounds the non-emission pattern portion and seals an interface between the non-emission pattern portion and the passivation layer.

2. The light emitting display apparatus of claim 1, wherein the encapsulation layer comprises:
   a first inorganic encapsulation layer wholly surrounding the non-emission pattern portion and sealing an interface between the non-emission pattern portion and the passivation layer; and
   a second inorganic encapsulation layer disposed over the first inorganic encapsulation layer to seal an interface between the first inorganic encapsulation layer and the passivation layer.

3. The light emitting display apparatus of claim 2,
   wherein the first inorganic encapsulation layer directly contacts a surface of the passivation layer disposed near the non-emission pattern portion, and
   wherein the second inorganic encapsulation layer directly contacts a surface of the passivation layer disposed near the first inorganic encapsulation layer.

4. The light emitting display apparatus of claim 1, wherein the encapsulation layer comprises:
   a first inorganic encapsulation layer disposed over the light emitting layer and the non-emission pattern portion; and
   a second inorganic encapsulation layer disposed over the first inorganic encapsulation layer, and
   the non-emission pattern portion is doubly sealed by the first inorganic encapsulation layer and the second inorganic encapsulation layer, over the passivation layer.

5. The light emitting display apparatus of claim 1, further comprising a planarization layer disposed between the passivation layer and the light emitting device layer,
   wherein the light emitting device layer comprises:
   a pixel electrode disposed between the planarization layer and the light emitting layer; and
   a common electrode disposed over the light emitting layer, and
   wherein the non-emission pattern portion further comprises a common electrode pattern electrically isolated from the common electrode to wholly surround the light emitting material pattern.

6. The light emitting display apparatus of claim 5,
   wherein the common electrode pattern directly contacts a surface of the passivation layer disposed near the light emitting material pattern, and
   wherein the light emitting material pattern is at least doubly sealed by the common electrode pattern and the encapsulation layer, over the passivation layer.

7. The light emitting display apparatus of claim 5, wherein the encapsulation layer comprises:
   a first inorganic encapsulation layer wholly surrounding the non-emission pattern portion and sealing an interface between the common electrode pattern and the passivation layer; and
   a second inorganic encapsulation layer disposed over the first inorganic encapsulation layer to seal an interface between the first inorganic encapsulation layer and the passivation layer.

8. The light emitting display apparatus of claim 1,
   wherein the non-emission pattern portion comprises at least two non-emission patterns including the light emitting material pattern, and
   wherein the encapsulation layer wholly surrounds each of the at least two non-emission patterns and directly contacts a surface of the passivation layer between the at least two non-emission patterns.

9. The light emitting display apparatus of claim 8, wherein the encapsulation layer has a first thickness over each of the at least two non-emission patterns, and has a second thickness which is thinner than the first thickness, between the at least two non-emission patterns.

10. The light emitting display apparatus of claim 8, wherein the encapsulation layer further comprises:
    a first inorganic encapsulation layer wholly surrounding each of the at least two non-emission patterns and sealing an interface between each of the at least two non-emission patterns and the passivation layer;
    a second inorganic encapsulation layer disposed over the first inorganic encapsulation layer to seal an interface between the first inorganic encapsulation layer and the passivation layer; and
    a third inorganic encapsulation layer disposed over the second inorganic encapsulation layer and between the at least two non-emission patterns to directly contact a surface of the passivation layer between the at least two non-emission patterns.

11. The light emitting display apparatus of claim 1,
    wherein the light emitting device layer further comprises a common electrode disposed over the light emitting layer,
    wherein the non-emission pattern portion comprises at least two non-emission patterns electrically isolated from the light emitting material pattern and the common electrode to wholly surround the light emitting material pattern, and
    wherein the encapsulation layer further comprises:
    a first inorganic encapsulation layer wholly surrounding each of the at least two non-emission patterns and sealing an interface between each of the at least two non-emission patterns and the passivation layer;

a second inorganic encapsulation layer disposed over the first inorganic encapsulation layer to seal an interface between the first inorganic encapsulation layer and the passivation layer; and a third inorganic encapsulation layer disposed over the second inorganic encapsulation layer and between the at least two non-emission patterns to directly contact a surface of the passivation layer between the at least two non-emission patterns.

12. The light emitting display apparatus of claim 1, further comprising a trench pattern portion disposed over the passivation layer between the light emitting layer and the non-emission pattern portion to isolate the light emitting layer, wherein the trench pattern portion comprises a light emitting material pattern electrically isolated from the light emitting layer.

13. The light emitting display apparatus of claim 12, wherein the trench pattern portion comprises a protrusion tip of a metal material for isolating the light emitting layer.

14. The light emitting display apparatus of claim 12, wherein the trench pattern portion comprises:

a first trench structure disposed over the passivation layer; and a second trench structure disposed over the first trench structure to have an eaves structure with respect to the first trench structure.

15. The light emitting display apparatus of claim 12, further comprising a dam pattern portion disposed over the passivation layer between the non-emission pattern portion and the trench pattern portion, wherein the dam pattern portion comprises a light emitting material pattern electrically isolated from the light emitting layer, and wherein the encapsulation layer comprises an organic encapsulation layer disposed over the light emitting layer and the trench pattern portion and surrounded by the dam pattern portion.

16. The light emitting display apparatus of claim 1, further comprising a dam pattern portion disposed over the passivation layer between the light emitting layer and the non-emission pattern portion, wherein the dam pattern portion comprises a light emitting material pattern electrically isolated from the light emitting layer.

17. The light emitting display apparatus of claim 16, wherein the encapsulation layer comprises:

a first inorganic encapsulation layer disposed over the light emitting device layer, the non-emission pattern portion, and the dam pattern portion to seal an interface between the non-emission pattern portion and the passivation layer;

an organic encapsulation layer disposed over the first inorganic encapsulation layer and surrounded by the dam pattern portion;

a second inorganic encapsulation layer disposed over the organic encapsulation layer, the dam pattern portion, and the non-emission pattern portion to seal an interface between the first inorganic encapsulation layer and the passivation layer; and a third inorganic encapsulation layer disposed over the second inorganic encapsulation layer, wherein the third inorganic encapsulation layer wholly surrounds the non-emission pattern portion and directly contacts a surface of the passivation layer between the non-emission pattern portion and the dam pattern portion.

18. The light emitting display apparatus of claim 1, wherein the substrate comprises a display portion having a plurality of pixels, wherein each of the plurality of pixels comprises the light emitting layer, and wherein a size of the display portion is the same as a size of the substrate.

19. A multi-screen display apparatus comprising:

a plurality of display devices disposed in at least one direction of a first direction and a second direction crossing the first direction, wherein each of the plurality of display devices comprises the light emitting display apparatus of claim 1.

20. The multi-screen display apparatus of claim 19, wherein, in each of the plurality of display devices, the substrate comprises a plurality of pixels disposed to have a pixel pitch in the first direction and the second direction, the pixel pitch is a distance between center portions of pixels adjacent to each other in the first direction and the second direction, and in a first display device and a second display device adjacent to each other in the first direction and the second direction, a distance between a center portion of an outermost pixel of the first display device and a center portion of an outermost pixel of the second display device is less than or equal to the pixel pitch.

* * * * *